US010202710B2

United States Patent
Mori et al.

(10) Patent No.: US 10,202,710 B2
(45) Date of Patent: Feb. 12, 2019

(54) PROCESS FOR PRODUCING GROUP III NITRIDE CRYSTAL AND APPARATUS FOR PRODUCING GROUP III NITRIDE CRYSTAL

(71) Applicants: OSAKA UNIVERSITY, Suita-shi, Osaka (JP); ITOCHU PLASTICS INC., Tokyo (JP); PANASONIC CORPORATION, Kadoma-shi, Osaka (JP)

(72) Inventors: Yusuke Mori, Osaka (JP); Masashi Yoshimura, Osaka (JP); Mamoru Imade, Osaka (JP); Masashi Isemura, Tokyo (JP); Yoshio Okayama, Osaka (JP)

(73) Assignees: Osaka University, Osaka (JP); Itochu Plastics Inc., Tokyo (JP); Panasonic Corporation, Osaka (JP)

( * ) Notice: Subject to any disclaimer, the term of this patent is extended or adjusted under 35 U.S.C. 154(b) by 0 days.

(21) Appl. No.: 15/123,565

(22) PCT Filed: Mar. 3, 2015

(86) PCT No.: PCT/JP2015/056130
§ 371 (c)(1),
(2) Date: Sep. 2, 2016

(87) PCT Pub. No.: WO2015/133443
PCT Pub. Date: Sep. 11, 2015

(65) Prior Publication Data
US 2017/0073840 A1    Mar. 16, 2017

(30) Foreign Application Priority Data

Mar. 3, 2014  (JP) ................................ 2014-041078

(51) Int. Cl.
*C30B 29/40* (2006.01)
*C30B 19/02* (2006.01)
(Continued)

(52) U.S. Cl.
CPC .............. *C30B 29/406* (2013.01); *B28D 5/00* (2013.01); *C30B 19/02* (2013.01); *C30B 19/12* (2013.01);
(Continued)

(58) Field of Classification Search
CPC combination set(s) only.
See application file for complete search history.

(56) References Cited

U.S. PATENT DOCUMENTS

2002/0189532 A1   12/2002   Motoki et al.
2002/0190259 A1*  12/2002   Goetz ..................... C30B 25/02
                                                    257/79

(Continued)

FOREIGN PATENT DOCUMENTS

CN    1380449    11/2002
CN    1480569     3/2004
(Continued)

OTHER PUBLICATIONS

Office Action for the corresponding Japanese Patent Application No. 2015-556313 dated May 20, 2016, 6 pages with a partial English translation.
(Continued)

*Primary Examiner* — Duy Vu N Deo
*Assistant Examiner* — Erin F Bergner
(74) *Attorney, Agent, or Firm* — Hamre, Schumann, Mueller & Larson, P.C.

(57) ABSTRACT

A large Group III nitride crystal of high quality with few defects such as a distortion, a dislocation, and warping is produced by vapor phase epitaxy. A method for producing a
(Continued)

Group III nitride crystal includes: a first Group III nitride crystal production process of producing a first Group III nitride crystal 1003 by liquid phase epitaxy; and a second Group III nitride crystal production process of producing a second Group III nitride crystal 1004 on the first crystal 1003 by vapor phase epitaxy by causing a Group III element metal to react with an oxidizing agent and nitrogen-containing gas. In the first Group III nitride crystal production process, the surfaces of seed crystals 1003*a* (preliminarily provided Group III nitride) are brought into contact with an alkali metal melt, a Group III element and nitrogen are cause to react with each other in a nitrogen-containing atmosphere in the alkali metal melt, and the Group III nitride crystals are bound together by growth of the Group III nitride crystals grown from the seed crystals 1003*a* to produce a first crystal 1003.

12 Claims, 28 Drawing Sheets

(51) Int. Cl.
*C30B 25/20* (2006.01)
*C30B 29/38* (2006.01)
*C30B 33/00* (2006.01)
*H01L 21/02* (2006.01)
*B28D 5/00* (2006.01)
*C30B 19/12* (2006.01)
*C30B 25/18* (2006.01)
*C30B 29/20* (2006.01)
*H01L 21/78* (2006.01)
*H01L 29/20* (2006.01)
*H01L 33/00* (2010.01)
*H01L 33/12* (2010.01)
*H01L 33/32* (2010.01)
*H01S 5/30* (2006.01)

(52) U.S. Cl.
CPC .......... *C30B 25/186* (2013.01); *C30B 25/20* (2013.01); *C30B 29/20* (2013.01); *C30B 29/38* (2013.01); *C30B 33/00* (2013.01); *H01L 21/0242* (2013.01); *H01L 21/0243* (2013.01); *H01L 21/0254* (2013.01); *H01L 21/0262* (2013.01); *H01L 21/02458* (2013.01); *H01L 21/02516* (2013.01); *H01L 21/02576* (2013.01); *H01L 21/02579* (2013.01); *H01L 21/02581* (2013.01); *H01L 21/02625* (2013.01); *H01L 21/02639* (2013.01); *H01L 21/02647* (2013.01); *H01L 21/7813* (2013.01); *H01L 29/2003* (2013.01); *H01L 33/007* (2013.01); *H01L 33/0079* (2013.01); *H01L 33/12* (2013.01); *H01L 33/32* (2013.01); *H01S 5/3013* (2013.01); *H01S 2304/06* (2013.01)

(56) References Cited

U.S. PATENT DOCUMENTS

| | | | |
|---|---|---|---|
| 2004/0000266 A1* | 1/2004 | D'Evelyn | B01J 3/062 117/2 |
| 2004/0183090 A1 | 9/2004 | Kitaoka et al. | |
| 2005/0082564 A1 | 4/2005 | Kitaoka et al. | |
| 2005/0098090 A1 | 5/2005 | Hirota et al. | |
| 2005/0263065 A1* | 12/2005 | Negley | C30B 23/02 117/99 |
| 2007/0196942 A1* | 8/2007 | Kitaoka | C30B 9/00 438/46 |
| 2009/0315150 A1 | 12/2009 | Hirota et al. | |
| 2011/0260295 A1* | 10/2011 | Hirota | C30B 19/00 257/615 |
| 2012/0256297 A1 | 10/2012 | Morioka et al. | |
| 2014/0328742 A1 | 11/2014 | Mori et al. | |

FOREIGN PATENT DOCUMENTS

| | | |
|---|---|---|
| CN | 1612295 | 5/2005 |
| CN | 1898778 | 1/2007 |
| CN | 101421443 | 4/2009 |
| CN | 102245814 | 11/2011 |
| JP | 52-23600 | 2/1977 |
| JP | 2002-293696 | 10/2002 |
| JP | 2005-154254 | 6/2005 |
| JP | 2006-036622 | 2/2006 |
| JP | 2009-234800 | 10/2009 |
| JP | 4588340 B | 12/2010 |
| JP | 2012-006772 | 1/2012 |
| WO | 2011/093481 | 8/2011 |
| WO | 2013/105618 | 7/2013 |

OTHER PUBLICATIONS

Takino et al., "Growth of a low dislocation GaN layer on a Na-flux-GaN substrate using Ga2O as a Ga source", Extended Abstracts of the 73rd Autumn Meeting, 2012; The Japan Society of Applied Physics, 13p-H9-4, I5-182; English translation provided, 5 pages.

Office Action issued in corresponding Chinese Patent Application No. 201580021973.6, dated Jun. 22, 2018, 23 pages with an English translation.

* cited by examiner (a)

(b)

(c)

PROCESS FOR PRODUCING GROUP III NITRIDE CRYSTAL AND APPARATUS FOR PRODUCING GROUP III NITRIDE CRYSTAL

TECHNICAL FIELD

The present invention relates to a method for producing a Group III nitride crystal and an apparatus for producing a Group III nitride crystal.

BACKGROUND ART

A Group III nitride semiconductor (also called a Group III nitride compound semiconductor or a GaN semiconductor) such as gallium nitride (GaN) has been used widely as a material for various semiconductor devices such as a laser diode (LD) and a light-emitting diode (LED). For example, the laser diode (LD) that emits blue light is applied to a high-density optical disc or a display, and a light-emitting diode (LED) that emits blue light is applied to a display or illumination. Moreover, an ultraviolet LD is expected to be applied to biotechnology and the like, and an ultraviolet LED is expected as an ultraviolet source of a fluorescent lamp.

As a common method for producing a Group III nitride (e.g., GaN) crystal substrate, there is vapor phase epitaxy (hydride vapor phase epitaxy (HVPE)) such as halide vapor phase epitaxy (Patent Document 1) and metalorganic chemical vapor deposition (MOCVD), for example. On the other hand, as a method that can produce a Group III nitride single crystal of higher quality, a crystal growth method in a liquid phase is performed. This liquid phase epitaxy has had a problem in that the method was required to be performed under high temperature and high pressure. However, with recent improvements, the method can be performed under relatively low temperature and relatively low pressure and become a method suitable for mass production (e.g. Patent Documents 2 and 3). Furthermore, there is a method that uses liquid phase epitaxy and vapor phase epitaxy in combination (Patent Document 4).

CITATION LIST

Patent Document(s)

Patent Document 1: S52(1977)-023600 A
Patent Document 2: JP 2002-293696 A
Patent Document 3: Japanese Patent No. 4588340
Patent Document 4: JP 2012-006772 A

BRIEF SUMMARY OF THE INVENTION

Problem to be Solved by the Invention

With the recent increase in size of semiconductor apparatuses, there is a demand for producing a large Group III nitride crystal of high quality with few defects such as a distortion, a dislocation, and warping.

As a method for producing a large Group III nitride crystal with few defects, a method in which a fine seed crystal is grown in a liquid phase, or the like is considered. However, such a way of obtaining a large crystal requires a long period of time for crystal growth. Also, there is a possibility that a crystal grown by liquid phase epitaxy has inclusions (liquid or small miscellaneous crystals, and the like). The inclusion may cause crystal defects.

When a Group III nitride crystal is produced by vapor phase epitaxy, a substrate for epitaxial growth is required. As this substrate, a low-cost sapphire substrate commonly is used. However, there is a large difference in lattice constant, thermal expansion coefficient, and the like between the sapphire substrate and the Group III nitride crystal. Therefore, there is a possibility that defects such as a distortion, a dislocation, and warping are caused in the Group III nitride crystal. The problems of the defects become significant as the size of the crystal increases. In the present invention, "sapphire" denotes a crystal containing an aluminum oxide crystal or an aluminum oxide as a main component, unless otherwise mentioned.

Furthermore, in order to solve the problem of the difference in lattice constant, it is considered to grow the Group III nitride crystal from a large Group III nitride seed crystal with few defects, as a substitute for the sapphire substrate. More specifically, for example, it is considered that a Group III nitride substrate is used as a seed crystal as a substitute for the sapphire substrate. However, the large Group III nitride seed crystal such as a Group III nitride substrate is quite expensive, so that the costs are increased. It is very difficult to obtain a large Group III nitride seed crystal of high quality with few defects such as a distortion, a dislocation, and warping. When a Group III nitride crystal is grown from a large Group III nitride seed crystal, the Group III nitride crystal grown inherits the crystal defects of the seed crystal. In Patent Document 4, plural Group III nitride (e.g, GaN) seed crystal substrates arranged are used as a large Group III nitride seed crystal. However, this method cannot fundamentally solve the problem that the Group III nitride crystal grown inherits crystal defects of the seed crystal.

Hence, the present invention is intended to provide a method for producing a Group III nitride crystal that produces a large Group III nitride crystal of high quality with few defects such as a distortion, a dislocation, and warping by vapor phase epitaxy. Furthermore, the present invention provides a Group III nitride crystal produced by the method for producing a Group III nitride crystal, a semiconductor apparatus that uses the Group III nitride crystal, and a Group III nitride crystal production apparatus for use in the method for producing a Group III nitride crystal.

Means for Solving Problem

In order to achieve the above object, the present invention provides a method for producing a Group III nitride crystal (hereinafter, it may be simply referred to as the "production method according to the present invention"), including; a first Group III nitride crystal production process of producing a first Group III nitride crystal by liquid phase epitaxy; and a second Group III nitride crystal production process of producing a second Group III nitride crystal on the first Group III nitride crystal by vapor phase epitaxy. The first Group III nitride crystal production process includes: a seed crystal selection step of selecting a plurality of parts of a preliminarily provided Group III nitride as seed crystals for generation and growth of Group III nitride crystals; a contact step of bringing the surfaces of the seed crystals into contact with an alkali metal melt; and a Group III nitride crystal liquid phase growth step of causing a Group III element and nitrogen to react with each other in a nitrogen-containing atmosphere in the alkali metal melt to generate and grow Group III nitride crystals. In the Group III nitride crystal liquid phase growth step, the Group III nitride crystals are bound together by growth of the Group III nitride crystals grown from the seed crystals to produce the first Group III nitride crystal. In the second Group III nitride crystal production process, a Group III element metal or a Group III element compound is caused to react with nitrogen-containing gas to produce the second Group III nitride crystal.

The present invention also provides a Group III nitride crystal produced by the production method according to the present invention or a Group III nitride crystal produced by further growing the Group III nitride crystal.

The present invention also provides a semiconductor apparatus including the Group III nitride crystal of the present invention. The Group III nitride crystal is a semiconductor.

The present invention also provides an apparatus for producing a Group III nitride crystal for use in the production method according to the present invention. The apparatus includes: a first Group III nitride crystal production unit that produces the first Group III nitride crystal by liquid phase epitaxy; and a second Group III nitride crystal production unit that produces the second Group III nitride crystal on the first Group III nitride crystal by vapor phase epitaxy.

Effects of the Invention

According to the production method according to the present invention, a large Group III nitride crystal of high quality with few defects such as a distortion, a dislocation, warping, and the like can be produced by vapor phase epitaxy. The Group III nitride crystal of the present invention that can be produced by the production method according to the present invention is large in size, has few defects (e.g., a distortion, a dislocation, warping, and the like), and achieves high quality. Furthermore, the present invention provides a semiconductor apparatus that uses the Group III nitride crystal of the present invention, which is large in size, has few defects (e.g., a distortion, a dislocation, warping, and the like), and achieves high quality. The present invention also provides a Group III nitride crystal production apparatus that can be used in the production method according to the present invention.

MODE FOR CARRYING OUT THE INVENTION

The present invention is described below with reference to illustrative examples. It is to be noted, however, that the following descriptions do not limit the present invention by any means.

Figure 32:
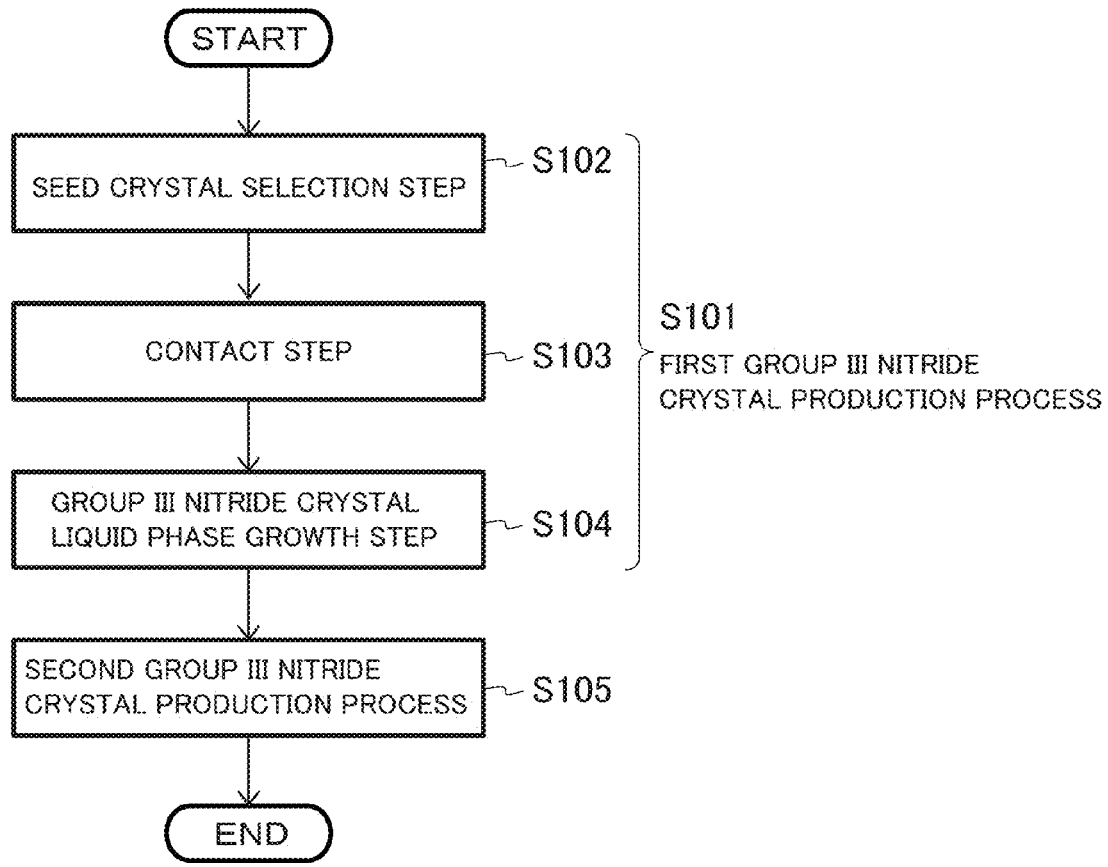
FIG. 32 is a flowchart showing an outline of the production method of the present invention by way of example.

FIG. 32 is a flowchart showing an outline of the production method of the present invention by way of example. As shown in FIG. 32, in the production method of the present invention, a first Group III nitride crystal production process (S101) is performed, and thereafter, a second Group III nitride crystal production process (S105) is performed. In the first Group III nitride crystal production process (S101), a first Group III nitride crystal is produced by liquid phase epitaxy, as described above. In the second Group III nitride crystal production process (S105), a second Group III nitride crystal is produced on the first Group III nitride crystal by vapor phase epitaxy, as described above. The first Group III nitride crystal production process (S101) includes, as described above, the following three steps: a seed crystal selection step, a contact step, and a Group III nitride crystal liquid phase growth step. Specifically, as shown in FIG. 32, first, in the seed crystal selection step, a plurality of parts of a Group III nitride are selected as seed crystals (S102). Next, in the contact step, the surfaces of the seed crystals are brought into contact with an alkali metal melt (S103). Further, in the Group III nitride crystal liquid phase growth step, the plurality of Group III nitride crystals grown from the plurality of seed crystals are bound together to produce a first Group III nitride crystal (S104). Thereafter, in the second Group III nitride crystal production process, a second Group III nitride crystal is produced on the first Group III nitride crystal by causing a Group III element or a compound containing a Group III element to react with nitrogen-containing gas (S105). The production method of the present invention can be carried out in the above-described manner.

Figure 33:
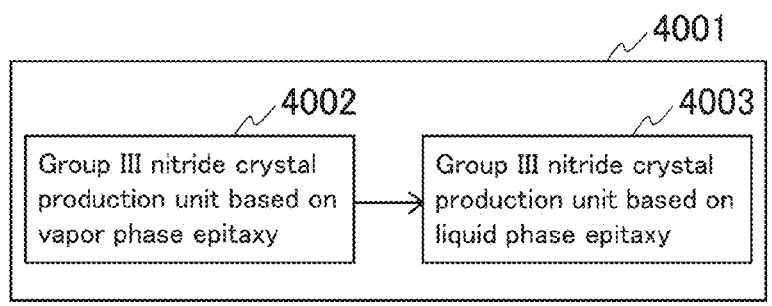
FIG. 33 is a block diagram showing main features of an apparatus for use in the production method of the present invention.

FIG. 33 is a block diagram showing main features of an apparatus for use in the production method of the present invention. As shown in FIG. 33, this apparatus 4001 includes: a Group III nitride crystal production unit 4002 that performs crystal production by liquid phase epitaxy (hereinafter referred to as "Group III nitride crystal production unit 4002 based on liquid phase epitaxy"); and a Group III nitride crystal production unit 4003 that performs crystal production by vapor phase epitaxy (hereinafter referred to as "Group III nitride crystal production unit 4003 based on vapor phase epitaxy"). The Group III nitride crystal production unit 4002 based on liquid phase epitaxy can perform the first Group III nitride crystal production process (S101) shown in FIG. 32. Specifically, the Group III nitride crystal production unit 4002 based on liquid phase epitaxy produces a first Group III nitride crystal by binding a plurality of Group III nitride crystals grown from a plurality of seed crystals together. The Group III nitride crystal production unit 4003 based on vapor phase epitaxy can perform the second Group III nitride crystal production process (S105) shown in FIG. 32. Specifically, the Group III nitride crystal production unit 4003 based on vapor phase epitaxy produces a second Group III nitride crystal on the first Group III nitride crystal produced by the Group III nitride crystal production unit 4002 based on liquid phase epitaxy by causing a Group III element or a compound containing a Group III element to react with nitrogen-containing gas. Examples of the Group III nitride crystal production unit 4002 based on liquid phase epitaxy include apparatuses shown in FIGS. 19 to 21 to be described below. Examples of the Group III nitride crystal production unit 4003 based on vapor phase epitaxy include apparatuses shown in FIGS. 23 to 26 to be described below.

Preferably, the production method of the present invention further includes, prior to the second Group III nitride crystal production process, a first Group III nitride crystal heating step of heat-treating the first Group III nitride crystal.

In the first Group III nitride crystal production process, for example, a phenomenon (inclusion) may occur, in which an alkali metal (e.g., Na) in the alkali metal melt is incorporated into binding sites of the Group III nitride crystals and remains in the first Group III nitride crystal. When portions with the remaining alkali metal (inclusion) are heated to a high temperature (e.g., 1200° C. or higher) in the second Group III nitride crystal production process, explosion may occur to perforate the first Group III nitride crystal. The holes thus made may cause crystal defects in the second Group III nitride crystal, which may render the second Group III nitride crystal defective.

The remaining alkali metal (inclusion) occurrence rate can be made very low by, for example, melting the alkali metal sufficiently in the first Group III nitride crystal production process. However, it is difficult to reduce the occurrence rate to zero. Moreover, it is difficult to detect the remaining alkali metal (inclusion) directly in the first Group III nitride crystal. That is to say, the remaining alkali metal (inclusion) can be found only after explosion occurs to cause perforation in the second Group III nitride crystal production process. If this renders the second Group III nitride crystal defective, the cost and time used for the second Group III nitride crystal production process come to naught.

On this account, as described above, it is preferable that the first Group III nitride crystal heating step of heat-treating the first Group III nitride crystal is performed prior to the second Group III nitride crystal production process. By this first Group III nitride crystal heating step, explosion occurs at the portions with the remaining alkali metal (inclusion) to perforate the first Group III nitride crystal, thus allowing the remaining alkali metal (inclusion) to be detected. Then, the first Group III nitride crystal perforated by the explosion may be excluded as a defective product so as not to be used in the second Group III nitride crystal production process. This can prevent the cost and time used for the second Group III nitride crystal production process from coming to naught owing to the defectiveness caused by the remaining alkali metal (inclusion).

Figure 31A:
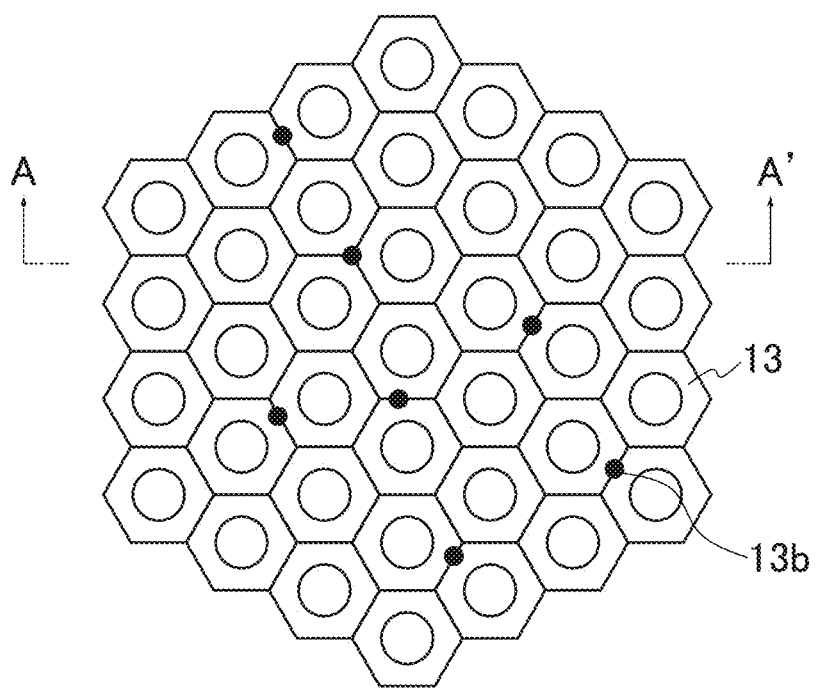
FIGS. 31A and 31B schematically show, by way of example, portions with a remaining alkali metal (inclusion) in a first Group III nitride crystal.
Figure 31B:
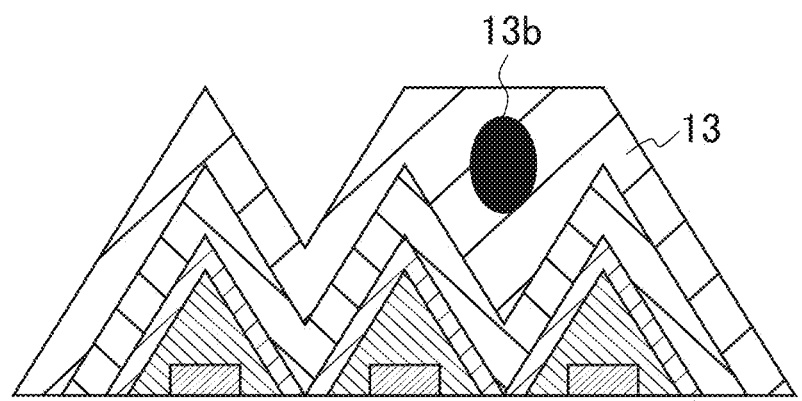

FIGS. 31A and 31B are plan views schematically showing, by way of example, portions with a remaining alkali metal (inclusion) in the first Group III nitride crystal. FIG. 31A is a plan view (top view) schematically showing the same Group III nitride crystal as in FIG. 6C. As shown in FIG. 31A, a Group III nitride crystal layer 13 has binding sites of a plurality of hexagonal crystals (each binding site is a recess and corresponds to a side or an apex of the hexagon). An alkali metal 13b is likely to remain (be included) in these binding sites (recesses). FIG. 31B is a cross sectional view schematically showing a part of the Group III nitride crystal shown in FIG. 31A including a portion with the remaining alkali metal 13b (inclusion). For example, when the Group III nitride crystal layer 13 grows as shown in (d) and (e) of FIG. 6, the Group III nitride crystal layer 13 may include the remaining alkali metal 13b, which, as described above, may explode in the second Group III nitride crystal production process to cause defectiveness of the second Group III nitride crystal. It is to be noted, however, that FIGS. 31A and 31B are schematic views showing an illustrative example, and do not limit the present invention by any means.

It is preferable that the heating temperature in the first Group III nitride crystal heating step is equal to or higher than the crystal growth temperature in the first Group III nitride crystal production process and equal to or lower than the crystal growth temperature in the second Group III nitride crystal production process. When the heating temperature in the first Group III nitride crystal heating step is equal to or higher than the crystal growth temperature in the first Group III nitride crystal production process, the remaining alkali metal (inclusion) can be found easily. Further, when the heating temperature in the first Group III nitride crystal heating step is equal to or lower than the crystal growth temperature in the second Group III nitride crystal production process, it is possible to inhibit the reduction in the yield of the first Group III nitride crystal due to excessive explosion of the remaining alkali metal (inclusion) in the first Group III nitride crystal heating step. Specific numerical values of the crystal growth temperature in the first Group III nitride crystal production process, the heating temperature in the first Group III nitride crystal heating step, and the crystal growth temperature in the second Group III nitride crystal production process are described below.

The first Group III nitride crystal heating step preferably is performed in a nitrogen element-containing gas atmosphere in order to prevent deterioration of nitride crystals. The first Group III nitride crystal heating step is performed preferably in a nitrogen ($N_2$) gas-containing atmosphere, more preferably in an ammonia gas-containing atmosphere. When the first Group III nitride crystal heating step is performed in an ammonia gas-containing atmosphere, it is possible to inhibit or prevent the decomposition of Group III nitride (e.g., GaN) crystals under high temperature conditions of, e.g., 900° C. or higher. In an atmosphere in which the first Group III nitride crystal heating step is performed, the nitrogen ($N_2$) gas content and the ammonia gas content are, for example, 100% and 0%, 10% to 90% and 90% to 10%, or 0% and 100%, respectively, by partial pressures.

Figure 34:
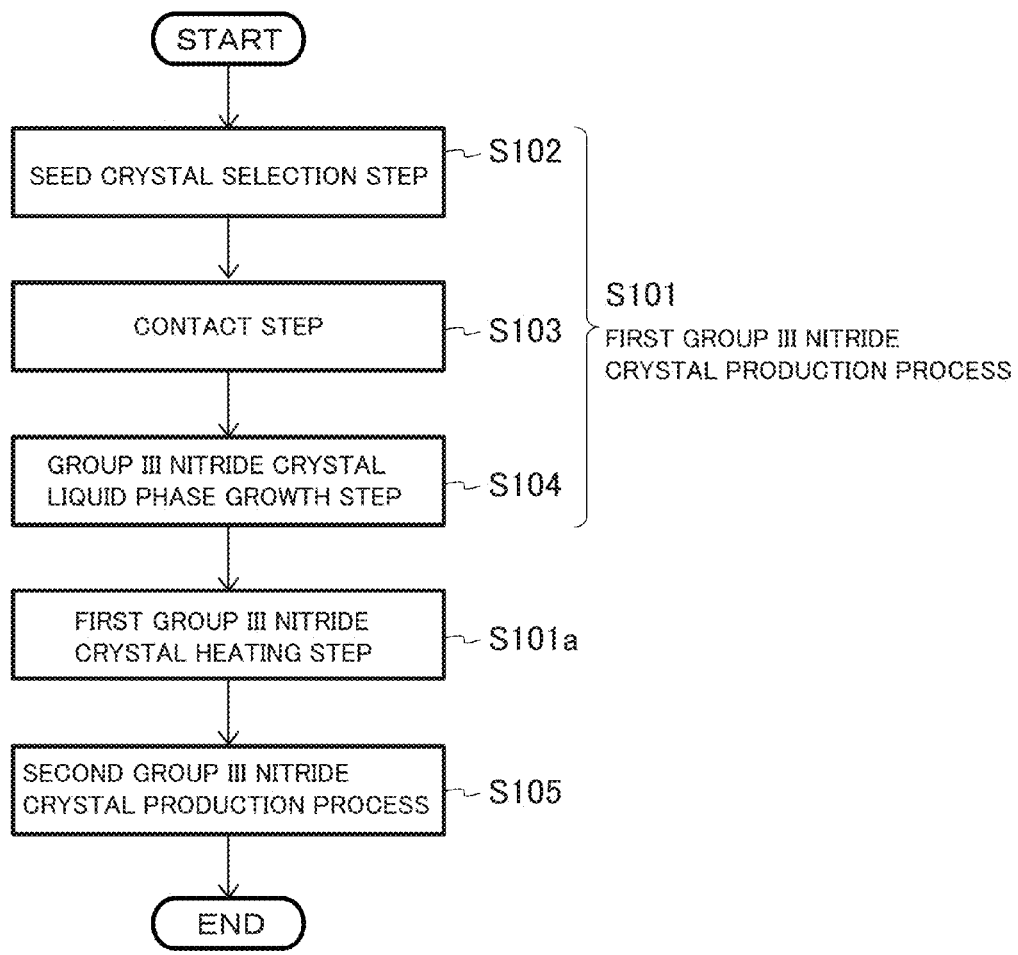
FIG. 34 is a flowchart showing, by way of example, an outline of the production method according to the present invention configured to include a first Group III nitride crystal heating step.
Figure 35:
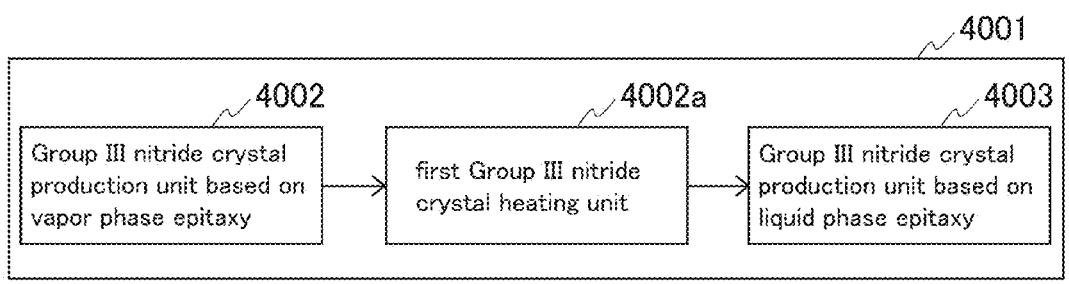
FIG. 35 is a block diagram showing main features of an apparatus for use in the production method according to the present invention, configured to include a first Group III nitride crystal heating unit.

FIG. 34 is a flowchart showing, by way of example, an outline of the production method according to the present invention configured to include a first Group III nitride crystal heating step. As shown in FIG. 34, this flowchart is the same as the flowchart of FIG. 32, except that, after the first Group III nitride crystal production process (S101) has been performed, a first Group III nitride crystal heating step (S101a) is performed prior to the second Group III nitride crystal production process (S105). FIG. 35 is a block diagram showing main features of an apparatus for use in the production method according to the present invention, configured to include a first Group III nitride crystal heating unit. As shown in FIG. 35, this apparatus is the same as the apparatus shown in FIG. 33, except that the apparatus further includes a first Group III nitride crystal heating unit 4002a and that the first Group III nitride crystal heating step (S101a) is performed by the first Group III nitride crystal heating unit 4002a.

In the production method of the present invention, the second Group III nitride crystal production process preferably is a second Group III nitride crystal production process (A) or a second Group III nitride crystal production process (B) to be described below:

Second Group III nitride crystal production process (A): a process of producing the second Group III nitride crystal by causing a Group III element metal to react with an oxidizing agent and nitrogen-containing gas; and Second Group III nitride crystal production process (B): a process including: a reduced product gas generation step of causing a Group III oxide to react with reducing gas to generate reduced product gas of the Group III oxide; and a crystal generation step of causing the reduced product gas to react with nitrogen-containing gas to generate the second Group III nitride crystal.

It is preferable that the second Group III nitride crystal production process includes an early stage crystal growth step; and a late stage crystal growth step and that the crystal growth temperature in the late stage crystal growth step is higher than the crystal growth temperature in the early stage crystal growth step. With this configuration, even if the first Group III nitride crystal includes an alkali metal remaining therein (inclusion), it is possible to inhibit or prevent defectiveness caused by explosion. Specifically, first, in the early stage crystal growth step, a Group III nitride crystal is grown at a relatively low temperature, whereby explosion is less liable to occur at portions with the remaining alkali metal (inclusion). Furthermore, the Group III nitride crystal grown in the early stage crystal growth step serves as a lid covering the portions with the remaining alkali metal (inclusion). Next, by causing crystal growth at a relatively high temperature in the late stage crystal growth step, it is possible to grow a Group III nitride crystal rapidly and efficiently. Even if explosion occurs at the portions with the remaining alkali metal (inclusion), the portions with the remaining alkali metal (inclusion) are covered with the Group III nitride crystal serving as the lid in the early stage crystal growth step. Thus, it is possible to inhibit or prevent the possibility that the explosion may result in defectiveness such as defects of a crystal grown in the late stage crystal growth step. With this configuration, for example, even if the first Group III nitride crystal heating step is not performed, it is possible to inhibit or prevent defectiveness of the second Group III nitride crystal caused by the explosion at the portions with the remaining alkali metal (inclusion). Alternatively, this configuration may be used in combination with the first Group III nitride crystal heating step so as to inhibit or prevent the defectiveness of the second Group III nitride crystal caused by the explosion at the portions with the remaining alkali metal (inclusion) more effectively. In this case, it is more preferable that the crystal growth temperature in the early stage crystal growth step is equal to or higher than the crystal growth temperature in the first Group III nitride crystal production process.

In the first Group III nitride crystal production process of the production method according to the present invention, preferably, the seed crystals are hexagonal crystals, and the seed crystals are arranged such that m-planes of the crystals grown from the seed crystals that are adjacent to each other do not almost coincide with each other in the seed crystal selection step. In this case, preferably, the seed crystals are arranged such that a-axes or c-axes of the seed crystals that are adjacent to each other almost coincide with each other. Furthermore, preferably, each seed crystal has a c-plane, and the c-planes are selected as crystal growth planes of the seed crystals and the seed crystals are arranged such that a-axes of the seed crystals that are adjacent to each other almost coincide with each other in the seed crystal selection step. In this case, more preferably, the seed crystals are arranged such that apexes of hexagons of the Group III nitride crystals grown from the seed crystals that are adjacent to each other almost coincide with each other in the Group III nitride crystal liquid phase growth step. Furthermore, preferably, the seed crystals are arranged such that the sides of the crystals grown from the seed crystals do not almost coincide with each other.

In the first Group III nitride crystal production process, for example, the preliminarily provided Group III nitride may include a plurality of Group III nitride crystals arranged on a substrate and the Group III nitride crystals may be selected as the seed crystals in the seed crystal selection step, or the preliminarily provided Group III nitride may be a Group III nitride crystal layer, a mask having a plurality of through holes may be arranged on the Group III nitride crystal layer, and parts of the plane of the Group III nitride crystal layer exposed from the through holes may be selected as the seed crystals in the seed crystal selection step.

In the seed crystal selection step, preferably, the preliminarily provided Group III nitride includes a plurality of Group III nitride crystals arranged on a substrate, the Group III nitride crystals are selected as the seed crystals, and the Group III nitride crystals arranged on the substrate are Group III nitride crystals formed by removing parts of the Group III nitride crystal layer formed on the substrate.

In the seed crystal selection step, preferably, the preliminarily provided Group III nitride is a Group III nitride crystal layer, a mask having a plurality of through holes is arranged on the Group III nitride crystal layer, parts of the plane of the Group III nitride crystal layer exposed from the through holes are selected as the seed crystals, and the mask does not adhere to the Group III nitride crystal layer.

Preferably, a plurality of units each composed of the Group III nitride crystal layer and the mask or a plurality of units each composed of the substrate and the Group III nitride crystal are adjacently arranged in parallel in the seed crystal selection step, the contact step, and the crystal growth step, and the Group III nitride crystals grown from the units that are adjacent to each other are bound to each other by the growth of the Group III nitride crystals in the crystal growth step.

In the case where the units are adjacently arranged in parallel, preferably, in the first Group III nitride crystal production process, the seed crystals are hexagonal crystals and the seed crystals are arranged such that m-planes of the crystals grown from the seed crystals that are adjacent to each other do not almost coincide with each other between the units that are adjacent to each other. In this case, preferably, the seed crystals are arranged such that a-axes or c-axes of the seed crystals that are adjacent to each other almost coincide with each other between the units that are adjacent to each other. Furthermore, more preferably, each seed crystal has a c-plane, and the c-planes are selected as crystal growth planes of the seed crystals and the seed crystals are arranged such that a-axes of the seed crystals that are adjacent to each other almost coincide with each other between the units that are adjacent to each other in the seed crystal selection step. In this case, yet more preferably, in the Group III nitride crystal liquid phase growth step, the seed crystals are arranged such that apexes of hexagons of the Group III nitride crystal grown from the seed crystals that are adjacent to each other almost coincide with each other between the units that are adjacent to each other.

The material for the mask or the substrate is not limited to particular materials. Preferably, the mask or substrate contains at least one selected from the group consisting of $Al_xGa_{1-x}N$ ($0<x\leq1$), an oxide of the $Al_xGa_{1-x}N$ ($0<x\leq1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten. The material for the mask or the substrate may be sapphire, Group III nitride, gallium arsenide (GaAs), silicon (Si), silicon carbide (SiC), magnesium oxide (MgO), zinc oxide (ZnO), gallium phosphide (GaP), zirconium diboride ($ZrB_2$), lithium dioxogallate ($LiGaO_2$), BP, $MoS_2$, $LaAlO_3$, NbN, $MnFe_2O_4$, $ZnFe_2O_4$, ZrN, TiN, $MgAl_2O_4$, $NdGaO_3$, $LiAlO_2$, $ScAlMgO_4$, or $Ca_8La_2(PO_4)_6O_2$.

Preferably, the through holes of the mask or the Group III nitride crystals arranged on the substrate each have a dot shape, although it is not particularly limited. In this case, preferably, the through holes of the mask or the Group III nitride crystals arranged on the substrate are aligned at substantially equal intervals and each have substantially the same size. Thereby, for example, the association time of the crystals grown from the seed crystals can be synchronized. The expression "the through holes of the mask or the Group III nitride crystals arranged on the substrate "each have substantially the same size"" shall be understood as follows. That is, the size of the smallest through hole of the mask or the smallest Group III nitride crystal arranged on the substrate relative to the size of the largest through hole of the mask or the largest Group III nitride crystal arranged on the substrate is preferably 80% or more, more preferably 90% or more, yet more preferably 95% or more, and ideally 100%. Furthermore, the expression "the through holes of the mask or the Group III nitride crystals arranged on the substrate are aligned "at substantially equal intervals"" shall be understood as follows. That is, with reference to the distance (interval) between the centers of the adjacent through holes of the mask or the distance (interval) between the centers of the adjacent Group III nitride crystals arranged on the substrate, the shortest distance (interval) relative to the longest distance (interval) is preferably 80% or more, more preferably 90% or more, yet more preferably 95% or more, and ideally 100%. The diameter of the dot is preferably in the range from 0.01 to 10 mm. The distance between the centers of the adjacent through holes of the mask or the distance between the centers of the adjacent Group III nitride crystals arranged on the substrate is not particularly limited, and is preferably 0.01 mm or more.

In the production method according to the present invention, the first Group III nitride crystal is preferably a Group III nitride crystal represented by $Al_xGa_yIn_{1-x-y}N$ ($0 \leq x \leq 1$, $0 \leq y \leq 1$, $x+y \leq 1$) and particularly preferably GaN.

In the second Group III nitride crystal production process (A) of the production method according to the present invention, the Group III element metal is preferably at least one selected from the group consisting of gallium, indium, and aluminum and is particularly preferably gallium.

In the production method according to the present invention, preferably, the second Group III nitride crystal production process (A) includes: a Group III element metal oxidation product gas generation step of causing the Group III element metal and the oxidizing agent to react with each other to generate Group III element metal oxidation product gas; and a second Group III nitride crystal generation step of causing the Group III element metal oxidation product gas and the nitrogen-containing gas to react with each other to generate the second Group III nitride crystal.

In the Group III element metal oxidation product gas generation step, preferably, the Group III element metal is caused to react with the oxidizing agent in a heated state. Furthermore, preferably the Group III element metal oxidation product gas is Group III element metal oxide gas. In this case, more preferably, the Group III element metal is gallium and the Group III element metal oxide gas is $Ga_2O$ gas.

In the second Group III nitride crystal production process (A), preferably, the oxidizing agent is an oxygen-containing compound. Alternatively, in the second Group III nitride crystal production process (A), preferably, the oxidizing agent is oxidizing gas.

In the second Group III nitride crystal production process (A), the oxidizing gas is preferably at least one selected from the group consisting of $H_2O$ gas, $O_2$ gas, $CO_2$ gas, and CO gas and is particularly preferably $H_2O$ gas.

In the second Group III nitride crystal production process (A), preferably, the nitrogen-containing gas is at least one selected from the group consisting of $N_2$, $NH_3$, hydrazine gas, and alkylamine gas.

In the second Group III nitride crystal production process, the volume of the oxidizing gas with respect to the total volume of the oxidizing gas and the nitrogen-containing gas is, for example, more than 0% and less than 100%, preferably 0.001% or more and less than 100%, more preferably in the range from 0.01% to 95%, and yet more preferably in the range from 0.1% to 80%, and still more preferably in the range from 0.1% to 60%, although it is not particularly limited.

In the second Group III nitride crystal production process (A), preferably, the reaction is performed in the presence of reducing gas in a reaction system. The reducing gas is preferably hydrogen-containing gas. Preferably, the reducing gas is at least one selected from the group consisting of $H_2$ gas, carbon monoxide (CO) gas, hydrocarbon gas, $H_2S$ gas, $SO_2$ gas, and $NH_3$ gas. More preferably, hydrocarbon gas is at leas one of methane gas and ethane gas. Furthermore, in the second Group III nitride crystal production process, preferably, the oxidizing agent is the oxidizing gas, and the oxidizing gas is mixed with the reducing gas.

In the second Group III nitride crystal production process, preferably, the reaction in the presence of the reducing gas is performed at a temperature of 650° C. or higher.

In the second Group III nitride crystal production process (A), the Group III nitride crystal may be generated in a condition under pressure, in a condition under reduced pressure, or in conditions other than these conditions, for example.

Next, in the reduced product gas generation step in the second Group III nitride crystal production process (B) of the production method according to the present invention, preferably, the Group III oxide is caused to react with the reducing gas in a heated state.

Furthermore, in the second Group III nitride crystal production process (B), preferably, the Group III oxide is $Ga_2O_3$, the reduced product gas is $Ga_2O$ gas, and the Group III nitride crystal is a GaN crystal.

In the second Group III nitride crystal production process (B), preferably, the reduced product gas generation step is performed in an atmosphere of mixed gas of the reducing gas and inert gas. Preferably, the proportion of the reducing gas with respect to the total amount of the mixed gas is 3 vol. % or more and less than 100 vol. %, and the proportion of the inert gas with respect to the total amount of the mixed gas is more than 0 vol. % and 97 vol. % or less. Furthermore, preferably, the inert gas includes nitrogen gas.

In the second Group III nitride crystal production process (B), preferably, the reducing gas includes hydrogen gas.

In the second Group III nitride crystal production process (B), preferably, the nitrogen-containing gas includes ammonia gas.

The crystal generation step in the second Group III nitride crystal production process (B) may be performed in a condition under pressure, for example. The present invention however is not limited thereto and the crystal generation step in the second Group III nitride crystal production process (B) may be performed in a condition under reduced pressure or in conditions other than these conditions, for example.

Preferably, the production method according to the present invention further includes a slicing step of slicing the second Group III nitride crystal to provide at least one Group III nitride crystal substrate.

Furthermore, preferably, the production method according to the present invention further includes a polishing step of polishing the surface of the first Group III nitride crystal. In the second Group III nitride crystal production process, preferably, the second Group III nitride crystal is produced by vapor phase epitaxy on a plane of the first Group III nitride crystal polished in the polishing step.

In the production method according to the present invention, the second Group III nitride crystal is preferably a Group III nitride crystal represented by $Al_xGa_yIn_{1-x-y}N$ ($0 \leq x \leq 1$, $0 \leq y \leq 1$, $x+y \leq 1$) and particularly preferably GaN.

In the production method according to the present invention, preferably, the second Group III nitride crystal produced has a major axis of 15 cm or more, although it is not particularly limited. Furthermore, preferably, the second Group III nitride crystal produced has a dislocation density of $1.0 \times 10^7$ cm$^{-2}$ or less, although it is not particularly limited. Moreover, in the second Group III nitride crystal produced, preferably, a half width of each of a symmetric reflection component (002) and an asymmetric reflection component (102) by an X-ray rocking curve method (XRC) is 300 seconds or less, although it is not particularly limited.

The concentration of oxygen contained in the second Group III nitride crystal produced may be $1 \times 10^{20}$ cm$^{-3}$ or less. However, the present invention is not limited thereto and the concentration of oxygen contained in the second Group III nitride crystal may exceed $1 \times 10^{20}$ cm$^{-3}$.

The present invention also provides a method for producing a Group III nitride crystal in a melt containing at least an alkali metal and a Group III element, including: an adjustment step of adjusting the content of an impurity element other than the alkali metal and the Group III element in the melt; and a reaction step of causing the Group III element to react with nitrogen (hereinafter this method is referred to as "impurity element adjustment liquid phase epitaxy"). The impurity element in the adjustment step preferably is at least one selected from the group consisting of oxygen, silicon, germanium, and magnesium. Among them, oxygen is particularly preferable. It is preferable to adjust the content of the impurity element in the adjustment step in such a manner that the concentration of the impurity element in a Group III nitride crystal to be produced would be more than $1 \times 10^{17}$ cm$^{-3}$ and less than $1 \times 10^{20}$ cm$^{-3}$. Alternatively, it is preferable to adjust the content of the impurity element in the adjustment step in such a manner that the lattice constant in the a-axis direction of a Group III nitride crystal to be produced would be 0.3185 nm to 0.3193 nm. The impurity element adjustment liquid phase epitaxy preferably is configured so that it further includes: a seed crystal selection step of selecting a plurality of parts of a preliminarily provided Group III nitride as seed crystals for generation and growth of Group III nitride crystals; and a contact step of bringing the surfaces of the seed crystals into contact with an alkali metal melt, wherein the reaction step is a Group III nitride crystal liquid phase growth step of causing a Group III element and nitrogen to react with each other in a nitrogen-containing atmosphere in the alkali metal melt to generate and grow Group III nitride crystals, and in the Group III nitride crystal liquid phase growth step, the Group III nitride crystals are bound together by growth of the Group III nitride crystals grown from the seed crystals to produce the Group III nitride crystal. In the impurity element adjustment liquid phase epitaxy, the growth direction of the Group III nitride crystal in the reaction step preferably is as follows, for example: the growth direction is tilted relative to the c-axis in the first half of the reaction step, and the growth direction extends almost in the c-axis direction in the second half of the reaction step. The reason for this is as follows. A Group III nitride crystal tends to incorporate a larger amount of impurities (e.g., oxygen) in the case where it grows in a direction tilted relative to the c-axis, as compared with the case where it grows in the c-axis direction. Thus, with the configuration in which a Group III nitride crystal is grown in a direction tilted relative to the c-axis in the first half of the reaction step and then grown almost in the c-axis direction in the second half of the reaction step, distortion of the Group III nitride crystal can be inhibited more easily even when the Group III nitride crystal is grown on a substrate having a larger lattice constant than the Group III nitride crystal. When the Group III nitride crystal is grown on a substrate (e.g., sapphire) having a smaller lattice constant than the Group III nitride crystal, the Group III nitride crystal can be separated from the substrate easily after the crystal growth, whereby the generation of cracks and warping can be inhibited to improve the production yield. The ranges of "the first half" and "the second half" of the reaction step are not particularly limited. For example, "the first half" may be a period from the start of the reaction step until a lapse of a freely set time, and "the second half" may be the remaining time in the reaction step. The boundary between "the first half" and "the second half" in the reaction step is not particularly limited. For example, "the first half" may be a period until the Group III nitride crystals grown on the adjacent Group III nitride seed crystals have been associated with each other, and "the second half" may be a period after the association. The time corresponding to the boundary between "the first half" and "the second half" is not particularly limited, and is, for example, after a lapse of 10 hours from the start of the reaction step, although it may vary depending on the growth rate of the Group III nitride crystal etc. In order to control the growth direction of the Group III nitride crystal in the reaction step, the degree of supersaturation of the Group III nitride in the alkali metal melt in the reaction step may be controlled, for example. More specifically, for example, the degree of supersaturation of the Group III nitride in the alkali metal melt in the reaction step may be controlled in such a manner that the degree of supersaturation in the first half of the reaction step is lower than the degree of supersaturation in the second half of the reaction step. In order to control the degree of supersaturation of the Group III nitride, at least one of the pressure and the reaction temperature in the reaction step may be controlled, for example. For example, it is preferable that the reaction step is performed in a condition under pressure, and the pressure applied in the first half of the reaction step is smaller than a pressure applied in the second half of the reaction step. Also, it is preferable that, for example, in the reaction step, the reaction temperature in the first half of the reaction step is higher than a reaction temperature in the second half of the reaction step. As a general tendency, the degree of supersaturation is positively correlated with the pressure applied in the reaction step, and the degree of supersaturation is negatively correlated with the reaction temperature in the reaction step. It is to be noted, however, that this merely is an example of the tendency and does not limit the present invention by any means. The crystal growth plane in the reaction step may extend, for example, in a direction almost parallel with the c-plane or in a direction tilted relative to the c-plane. The impurity element adjustment liquid phase epitaxy may be configured so that, in the reaction step, the Group III element is caused to react with the nitrogen on a substrate to grow the Group III nitride crystal. The substrate is not particularly limited, and examples thereof include those given above as examples of the substrate used in the "first Group III nitride crystal production process". It is particularly preferable that the substrate is a sapphire substrate from the viewpoint of the cost and the like. The production method of the present invention may be configured so that the first Group III nitride crystal production process is a process of producing the first Group III nitride crystal by the impurity element adjustment liquid phase epitaxy.

The Group III nitride crystal production apparatus of the present invention may further include a first Group III nitride crystal heating unit (a unit that performs the first Group III nitride crystal heating step of heat-treating the first Group III nitride crystal, prior to the second Group III nitride crystal production process). The Group III nitride crystal production apparatus of the present invention preferably is configured so that the second Group III nitride crystal production unit can set the crystal growth temperature in the late stage crystal growth step so as to be higher than the crystal growth temperature in the early stage crystal growth step. Also, the Group III nitride crystal production apparatus of the present invention preferably is configured so that the second Group III nitride crystal production unit can set the crystal growth temperature in the early stage crystal growth step so as to be equal to or higher than the crystal growth temperature in the first Group III nitride crystal production process.

The Group III nitride crystal production apparatus of the present invention may be a Group III nitride crystal production apparatus for use in a method for producing a Group III nitride crystal by the impurity element adjustment liquid phase epitaxy, including: an adjustment unit that adjusts the content of an impurity element other than the alkali metal and the Group III element in the melt; and a reaction unit that causes the Group III element to react with nitrogen.

Next, the embodiments of the present invention are described in detail below. However, the embodiments described below are mere examples and do not limit the present invention at all.

<1. Production Method of the Present Invention>

As described above, the production method according to the present invention is a method for producing a Group III nitride crystal, including: a first Group III nitride crystal production process of producing a first Group III nitride crystal by liquid phase epitaxy; and a second Group III nitride crystal production process of producing a second Group III nitride crystal on the first Group III nitride crystal by vapor phase epitaxy. The first Group III nitride crystal production process includes: a seed crystal selection step of selecting a plurality of parts of a preliminarily provided Group III nitride as seed crystals for generation and growth of Group III nitride crystals; a contact step of bringing the surfaces of the seed crystals into contact with an alkali metal melt; and a Group III nitride crystal liquid phase growth step of causing a Group III element and nitrogen to react with each other in a nitrogen-containing atmosphere in the alkali metal melt to generate and grow Group III nitride crystals. In the Group III nitride crystal liquid phase growth step, the Group III nitride crystals are bound together by growth of the Group III nitride crystals grown from the seed crystals to produce the first Group III nitride crystal. In the second Group III nitride crystal production process, a Group III element metal or a Group III element compound is caused to react with nitrogen-containing gas to produce the second Group III nitride crystal.

In a common Group III nitride crystal production method, it is very difficult to produce a large Group III nitride crystal of high quality with few defects such as a distortion, a dislocation, and warping.

As described above, there are liquid phase epitaxy and vapor phase epitaxy as the Group III nitride crystal production method. The liquid phase epitaxy and vapor phase epitaxy however had problems. That is, it is very difficult to grow a fine seed crystal large by liquid phase epitaxy by spending a long period of time. Also, there is a possibility that a crystal grown by liquid phase epitaxy has inclusions (liquid or small miscellaneous crystals, and the like). The inclusion may cause crystal defects. On the other hand, in the vapor phase epitaxy, there is a large difference in lattice constant, thermal expansion coefficient, and the like between the Group III nitride crystal and the substrate of sapphire or the like. Thus, there is a possibility that defects such as a distortion, a dislocation, and warping are caused in the Group III nitride crystal. For solving these problems, use of a large Group III nitride substrate of high quality with few defects such as a distortion, a dislocation, warping, and the like as a seed crystal can be considered. However, it is very difficult to obtain such a seed crystal.

For solving these problems, the inventors of the present invention conducted earnest studies and arrived at the present invention. In the production method according to the present invention, as described above, the first Group III nitride crystal is produced by liquid phase epitaxy (the "first Group III nitride crystal production process"). In this process, as described above, Group III nitride crystals grown from seed crystals are bound together to produce the first Group III nitride crystal. In this first Group III nitride crystal production process, for example, a large first Group III nitride crystal of high quality with few defects such as a distortion, a dislocation, warping, and the like can be obtained. Then, using the thus obtained first Group III nitride crystal as a seed crystal, the second Group III nitride crystal is produced by vapor phase epitaxy (the "second Group III nitride crystal production process"). Thereby, a large Group III nitride crystal of high quality with few defects such as a distortion, a dislocation, and warping can be produced.

Figure 1:
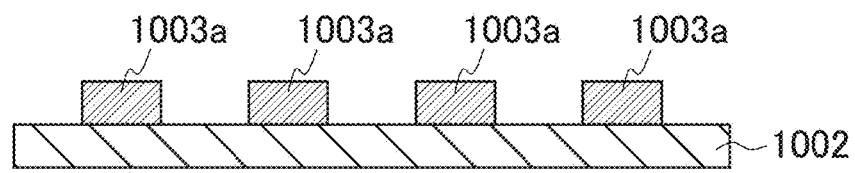
FIG. 1 shows cross sectional views schematically showing an example of processes of the production method according to the present invention.
Figure 1:
Figure 1:
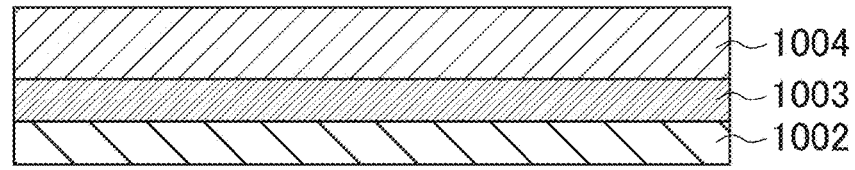

(a) to (c) of FIG. 1 are cross sectional views schematically showing an example of a production method according to the present invention. That is, first, as shown in (a) of FIG. 1, a substrate 1002 provided with seed crystals 1003a is provided. In (a) of FIG. 1, seed crystals 1003a are provided on the substrate 1002. However, the substrate may be used or may not be used as needed. Next, as shown in (b) of FIG. 1, by binding Group III nitride crystals grown from the seed crystals 1003a together, a first Group III nitride crystal 1003 is obtained (first Group III nitride crystal production process). Then, as shown in (c) of FIG. 1, a second Group III nitride crystal 1004 is produced on the first Group III nitride crystal 1003 by vapor phase epitaxy (second Group III nitride crystal production process).

Figure 2:
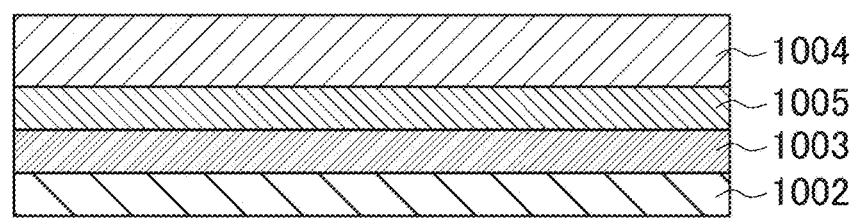
FIG. 2 is a cross sectional view schematically showing an example of a Group III nitride crystal produced by the production method according to the present invention, which is different from FIG. 1.

The production method according to the present invention may appropriately include or not include steps other than the first Group III nitride crystal production process and the second Group III nitride crystal production process. For example, the production method according to the present invention may include or not include a step of providing one or more other components (for example, other Group III nitride crystal layers, and the like) between the first Group III nitride crystal and the second Group III nitride crystal. That is, the Group III nitride crystal of the present invention produced by the production method according to the present invention may include or not include another layer 1005 between the first Group III nitride crystal 1003 and the second Group III nitride crystal 1004 as shown in FIG. 2. When the Group III nitride crystal includes the layer 1005, the layer 1005 may be one or more. The layer 1005 may be, for example, a Group III nitride crystal or other materials. For example, when the lattice constant, thermal expansion coefficient, and the like between the first Group III nitride crystal and the second Group III nitride crystal are different from each other, the layer 1005 may be provided as a buffer layer. The method for producing the layer 1005 is not limited to a particular method, and can be vapor phase epitaxy or liquid phase epitaxy, for example.

Examples of the production method according to the present invention are described in details below.

<1-1. First Group III Nitride Crystal Production Process (Liquid Phase Epitaxy)>

As described above, the first Group III nitride crystal production process includes: a seed crystal selection step of selecting a plurality of parts of a preliminarily provided Group III nitride as seed crystals for generation and growth of Group III nitride crystals; a contact step of bringing the surfaces of the seed crystals into contact with an alkali metal melt; and a Group III nitride crystal liquid phase growth step of causing a Group III element and nitrogen to react with each other in a nitrogen-containing atmosphere in the alkali metal melt to generate and grow Group III nitride crystals. In the Group III nitride crystal liquid phase growth step, the Group III nitride crystals are bound together by growth of the Group III nitride crystals grown from the seed crystals to produce the first Group III nitride crystal.

<1-1-2. Arrangement Relationship, Shape, Size, and the Like of Seed Crystal>

As described above, preferably, in the first Group III nitride crystal production process, the seed crystals are hexagonal crystals, and in the seed crystal selection step, the seed crystals are arranged such that m-planes of the crystals grown from the seed crystals that are adjacent to each other do not almost coincide with each other. This helps the Group III nitride crystals to bind (associate) tidily at their boundaries, whereby the crystal defects of the first Group III nitride crystal can be reduced.

In the production method of the present invention, preferably, the seed crystals are arranged such that the a-axes or the c-axes of the seed crystals that are adjacent to each other almost coincide with each other. In a hexagonal crystal, the number of "a-axes" is three including a1, a2, and a3 that are equivalent to one another. In the present invention, the state where a-axes of two seed crystals that are adjacent to each other almost coincide with each other indicates the state where any one of the three a-axes of one of the two seed crystals almost coincides with any one of the three a-axes of the three a-axes of the other. Moreover, in the present invention, "almost coinciding" or "substantially coinciding" encompasses both of the case of completely coinciding and the case of substantially coinciding with a slight deviation. The same applies to the case of being represented by "almost" or "substantially" in the other states.

When a Group III nitride crystal is grown from large Group III nitride seed crystals, the Group III nitride crystal grown inherits crystal defects of the seed crystals. In order to solve this problem, the inventors of the present invention found the way of growing a Group III nitride crystal large from small Group III nitride seed crystals. By using small Group III nitride seed crystals as described above, defects in the Group III nitride crystal grown can be reduced. Although the reason for this is not perfectly clear, it is considered that the Group III nitride crystal grown tends not to inherit crystal defects of the seed crystals as compared to the case where large Group III nitride seed crystals are used.

However, in the case of using small Group III nitride seed crystals, there are limitations on the sizes of the Group III nitride crystals to be obtained by the growth. Hence, for obtaining a large crystal, Group III nitride crystals grown from seed crystals may be bound together by the growth. In this case, it is preferable to prevent defects from being caused in binding sites in the course of binding the crystals by the growth. In order to do so, it is preferable not to substantially join m-places of crystals grown from hexagonal seed crystals with each other, i.e., it is preferable to arrange the seed crystals such that m-planes of crystals grown from seed crystals that are adjacent to each other do not almost coincide with each other. This makes it possible to prevent or reduce defects in the binding site of the two seed crystals. Moreover, a crystal of higher quality with fewer defects can be produced by arranging the seed crystals such that a-axes or c-axes of the seed crystals that are adjacent to each other almost (substantially) coincide with each other.

In the first Group III nitride crystal, the dislocation density is not particularly limited and is preferably $1.0 \times 10^7$ cm$^{-2}$ or less, more preferably $1.0 \times 10^{-4}$ m$^{-2}$ or less, yet more preferably $1.0 \times 10^{-3}$ cm$^{-2}$ or less, and still more preferably $1.0 \times 10^{-2}$ cm$^{-2}$ or less. Although the dislocation density is ideally 0, it is commonly impossible for the dislocation density to be 0. Thus, for example, the dislocation density is a value more than 0 and is particularly preferably a measurement limit or less of a measurement instrument. The dislocation density may be, for example, an average value of the entire crystal, and, more preferably, the maximum value in the crystal is the above-described value or less. In the Group III nitride crystal of the present invention, the half width of each of a symmetric reflection component (002) and an asymmetric reflection component (102) by XRC is, for example, 300 seconds or less, preferably 100 seconds or less, more preferably 30 seconds or less, and ideally 0.

As described above, in the Group III nitride crystal production process, preferably, the seed crystals are arranged such that m-planes of the crystals grown from the seed crystals that are adjacent to each other do not almost coincide with each other. Moreover, preferably, the seed crystals are arranged such that a-axes or c-axes of the seed crystals that are adjacent to each other almost coincide with each other. The arrangement in which m-planes of crystals grown from the seed crystals that are adjacent to each other do not almost coincide with each other and the arrangement in which a-axes or c-axes of the seed crystals that are adjacent to each other almost coincide with each other are described with reference to FIGS. 13A to 18C. FIGS. 13A to 18C, however, are mere examples and do not limit the present invention. Hereinafter, the conditions where m-planes of crystals grown from seed crystals that are adjacent to each other do not almost coincide with each other are also referred to as the "conditions (M)", the conditions where a-axes of two seed crystals that are adjacent to each other almost (substantially) coincide with each other are also referred to as the "conditions (A)", and the conditions where c-axes of two seed crystals that are adjacent to each other almost (substantially) coincide with each other are also referred to as the "conditions (C)".

First, the conditions (the conditions (A)) where a-axes of two seed crystals that are adjacent to each other almost (substantially) coincide with each other and the conditions (the conditions (M)) where m-planes of crystals grown from seed crystals that are adjacent to each other do not almost coincide with each other are described using FIGS. 13A to 13E as examples. In the present invention, the crystal growth plane of each seed crystal is not particularly limited and may be, for example, any of c-, m-, and a-planes and any other plane, and is more preferably a c- or m-plane. The case where c-planes of seed crystals (c-plane seed crystals) having the c-planes are selected as crystal growth planes, and crystals are grown from the c-planes is shown in FIGS. 13A to 13E.

Each of FIGS. 13A to 13E is a plan view showing, by way of example, an arrangement of two seed crystals that are adjacent to each other. In each of FIGS. 13A to 13E, a c-plane (crystal growth plane) is parallel with a plane of paper. Each of FIGS. 13A to 13E shows crystals in the case where two hexagonal crystals are grown from two dot-like seed crystals, for the sake of convenience of the description. Three a-axes of these crystals coincide with the three diagonal lines that pass through the center of the hexagon and match with the a-axes of seed crystals from which these crystals are derived.

Figure 13A:
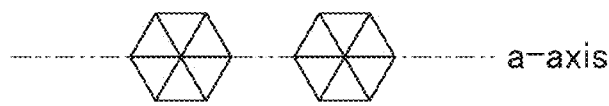
FIGS. 13A to 13E are plan views showing examples of an arrangement of two seed crystals that are adjacent to each other in c-plane seed crystals.
Figure 13B:
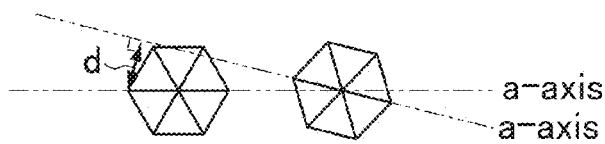

First, the conditions (A) are described. FIG. 13A shows the state where a-axes of two seed crystals that are adjacent to each other completely coincide with each other as an example of the arrangement satisfying the conditions (A). In the Group III nitride crystal production method of the present invention, the two seed crystals that are adjacent to each other are ideally made in such arrangement. The conditions (A), however, are satisfied as long as a-axes of the seed crystals that are adjacent to each other almost coincide with each other. In the conditions (A), the state where the a-axes almost (substantially) coincide with each other encompasses the state where the a-axes completely coincide with each other as shown in FIG. 13A and is, however, not limited to only this and encompasses the state where the a-axes substantially coincide with each other with a slight deviation, for example. Specifically, for example, as shown in FIG. 13B, an a-axis of one of the seed crystals may be slightly tilted relative to an a-axis of the other seed crystal. The arrangement is not limited to the arrangement where a-axes of two seed crystals coincide or intersect with each other as shown in FIGS. 13A and 13B and may be in the state where a-axes of two seed crystals are parallel with each other and are slightly apart from each other as shown in FIG. 13E.

In the conditions (A), an angle formed between the a-axes is less than 30° (degree) and preferably as small as possible. The angle formed between the a-axes is preferably 5° or less, more preferably 1° or less, yet more preferably 0.1° or less, still more preferably 0.02° or less, and particularly preferably 0°. In the case where the a-axes completely coincide with each other as shown in FIG. 13A and in the case where the a-axes are parallel with each other as shown in FIG. 13E, the angle formed between the a-axes is 0°. However, the angle formed between the a-axes normally is not exactly 0°, and directions of the a-axes are slightly deviated from each other.

Each of the two seed crystals is a hexagonal crystal. Thus, each seed crystal has three a-axes. When whether or not the conditions (A) of the present invention are satisfied is determined, a-axes and the angle formed between the a-axes are defined by the following (1) to (3):

(1) Any one of three a-axes of each of two seed crystals that are adjacent to each other is selected. The number of combinations of a-axes by this selection is 3×3=9.

(2) The two a-axes selected in (1) form an angle.

(3) Among nine combinations in (1), a combination of a-axes with the minimum angle of (2) is used as a-axes, and the angle (of (2)) formed between the a-axes in the combination is used as the angle formed between the a-axes.

When the distance between the a-axes of the two seed crystals that are adjacent to each other is too long, the a-axes do not substantially coincide with each other. Thus, the conditions (A) are not satisfied. When the a-axes are parallel with each other, the distance is, for example, a length indicated by the sign d in each of FIGS. 13C and 13E. When the a-axes are not parallel with each other, the distance between the a-axes is, for example, in the case where a line perpendicular from one of the a-axes to the other a-axis coincides with either of the two seed crystals in at least one point, the length of the longest perpendicular line (e.g., the length indicated by the sign d in each of FIGS. 13B and 13D assuming that a hexagon shown in each of FIGS. 13B and 13D is a seed crystal). In the conditions (A), the distance between the a-axes is, for example, 1 mm or less, preferably 0.5 mm or less, more preferably 0.3 mm or less, yet more preferably 0.1 mm or less, particularly preferably 0.05 mm or less, and ideally 0. The case where the distance between the a-axes is 0 is the case where the a-axes completely coincide with each other (e.g., FIG. 13A).

Figure 13C:
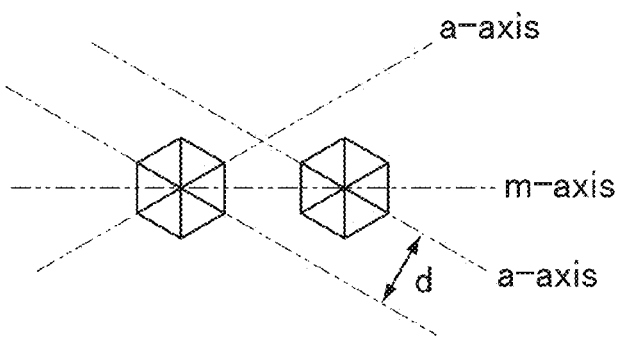
Figure 13D:
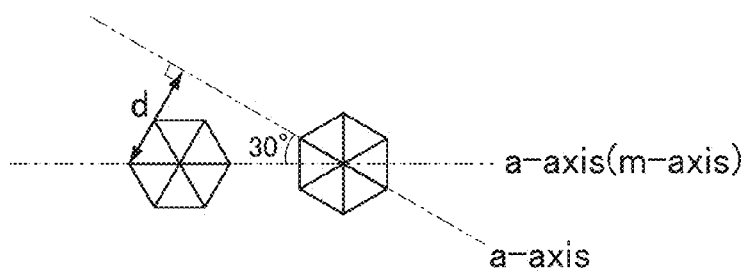
Figure 13E:
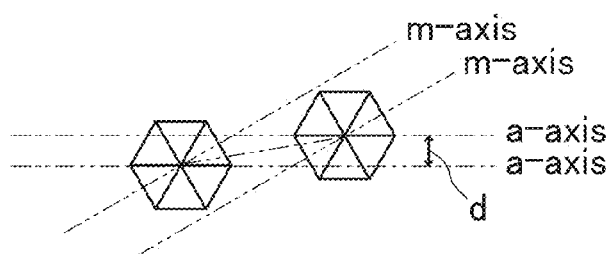

An example in which the conditions (A) are not satisfied is shown in FIGS. 13C and 13D. In FIG. 13C, although a-axes of two seed crystals that are adjacent to each other are parallel with each other, the distance d between the a-axes is too long. Thus, the a-axes do not substantially coincide with each other. In FIG. 13C, m-axes of the two seed crystals coincide with each other. Thus, m-planes (sides of hexagon shown in FIG. 13C) of crystals generated from the two seed crystals face to each other. When two seed crystals that are adjacent to each other are arranged as described above, for example, as shown in the comparative examples to be described below, two crystals grown from the two seed crystals are associated with (bound to) each other in the state where m-planes of the two crystals face to (coincide with) each other. That is, m-planes of the crystals grown from the two seed crystals that are adjacent to each other coincide with each other, and thus, the conditions (M) are not satisfied. In such a case, crystal defects are caused in the plane in which the crystals are associated (bound), and thus, a Group III nitride crystal of high quality cannot be obtained, and the object of the present invention cannot be achieved. That is, it is required that m-planes of two crystals grown from two seed crystals that are adjacent to each other do not substantially face to each other (do not substantially coincide with each other) in the present invention. In FIG. 13E, the distance d between the a-axes is short as shown in FIG. 13E. Thus, when the two crystals in FIG. 13E are grown, the area in which the m-planes face to (coincide with) each other is small. When the area in which the m-planes face to (coincide with) each other is really small, it can be said that the m-planes do not substantially face to each other (do not substantially coincide with each other). In the present invention, for example, by satisfying the conditions (A), the conditions where m-planes of two crystals grown from two seed crystals that are adjacent to each other do not substantially face to each other (do not almost coincide with each other) can be satisfied. In the case where a-axes of two seed crystals that are adjacent to each other completely coincide with each other as shown in FIG. 13A, when crystals grown from these seed crystals are associated with (bound to) each other, the association (binding) does not occur in the state where m-planes face to (coincide with) each other as described below.

In FIG. 13D, the angle formed between a-axes of two seed crystals that are adjacent to each other is 30°, so that the conditions (A) are not satisfied. Preferably, the angle formed between the a-axes is as small as possible, and the angle is specifically as described above.

In each of FIGS. 13C and 13D, the center of the left seed crystal coincides with the maxis of the right seed crystal. In the present invention, when each seed crystal has a dot shape, preferably, the center of one of the seed crystals does not coincide with the maxis of the other seed crystal (e.g., FIGS. 13C and 13D).

In the first Group III nitride crystal production process, the shape of each seed crystal is not limited to particular shapes and is, for example, preferably a dot shape. The dot shape is not particularly limited, and examples thereof include a circle, an equilateral polygon, and shapes close thereto. Examples of the equilateral polygon include an equilateral triangle, a square, an equilateral pentagon, and an equilateral hexagon. Among them, a circle or an equilateral hexagon is particularly preferable from the viewpoint of few defects (isotropy or the like) in a produced crystal (grown from the seed crystal). The size of the seed crystal having a dot shape is not particularly limited and is preferably as small as possible from the viewpoint of producing a Group III nitride crystal of high quality with few defects. It is to be noted that the size of the seed crystal having a dot shape is preferably not too small from the viewpoint of production efficiency (growth efficiency) of the Group III nitride crystal. The diameter of the crystal growth plane (e.g., a c-plane in a c-plane seed crystal) of the seed crystal having a dot shape is, for example, 10 mm or less, preferably 5 mm or less, more preferably 3 mm or less, yet more preferably 1.5 mm or less, and particularly preferably 1 mm or less. The lower limit of the diameter is, for example, 0.01 mm or more, preferably 0.1 mm or more, and more preferably 0.2 mm or more. In the present invention, in the case where the shape of the seed crystal or the Group III nitride crystal is other than a circle (a perfect circle), the "diameter" represents "the major axis (the longest diameter)".

The shape of each seed crystal is not limited to the dot shape and may be, for example, any of a rectangle, an ellipse, a stripe shape, and shapes close to them, and any other shapes. The shape is preferably a dot shape from the viewpoint of few defects (isotropy or the like) in a produced crystal (grown from the seed crystal). The size of the seed crystal having a rectangle, an ellipse, a stripe shape, or the like is not particularly limited, and from the viewpoint of few defects in a produced crystal (grown from the seed crystal), the width is, for example, 10 mm or less, preferably 5 mm or less, more preferably 3 mm or less, yet more preferably 1.5 mm or less, and particularly preferably 1 mm or less. The lower limit of the width is, for example, 0.01 mm or more, preferably 0.1 mm or more, and more preferably 0.2 mm or more from the viewpoint of production efficiency (growth efficiency) of the Group III nitride crystal.

Figure 14A:
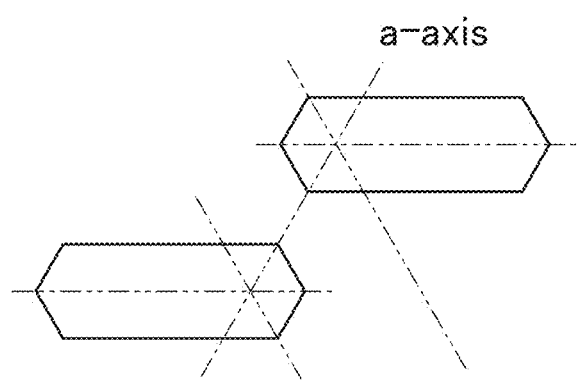
FIGS. 14A and 14B are plan views showing other examples of an arrangement of two seed crystals that are adjacent to each other in c-plane seed crystals.
Figure 14B:
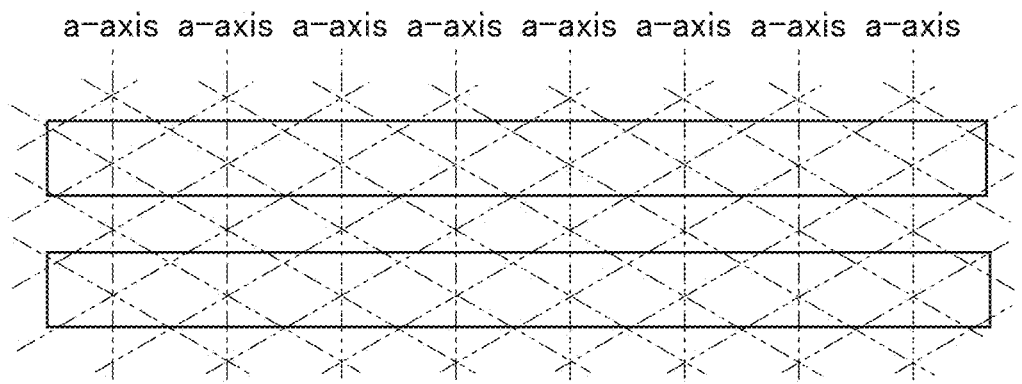

FIGS. 14A and 14B show other examples of the arrangement of seed crystals (c-plane seed crystals) each having a c-plane. In each of FIGS. 14A and 14B, a c-plane (crystal growth plane) is parallel with a plane of paper. FIG. 14A shows an example in which long and thin hexagonal crystals grown from seed crystals having a rectangle, an ellipse, or the like are adjacent to each other. In such a case, whether the conditions (A) are satisfied may be determined considering the angle formed between a-axes of the seed crystals that are adjacent to each other and the distance between the a-axes as in the description of FIGS. 13A to 13E. FIG. 14A shows an example in which the a-axes completely coincide with each other, and apexes of grown hexagonal crystals are associated with (bound to) each other. FIG. 14B shows an example in which the long side of a striped seed crystal is almost (or completely) perpendicular to its a-axis. In such a case, it can be considered that the a-axis is present at any position in the direction almost (or completely) perpendicular to the direction of the seed crystal. Thus, whether the conditions (A) are satisfied can be determined considering only the angle formed between the a-axes of the seed crystals that are adjacent to each other without considering the distance between the a-axes of the seed crystals.

In the first Group III nitride crystal production process, the distance between the centers of seed crystals that are adjacent to each other is not particularly limited and is preferably not too short from the viewpoint of obtaining a crystal of high quality with few defects. This is because defects of the seed crystals tend not to be inherited and a crystal of high quality with few defects can be easily obtained when crystals are bound to each other after sufficiently growing the seed crystals. From the viewpoint of production efficiency of a Group III nitride crystal, the distance between the centers of seed crystals that are adjacent to each other is preferably not too long. The upper limit of the distance between the centers of seed crystals that are adjacent to each other is, for example, 20 mm or less, preferably 5 mm or less, and particularly preferably 1 mm or less. The lower limit of the distance between the centers of seed crystals that are adjacent to each other is preferably 0.01 mm or more, more preferably 0.05 mm or more, and yet more preferably 0.1 mm or more.

In FIGS. 13A to 14B, the case where crystals are grown from c-planes of the seed crystals each having a c-plane (c-plane seed crystal) is described. In the case where the crystal growth plane is any plane (e.g., m-plane or the like) other than the c-plane, the sizes of the seed crystals and the numerical range of the distance between the centers of the seed crystals and the like are not particularly limited and are, for example, the same as those in the case where the crystal growth plane is the c-plane, for example.

The conditions (M), i.e., the conditions where m-planes of crystals grown from seed crystals that are adjacent to each other do not almost coincide with each other, are not particularly limited and are, for example, as follows.

In the case where m-axes of seed crystals that are adjacent to each other are almost parallel with each other (i.e., the angle formed between the m-axes is almost 0°), the conditions (M) may be, for example, conditions where the m-axis of each seed crystal does not pass through the inside of the other seed crystal, for example. Examples of satisfying these conditions include FIGS. 13A and 13E. When m-axes of seed crystals that are adjacent to each other coincide with each other (in this case, the angle formed between the m-axes is 0°), the m-axis of each seed crystal certainly passes through the inside of the other seed crystal as shown in FIG. 13C. In FIG. 13C, as described above, m-planes of crystals grown from the two seed crystals that are adjacent to each other coincide with each other. Thus, the conditions (M) are not satisfied.

Moreover, the conditions (M) may be conditions satisfying the conditions (A) regardless of whether or not the m-axis passes through the inside of the other adjacent seed crystal. This is because, as described for FIGS. 13A, 13B, and 13E and 14A and 14B, when the conditions (A) are satisfied, m-planes of crystals grown from seed crystals that are adjacent to each other do not almost coincide with each other. Furthermore, as shown in FIGS. 15A to 16C as examples to be described below, when the conditions (C) (c-axes of seed crystals that are adjacent to each other almost coincide with each other) are satisfied, m-planes of crystals grown from seed crystals that are adjacent to each other do not almost coincide with each other. Thus, the conditions (M) may be conditions satisfying the conditions (C) regardless of whether or not the m-axis passes through the inside of the other adjacent seed crystal.

In the case where the m-axes are almost parallel with each other, the angle formed between the m-axes is, for example, 1° or less, preferably 0.1° or less, particularly preferably 0.02° or less, and ideally 0°. In the case where the m-axes of seed crystals that are adjacent to each other are not parallel with each other, for example, as shown in FIG. 13D, it is obvious that m-planes (sides of hexagons in FIG. 13D) of crystals grown from the seed crystals do not coincide with each other, and the conditions (M) are satisfied. In this case, the angle formed between the m-axes is, for example, 5° or more, preferably 10° or more, more preferably 20° or more, and particularly preferably 25° or more. In the present invention, the seed crystals are hexagonal crystals, and thus, each seed crystal has three m-axes. In the present invention, when the angle formed between m-axes of seed crystals that are adjacent to each other is defined, the angle is defined according to the same procedures as in (1) to (3) of the conditions (A) except that the a-axes are changed to the m-axes.

In the examples of FIGS. 13A to 14B, c-planes are parallel with the plane of paper (i.e., c-axes of crystals are perpendicular to the plane of paper). Thus, the seed crystals that are adjacent to each other do not satisfy the conditions (C) (the c-axes almost coincide with each other). However, when the conditions (M) are satisfied, and preferably, the conditions (A) are also satisfied, a large Group III nitride seed crystal of high quality with few defects can be produced.

Subsequently, examples of the arrangements of m-plane seed crystals and a-plane seed crystals are described.

Figure 15A:
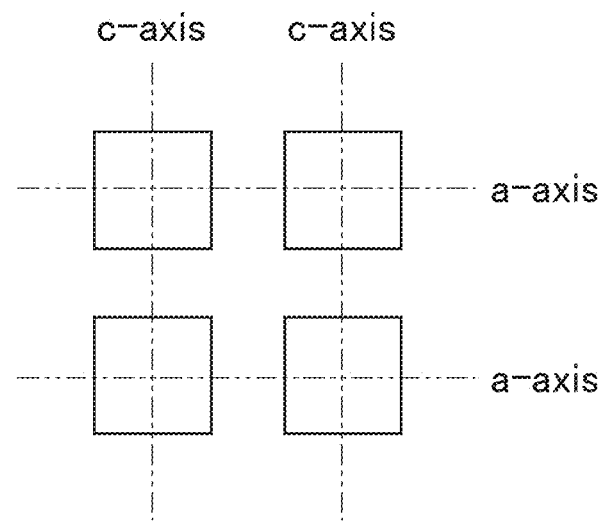
FIGS. 15A to 15C are drawings showing an example of an arrangement of seed crystals in m-plane seed crystals.
Figure 15B:
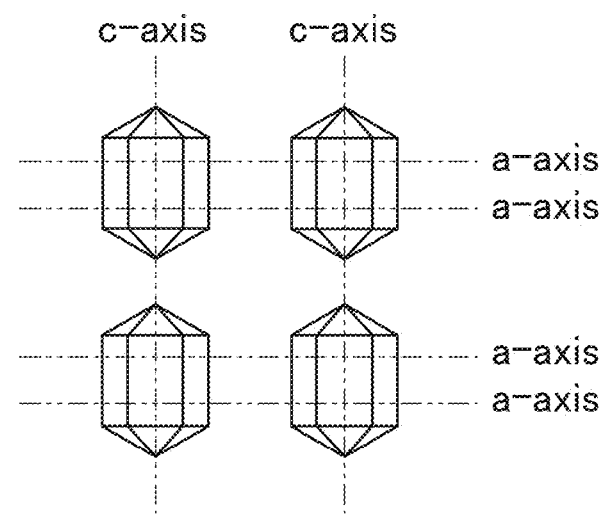
Figure 15C:
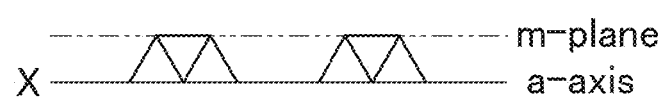

FIGS. 15A to 15C show an example of the arrangement of m-plane seed crystals. In FIGS. 15A and 15B, each m-plane (crystal growth plane) is parallel with the plane of paper. FIG. 15C is a drawing viewed from below the plane of paper of FIG. 15B. In FIG. 15C, the c-plane is parallel with the plane of paper.

FIG. 15A is a drawing schematically showing an example of the arrangement of four square seed crystals in two rows×two columns. As shown in FIG. 15A, c-axes of seed crystals that are vertically adjacent to each other on the plane of paper coincide with each other. Thus, the conditions (C) and (M) are satisfied. Moreover, a-axes of seed crystals that are horizontally adjacent to each other on the plane of paper coincide with each other. Thus, the conditions (A) and (M) are satisfied.

In the conditions (A) of the present invention, the angle formed between a-axes of seed crystals that are adjacent to each other and the distance between the a-axes may be the same as those in the case of the c-plane seed crystal (crystal growth plane is the c-plane) even when the crystal growth planes of the seed crystals are any planes (e.g., m-planes) other than c-plane. Moreover, in the conditions (C) of the present invention, the angle formed between c-axes of seed crystals that are adjacent to each other and the distance between the c-axes may be the same as those in the conditions (A) except that the a-axes are changed to c-axes even when the crystal growth planes are any planes (e.g., a-planes) other than m-planes.

Seed crystals in FIG. 15A are hexagonal crystals. Thus, the crystal forms of crystals grown from the hexagonal crystals are as shown in FIG. 15B. FIG. 15B however merely shows an example, and the present invention is not limited thereby. As shown in FIG. 15B, the a-axes of the crystals can be regarded as being placed at any position at which the crystals horizontally intersect with each other on the plane of paper. The same applies to the seed crystals of FIG. 15A.

As shown in FIG. 15C, in these seed crystals and crystals grown therefrom, the m-planes are parallel with the crystal growth planes, and the m-planes do not coincide with each other. Thus, the conditions (M) are satisfied. Moreover, as shown in FIG. 15C, other m-planes tilted 60° from crystal growth planes also do not coincide with each other (do not directly face each other). Thus, the conditions (M) are satisfied. In FIG. 15C, the straight line X represents a plane parallel with the crystal growth planes of the seed crystals.

Figure 16A:
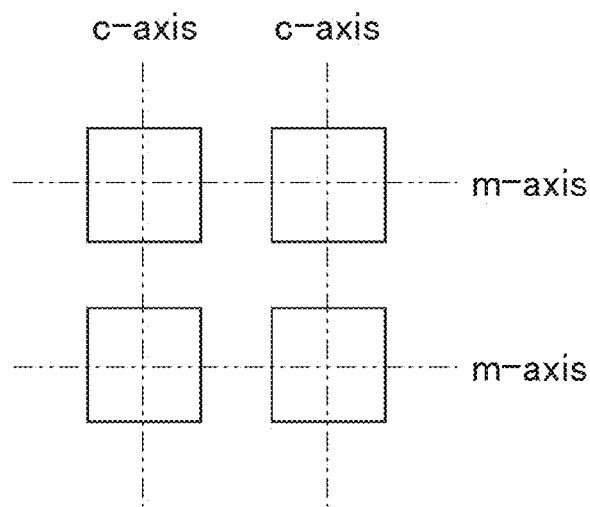
FIGS. 16A to 16C are drawings showing an example of an arrangement of seed crystals in a-plane seed crystals.
Figure 16B:
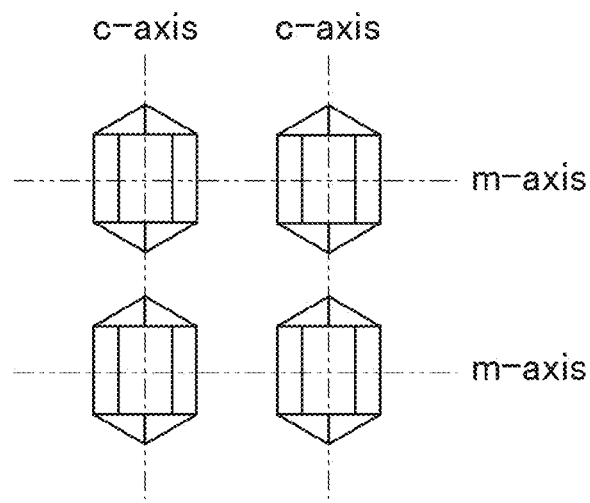
Figure 16C:
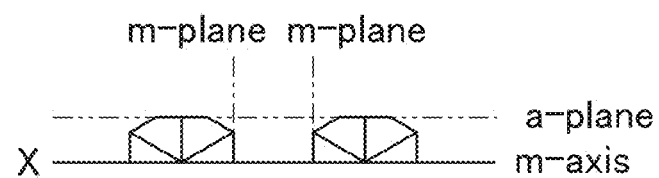

Next, FIGS. 16A to 16C show an example of the arrangement of plural a-plane seed crystals. In FIGS. 16A and 16B, each a-plane (crystal growth plane) is parallel with the plane of paper. FIG. 16C is a drawing viewed from below the plane of paper of FIG. 16B. In FIG. 16C, the c-plane is parallel with the plane of paper.

FIG. 16A is a drawing schematically showing an example of the arrangement of four square seed crystals in two rows×two columns. As shown in FIG. 16A, c-axes of seed crystals that are vertically adjacent to each other on the plane of paper coincide with each other. Thus, the conditions (C) and (M) are satisfied. Moreover, m-axes of seed crystals that are horizontally adjacent to each other on the plane of paper coincide with each other. Thus, the conditions (A), (C), and (M) are not satisfied.

Seed crystals in FIG. 16A are hexagonal crystals. Thus, the crystal forms of crystals grown from the hexagonal crystals are as shown in FIG. 16B. FIG. 16B however merely shows an example, and the present invention is not limited thereby. In FIG. 16B, each a-plane is exposed by cutting the upper part of each crystal at a plane parallel with the crystal growth plane. When the a-plane is viewed from below the plane of paper, as shown in FIG. 16C, m-planes of the seed crystals that are horizontally adjacent to each other on the plane of paper face to each other. Thus, it is understood that the conditions (M) are not satisfied. In FIG. 16C, the straight line X represents the plane parallel with the crystal growth planes of the seed crystals.

In the present invention, although all of the seed crystals that are adjacent to each other preferably satisfy at least one of the conditions (M), (A), and (C), only some of them may satisfy the conditions. For example, as shown in FIGS. 16A and 16B, the seed crystals that are horizontally adjacent to each other on the plane of paper may not satisfy the conditions (M) of the present invention, and only seed crystals that are vertically adjacent to each other on the plane of paper may satisfy the conditions (M) of the present invention. In the case of FIG. 16A or 16B, the seed crystals that are vertically adjacent to each other on the plane of paper satisfy the conditions (M) and (C). Thus, generation of defects at sites at which crystals are bound (associated) can be prevented or reduced.

In the case of a-plane seed crystal, in order for the m-planes of the grown crystals not to face (coincide with) each other, for example, plural striped seed crystals that are parallel with the m-axis (the horizontal direction on the plane of paper in FIGS. 16A and 16B) may be arranged such that the c-axes of the seed crystals almost coincide with each other. In this case, the c-axes are regarded as being placed at any positions perpendicular to the longitudinal direction of the stripe.

Figure 17A:
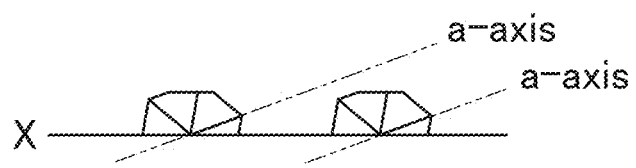
FIGS. 17A and 17B are drawings showing examples of an arrangement of seed crystals in which a-axes or c-axes are tilted relative to a crystal growth plane.
Figure 17B:
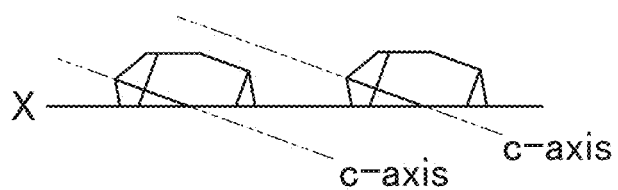

In the present invention, the crystal growth plane is not limited to a c-, m-, or a-plane and may be any plane tilted relative to any of these planes. Examples of the plane tilted relative to any of these planes are shown in FIGS. 17A and 17B. In FIGS. 17A and 17B, the straight line X represents a plane parallel with the crystal growth planes. In FIG. 17A, a-axes are slightly tilted relative to the crystal growth planes. In FIG. 17B, the c-axes are slightly tilted relative to the crystal growth planes.

Figure 18A:
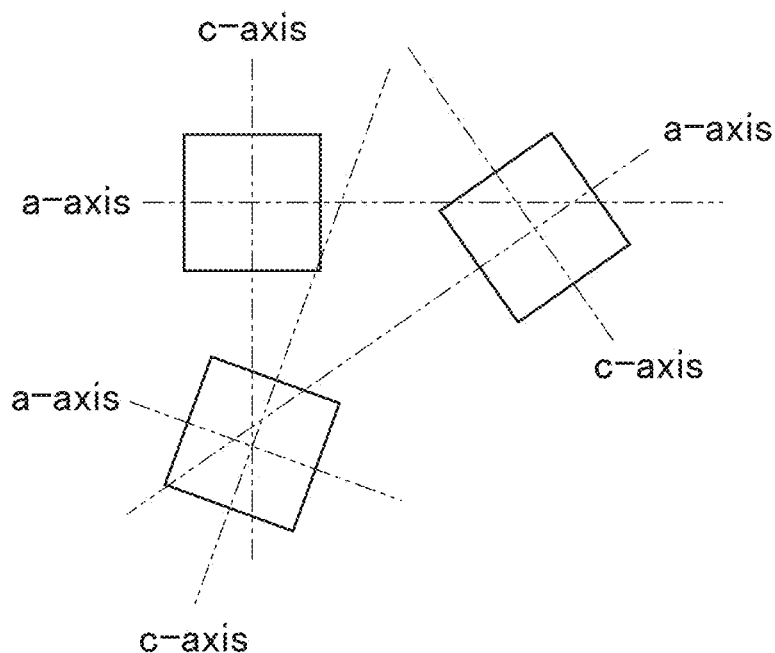
FIGS. 18A to 18C are drawings showing examples of an arrangement of seed crystals that are adjacent to each other in which a-axes or c-axes are tilted relative to one another.
Figure 18B:
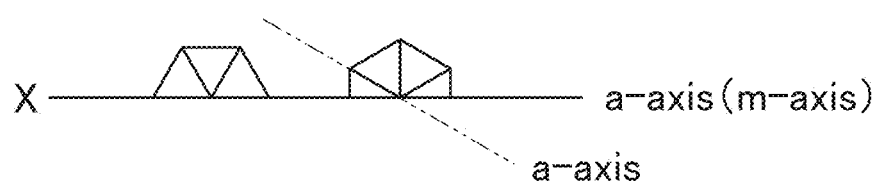
Figure 18C:
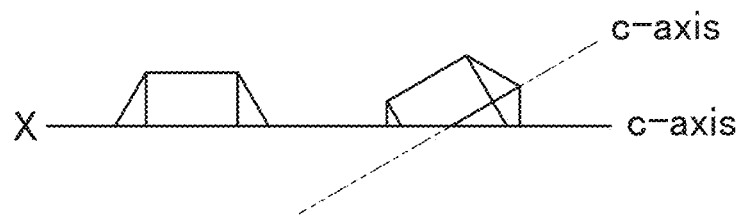

Each of FIGS. 18A to 18C shows an example in which a-axes, m-axes, or c-axes of the seed crystals that are adjacent to each other are tilted relative to each other. FIG. 18A shows the state where the a-axes or c-axes of the m-plane seed crystals that are adjacent to each other are tilted relative to each other, and the m-planes (crystal growth planes) are parallel with the plane of paper. Each of FIGS. 18B and 18C is a drawing schematically showing an example in which the crystal growth planes of the seed crystals that are adjacent to each other are different from each other. In each of FIGS. 18B and 18C, the straight line X represents a plane parallel with the crystal growth planes. In FIG. 18B, the crystal growth planes are parallel with the a-axis of the left seed crystal and are parallel with the m-axis of the right seed crystal. In FIG. 18C, the crystal growth plane is parallel with the c-axis of the left crystal and is tilted relative to the c-axis of the right crystal.

In the present invention, the case where all of the a-axes, the c-axes, or the m-axes of the seed crystals that are adjacent to each other are aligned in almost the same direction (i.e., parallel with each other, FIGS. 13A, 15A to 15C, 16A to 16C, and the like) is preferable rather than the case where the a-axes, the c-axes, or the m-axes of the seed crystals that are adjacent to each other are tilted relative to each other (FIGS. 13D and 18A to 18C). The expression "being aligned in almost the same direction (being parallel with each other)" shall be understood as follows. That is, the angle formed between the a-axes, the c-axes, or the m-axes is, for example, 5° or less, preferably 1° or less, more preferably 0.03° or less, particularly preferably 0.005° or less, and ideally 0°. It is to be noted that even when all of the axes are aligned in almost the same direction, for example, if the conditions (M) of the present invention are not satisfied as in FIG. 13C, the conditions of the present invention are not satisfied. That is, in the Group III nitride crystal production method of the present invention, preferably, the conditions (M) are satisfied, and all of the a-axes, the c-axes, or the m-axes of seed crystals that are adjacent to each other are aligned in almost the same direction.

As to the conditions (A), FIGS. 13A, 13B, 13E, 14A, and 14B are described above as examples of satisfying the conditions (A) of the Group III nitride crystal production method of the present invention, and FIGS. 13C and 13D are described above as examples of not satisfying the conditions (A). However, these drawings are merely schematic drawings for the sake of convenience of the description. Thus, the angle formed between a-axes, the distance between the a-axes, and the like under the conditions (A) of the present invention are not at all limited by these drawings. Similarly, the angles, the distances, and the like under the conditions (M) and (C) also are not at all limited by the drawings.

<1-1-3. Composition and the Like of Group III Nitride Crystal>

In the first Group III nitride crystal production process, the preliminarily provided Group III nitride (seed crystal) is not particularly limited and can be, for example, Group III nitride represented by $Al_xGa_yIn_{1-x-y}N$ ($0 \le x \le 1$, $0 \le y \le 1$, $x+y \le 1$). Examples of the preliminarily provided Group III nitride (seed crystal) include AlGaN, InGaN, InAlGaN, and GaN, each represented by the above-described composition, and GaN is particularly preferable.

In the crystal growth step, the Group III element to be caused to react with the nitrogen is, for example, at least one selected from the group consisting of gallium (Ga), indium (In), and aluminum (Al), and is particularly preferably Ga.

The Group III nitride crystal generated and grown in the crystal growth step is not particularly limited and can be, for example, a Group III nitride crystal represented by $Al_xGa_yIn_{1-x-y}N$ ($0 \le x \le 1$, $0 \le y \le 1$, $x+y \le 1$). Examples thereof include AlGaN, InGaN, InAlGaN, and GaN, each represented by the above-described composition, and GaN is particularly preferable. The composition of each Group III nitride crystal generated and grown in the crystal growth step may be identical to or different from that of the seed crystal. Preferably, the composition of each Group III nitride crystal is identical to that of the seed crystal from the viewpoint of obtaining a Group III nitride crystal of high quality with few defects.

More specifically, examples of the Group III nitride crystal production method by the first Group III nitride crystal production process include the following first liquid phase epitaxy and the following second liquid phase epitaxy.

<1-1-4. First Liquid Phase Epitaxy>

In the seed crystal selection step of the first liquid phase epitaxy of the first Group III nitride crystal production process, the preliminarily provided Group III nitride includes a plurality of Group III nitride crystals arranged on a substrate, and the Group III nitride crystals are selected as the seed crystals.

As described above, in the first Group III nitride crystal production process, crystal growth planes are not particularly limited.

Figure 3:
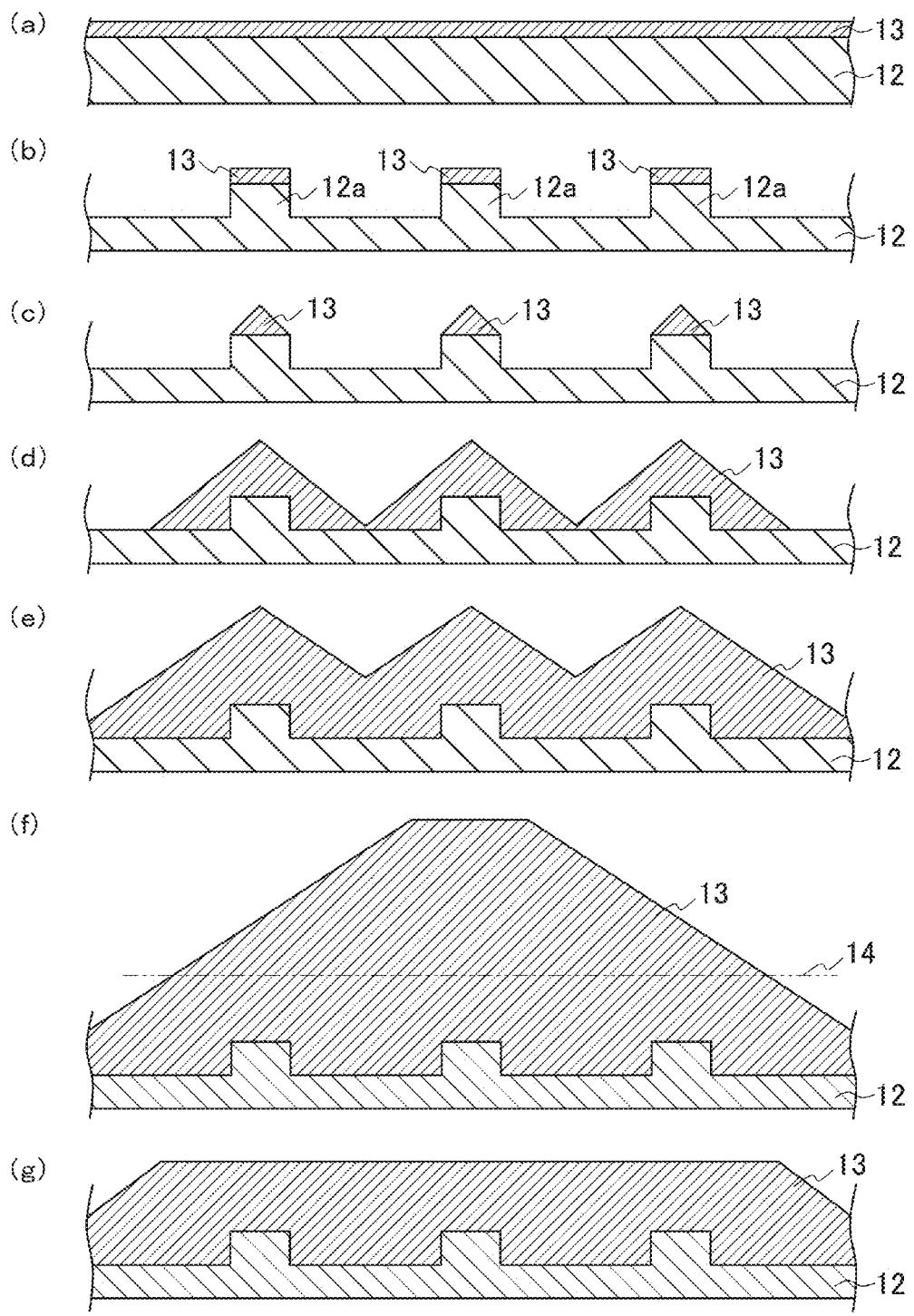
FIG. 3 shows cross sectional views showing an example of the first liquid phase epitaxy (a production method that uses plural Group III nitride crystals formed on a substrate) which is an example of the first Group III nitride crystal production process according to the present invention.

(a) to (g) of FIG. 3 are cross sectional views showing an example of the first liquid phase epitaxy of the present invention. First, as shown in (a) of FIG. 3, a Group III nitride crystal layer 13 that is to be seed crystal is formed on a substrate 12. Although the method for this is not particularly limited, the method may be, for example, vapor phase epitaxy such as MOCVD. The thickness of the Group III nitride crystal layer 13 also is not particularly limited and is, for example, from 1 to 100 µm, preferably from 2 to 100 µm, and more preferably from 5 to 50 µm. The material for the substrate 12 also is not particularly limited and may contain at least one selected from the group consisting of $Al_xGa_{1-x}N$ ($0 < x \le 1$), an oxide of the $Al_xGa_{1-x}N$ ($0 < x \le 1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten. The substrate 12 is particularly preferably a sapphire substrate from the viewpoint of the cost, the convenience, and the like.

Then, as shown in (b) of FIG. 3, upper parts of the substrate 12 and the Group III nitride crystal layer 13 on the upper parts are removed by etching or the like to cause the projections 12a of the substrate 12 and Group III nitride crystal layers (seed crystals) 13 arranged thereon to remain. These seed crystals are grown and bound together as shown in (c) to (f) of FIG. 3. The crystal can be used by cutting it at a plane parallel with the c-plane as shown in (g) of FIG. 3 (shown by a dashed line (cut plane) 14 in (f) of FIG. 3). It is to be noted that although the projections 12a shown in (b) of FIG. 3 each have a large thickness, the thickness of the projection 12a may be very small or zero (i.e., by removing only the Group III nitride crystal layer 13 without removing the upper parts of the substrate 12, the projections 12a may not be present).

The Group III nitride crystal production method of the present invention may further include a crystal re-growth step of further growing the produced Group III nitride crystal. Specifically, for example, in the crystal re-growth step, the produced Group III nitride crystal may be cut so that any plane (e.g., c-, m-, or a-plane or another nonpolar plane) is exposed, and the Group III nitride crystal may be further grown using the plane as a crystal growth plane. Thus, a Group III nitride crystal having a large area of any plane and a large thickness can be produced. Specifically, for example, the cut plane (c-plane) 14 of the Group III nitride crystal shown in (g) of FIG. 3 as a crystal growth plane may be further grown to increase the thickness thereof. This step corresponds to the above described "crystal re-growth step".

Although the seed crystals 13 are arranged on the projections 12a of the substrate in FIG. 3, the first liquid phase epitaxy of the present invention is not limited thereto. For example, the seed crystals may be arranged on a flat even substrate, or portions in which the seed crystals are arranged may be recesses as substitute for the projections. It is considered that the produced crystal tends not to be directly in contact with the substrate other than the projections by forming the seed crystals on the projections of the substrate as shown in FIG. 3. In other words, although it is not shown in FIG. 3, it is considered that there are microscopic gaps (space) between the substrate 12 and the grown crystals 13 other than the projections. Thus, for example, it is possible to reduce or prevent warping, a distortion, cracking, and the like of the crystal, caused by the difference in thermal expansion coefficient between the substrate and the crystal as described above. This description however is a mere example of a possible mechanism and does not limit the present invention at all.

Figure 4:
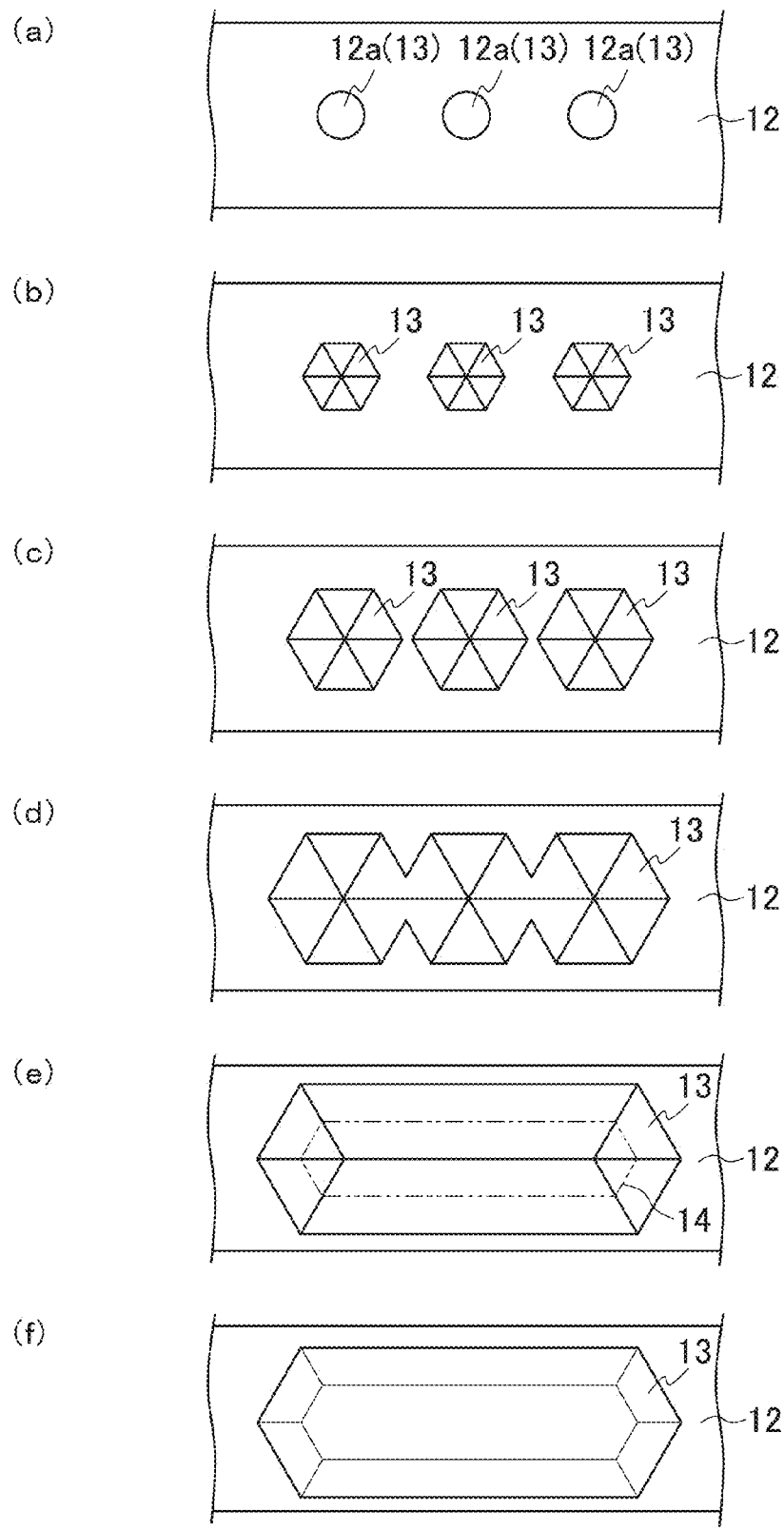
FIG. 4 shows plan views showing the production method shown in FIG. 3.

The plan views of (a) to (f) of FIG. 4 are drawings viewed from above the steps of (b) to (g) of FIG. 3. In (a) to (f) of FIG. 4, the identical parts to those shown in (b) to (g) of FIG. 3 are denoted by the identical reference numerals. As shown in FIG. 4, the projections 12a of the substrate are dot-shaped projections, and Group III nitride crystals generated from seed crystals arranged thereon are equilateral hexagons. These Group III nitride crystals are bound together by the growth as shown in (d) to (e) of FIG. 4. As shown in (a) of FIG. 4, three dots (seed crystal location positions) 12a are aligned on a straight line. Thus, after binding of the three crystals, a long and thin hexagonal crystal as shown in (e) of FIG. 4 is obtained.

The sizes of the dots of the projections 12a (i.e., the sizes of dots which are the seed crystals), the arrangement relationship between a-axes of the seed crystals that are adjacent to each other, the distance between the centers of the dots, and the like are the same as those described in "1-1-2. Arrangement relationship, shape, size, and the like of seed crystal". The a-axis direction of the Group III nitride crystal layer 13 can be checked by an X-ray diffraction method (XRD), for example. Thus, on the basis of the direction, the arrangement of the projections 12a can be determined. For example, in the case where seed crystals are formed by removing parts of the Group III nitride crystal layer 13 as shown in (a) and (b) of FIG. 3, the seed crystals that are formed after removal may be arranged so as to align in the a-axis direction of the Group III nitride crystal layer 13 in (a) of FIG. 3.

Figure 5:
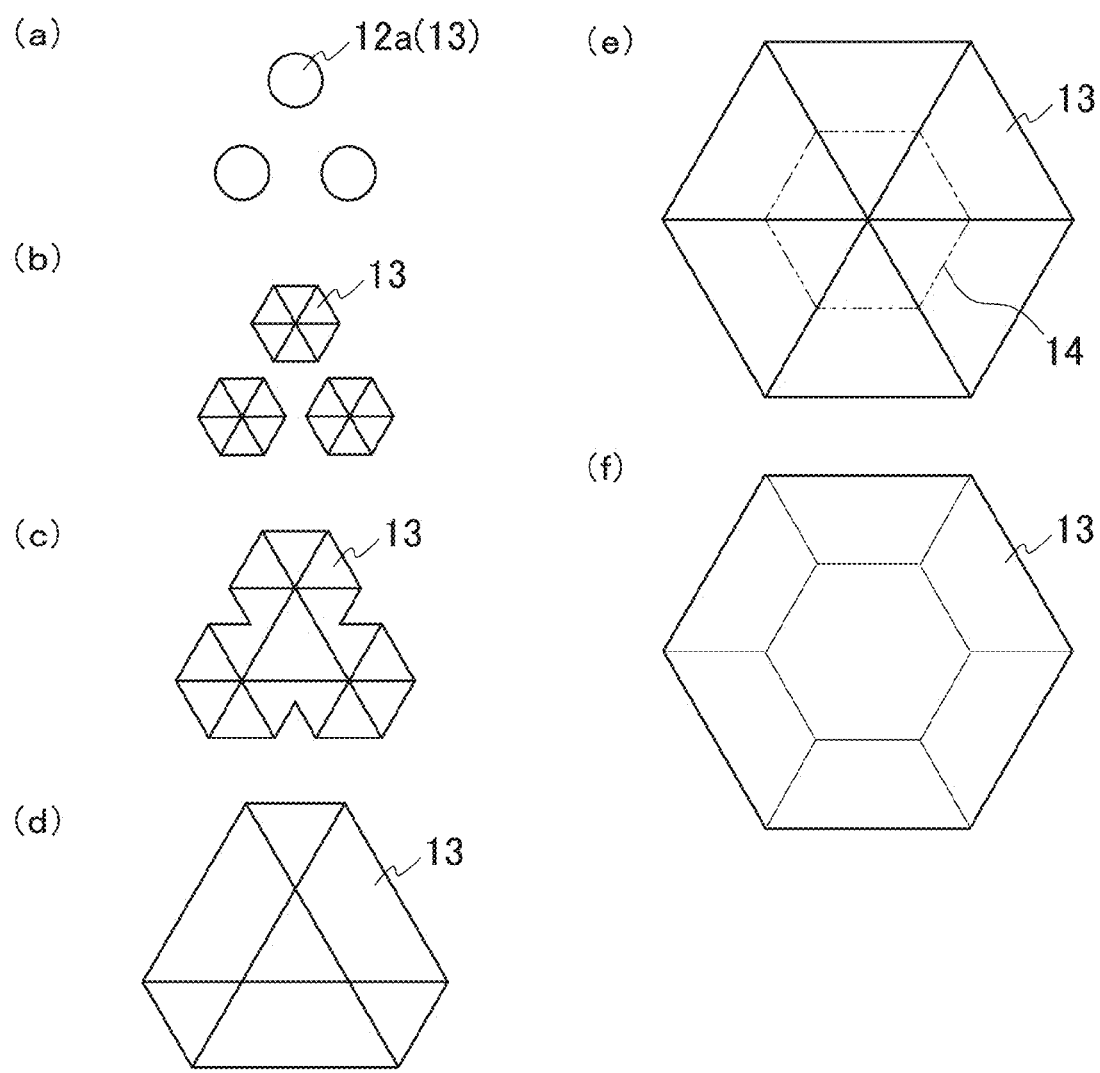
FIG. 5 shows plan views showing another example of the first liquid phase epitaxy of the present invention.
Figure 6:
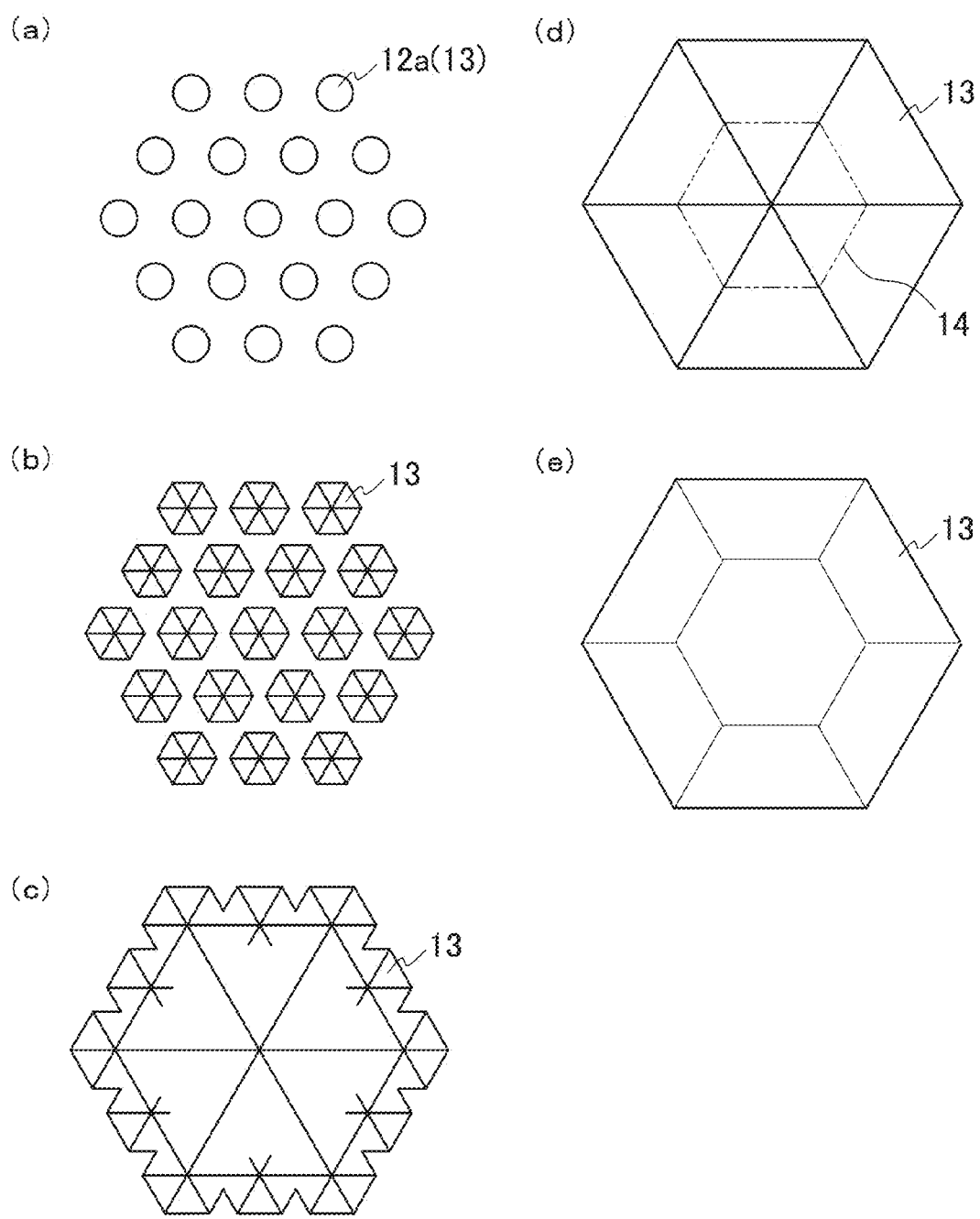
FIG. 6 shows plan views showing still another example of the first liquid phase epitaxy of the present invention.

The arrangement of the seed crystal 13 (projection 12a) is not limited by the arrangement shown in FIGS. 3 and 4. For example, as shown in plan views of (a) to (f) of FIG. 5, three dots may be arranged on the apexes of an equilateral triangle, or many dots further may be arranged as shown in (a) to (e) of FIG. 6 by repeating the pattern. By increasing the number of dots as described above, a Group III nitride crystal in a larger size can be produced. In FIGS. 5 and 6, identical parts to those shown in FIGS. 3 and 4 are indicated by identical reference numerals.

In the first Group III nitride crystal production process according to the present invention, the arrangement relationship, shape, size, and the like of seed crystal are not particularly limited. As shown in FIG. 13C, the arrangement of not facing (coinciding) the m-planes (sides of an equilateral hexagon) of Group III nitride crystals 13 is preferable because defects are less prone to occur at sites at which the crystals are associated when the crystals are associated (bound) by crystal growth. This is also as described in the section "1-1-2. Arrangement relationship, shape, size, and the like of seed crystal".

<1-1-5. Second Liquid Phase Epitaxy>

Next, in the seed crystal selection step of the second liquid phase epitaxy of the first Group III nitride crystal production process, the preliminarily provided Group III nitride is a Group III nitride crystal layer, a mask having a plurality of through holes is arranged on the Group III nitride crystal layer, and parts of the plane of the Group III nitride crystal layer exposed from the through holes are selected as the seed crystals.

In the second liquid phase epitaxy of the present invention, the crystal growth plane is not particularly limited as in the first liquid phase epitaxy. For example, the Group III nitride crystal layer may be a Group III nitride crystal layer having a c-plane, the mask may be arranged on the c-plane, and parts of the c-plane exposed from the through holes may be selected as the seed crystals (crystal growth planes of the seed crystals). Alternatively, the Group III nitride crystal layer may be a Group III nitride crystal layer having an m-plane, the mask may be arranged on the m-plane, and parts of the m-plane exposed from the through holes may be selected as the seed crystals (crystal growth planes of the seed crystals). Although the case where the crystal growth plane is the c-plane is mainly described below, the Group III nitride crystal may be produced in the same manner except that the crystal growth plane is replaced by another plane such as the m-plane.

Figure 7:
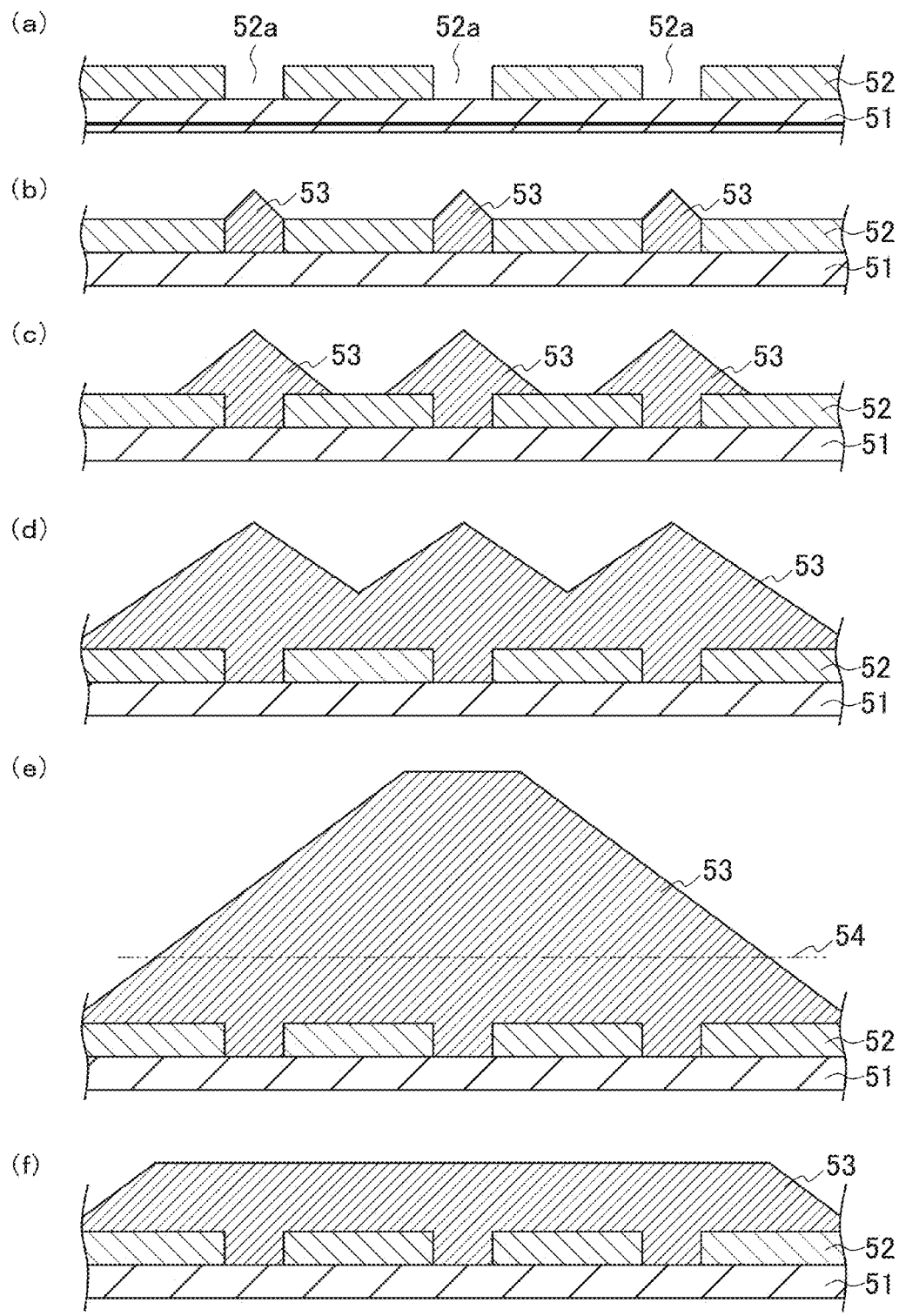
FIG. 7 shows cross sectional views showing an example of the second liquid phase epitaxy (a Group III nitride crystal production method that uses units in each of which a mask having plural dot-shaped through holes is formed on a Group III nitride crystal layer) which is an example of the first Group III nitride crystal production process according to the present invention.

(a) to (f) of FIG. 7 schematically show, by way of example, steps of producing a Group III nitride crystal by the second liquid phase epitaxy of the present invention. That is, first, as shown in (a) of FIG. 7, a mask 52 having through holes 52a is arranged on the c-plane of a Group III nitride crystal layer 51 which is a hexagonal crystal. Parts of the c-plane of the Group III nitride crystal layer 51 exposed from these through holes 52a become seed crystals. That is, it can be said that this step of arranging a mask 52 is a seed crystal selection step of selecting seed crystals for generation and growth of Group III nitride crystals. The Group III nitride crystal layer 51 is not particularly limited and may be, for example, a Group III nitride crystal substrate or the like. From the viewpoint of the costs and the convenience, the Group III nitride crystal layer 51 is preferably a Group III nitride crystal formed on another substrate (not shown). From the viewpoint of producing a Group III nitride crystal of high quality with few defects, the Group III nitride crystal layer 51 is preferably a Group III nitride substrate of high quality. The Group III nitride substrate may be, for example, an independent substrate (free-standing substrate) which is not formed on another substrate. It is to be noted that, according to the present invention, even by using a Group III nitride crystal formed on another substrate, a Group III nitride crystal of high quality with few defects can be produced as described above. The thickness of the Group III nitride crystal layer 51 also is not particularly limited and is, for example, from 1 to 100 μm, preferably from 2 to 100 μm, and more preferably from 5 to 50 μm. Another substrate on which a Group III nitride crystal is formed is not particularly limited, and examples thereof include a sapphire substrate and a silicon carbide substrate. The mask 52 may be formed on the c-plane of the Group III nitride crystal layer by deposition, application, or the like. Preferably, the mask 52 having through holes 52a is previously formed and merely placed on the Group III nitride crystal layer 51 because of the convenience. Preferably, the mask 52 does not adhere to the Group III nitride crystal layer 51 for the reason that the mask 52 easily can be reused and the like. The material for the mask 52 also is not particularly limited and is preferably a material that is less likely to react with an alkali metal melt, and examples thereof include a carbon-based material and oxide. The mask may contain at least one selected from the group consisting of $Al_xGa_{1-x}N$ ($0<x\leq1$), an oxide of the $Al_xGa_{1-x}N$ ($0<x\leq1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten. In the present invention, the mask 52 is particularly preferably a sapphire mask from the viewpoint of the cost, the convenience, and the like. The thickness of the mask 52 also is not particularly limited and is, for example, from 0.0005 to 2 mm, preferably from 0.01 to 1 mm, and more preferably from 0.05 to 0.5 mm.

Subsequently, the parts (seed crystals) of the c-plane of the Group III nitride crystal layer 51 exposed from the through holes 52a are brought into contact with an alkali metal melt (contact step). Further, a Group III element and nitrogen are caused to react with each other in a nitrogen-containing atmosphere in the alkali metal melt to generate and grow Group III nitride crystals (crystal growth step). This crystal growth step is shown in (b) to (e) of FIG. 7. As shown in (b) and (c) of FIG. 7, Group III nitride crystals 53 are generated and grown from the surfaces of the seed crystals. By causing the Group III nitride crystals 53 to be further grown and to be bound together as shown in (d) and (e) of FIG. 7, a large Group III nitride seed crystal of high quality with few defects can be produced. This Group III nitride crystal can be used as in (f) of FIG. 7 by cutting it at the plane (indicated by the dashed line 54 in (e) of FIG. 7) parallel with the c-plane, for example. Although (f) of FIG. 7 shows a lower part of the Group III nitride crystal after the cutting, an upper part also can be used. By cutting (dicing) as described above, the Group III nitride crystal can be used easily as a semiconductor substrate for semiconductor apparatus or the like, for example. Moreover, the cut plane (c-plane) of the Group III nitride crystal shown in (f) of FIG. 7 as a crystal growth plane may be further grown to increase the thickness thereof. This step corresponds to the above described "crystal re-growth step".

The shape, size, arrangement, distance (distance between the centers of seed crystals that are adjacent to each other), and the like of the through hole 52a of the mask may be the same as those of the seed crystal in the first liquid phase epitaxy of the present invention, for example. For example, in FIGS. 4 to 6, the second liquid phase epitaxy of the present invention can be schematically shown by substituting the mask 52 for the substrate 12, the through holes 52a for the projections 12a, and the Group III nitride crystal 53 for the Group III nitride crystal 13. In the same manse as the first liquid phase epitaxy, the a-axis direction of the Group III nitride crystal layer 51 can be checked by an X-ray diffraction method (XRD), for example. Thus, on the basis of the direction, the arrangement of the through holes 52a can be determined. For example, in the case of FIG. 7, seed crystals exposed from the through holes 52a are plural parts of the Group III nitride crystal layer 51 of one piece. Thus, for example, the through holes 52a may be arranged so as to align in the a-axis direction of the Group III nitride crystal layer 51.

Figure 22:
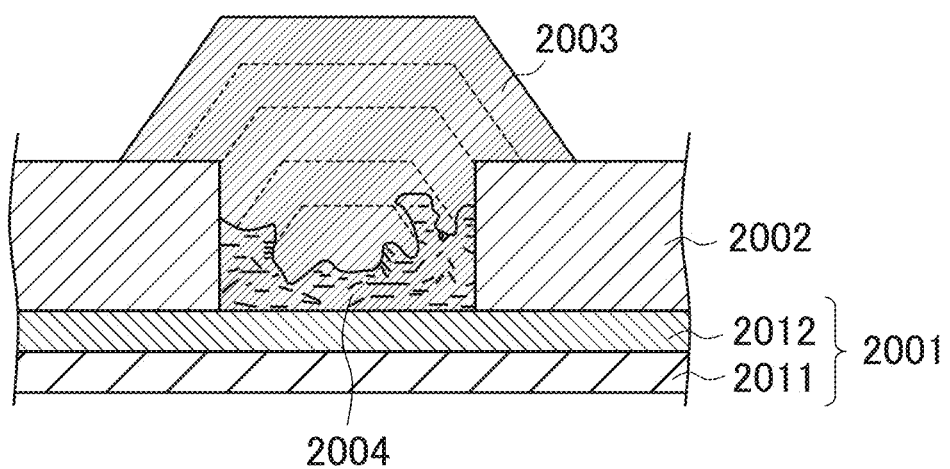
FIG. 22 is a cross sectional view schematically showing an example of a mechanism of crystal growth from a through hole in a mask.

In the first liquid phase epitaxy of the present invention, as described above, a Group III nitride crystal of high quality with few defects can be produced by using small Group III nitride seed crystals. In the second liquid phase epitaxy of the present invention, it is also possible to produce a Group III nitride crystal of higher quality with fewer defects by using the mask having through holes. Although the reason for this is unknown, it is considered that, for example, defects such as a dislocation of crystal and the like are extended laterally and are not extended vertically when crystals are laterally grown out from the through holes in the course of growing the crystals. FIG. 22 shows an example of this. In FIG. 22, a seed substrate obtained by forming a Group III nitride (e.g., GaN) crystal layer 2012 on a substrate 2011 is indicated by the numeral 2001. A mask (e.g., a sapphire mask) formed on the Group III nitride crystal layer 2012 is indicated by the numeral 2002. As shown in FIG. 22, a part of the surface of the Group III nitride crystal 2012 is exposed from a small through hole formed in the mask 2002, and a Group III nitride crystal 2003 is grown using the exposed small part as a seed crystal. Thus, it is considered that crystal defects 2004 are terminated in the through holes of the mask 2002 and that the crystal defects tend not to be propagated inside the grown Group III nitride crystal 2003. FIG. 22 however schematically shows a mere example of a possible mechanism, and the present invention is not at all limited by the drawing and the description thereof.

Figure 9A:
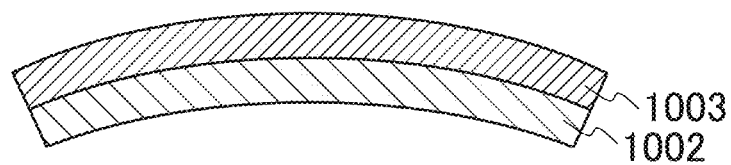
FIG. 9A is a cross sectional view showing, by way of example, a distortion of a Group III nitride crystal grown on a substrate.

According to a common method for producing a Group III nitride crystal, for example, in the case where there is a difference in thermal expansion coefficient between a substrate and a crystal, there is a possibility of causing warping, a distortion, cracking, and the like in the crystal by warping of the substrate while producing or using the crystal. An example of this is schematically shown in the cross sectional view of FIG. 9A. As shown in FIG. 9A, a GaN crystal 1003 is formed on a sapphire substrate 1002. The GaN crystal 1003 is warped together with the sapphire substrate 1002 by the difference in thermal expansion coefficient between them. By the warping, a distortion is caused in the GaN crystal 1003, and there is a possibility of causing cracking in some cases. However, it is considered that according to the first liquid phase epitaxy of the present invention, such a problem can be prevented or reduced.

That is, according to the second liquid phase epitaxy of the present invention, the produced Group III nitride crystal and the Group III nitride crystal layer (seed crystal) are not directly in contact with each other at points other than the through holes and are separated by the mask. Therefore, even if warping is caused in the independent substrate and the like that is present in or below the Group III nitride crystal layer (seed crystal) that is below the mask, there is less possibility of causing warping, a distortion, cracking, and the like in the Group III nitride crystals formed on the mask. Moreover, according to the second liquid phase epitaxy of the present invention, the seed crystals are not formed on the mask, and thus, the Group III nitride crystals grown from the seed crystals and the mask are not directly in contact with each other. Therefore, even in the case where there is a difference in thermal expansion coefficient between the mask and the Group III nitride crystals (for example, the mask is sapphire, and the Group III nitride crystals are GaN), there is less possibility of causing warping, a distortion, cracking, and the like in the Group III nitride crystals due to the warping of the mask.

On the other hand, it is considered that the first liquid phase epitaxy of the present invention is superior in crystal growth efficiency by arranging seed crystals directly on a substrate without using a mask and through holes. For example, the first liquid phase epitaxy of the present invention or the second liquid phase epitaxy of the present invention may be used as desired according to the purpose, for example.

<1-1-6. Contact Step and Crystal Growth Step and Apparatuses Used Therein>

As described above, the first Group III nitride crystal production process of the production method according to the present invention includes: a seed crystal selection step of selecting a plurality of parts of a preliminarily provided Group III nitride as seed crystals for generation and growth of Group III nitride crystals; a contact step of bringing the surfaces of the seed crystals into contact with an alkali metal melt; and a Group III nitride crystal liquid phase growth step of causing a Group III element and nitrogen to react with each other in a nitrogen-containing atmosphere in the alkali metal melt to generate and grow Group III nitride crystals. In the Group III nitride crystal liquid phase growth step, the Group III nitride crystals are bound together by growth of the Group III nitride crystals grown from the seed crystals to produce the first Group III nitride crystal. Specifically, the first Group III nitride crystal production process is as described in the sections from "1-1. First Group III nitride crystal production process (liquid phase epitaxy)" to "1-1-5. Second liquid phase epitaxy", for example. Other than this, the first Group III nitride crystal production process is not particularly limited and can be performed in the same manner as in a method for producing a Group III nitride crystal by common liquid phase epitaxy (LPE) using an alkali metal melt, for example, and an example of this is described below.

For example, there is a sodium flux method (Naflux method) as a method for producing gallium nitride (GaN) used in a semiconductor substrate of LED or a power device. In this method, for example, first, a seed crystal (e.g., a GaN thin film formed on a sapphire substrate) is set in a crucible. In addition to the seed crystal, sodium (Na) and gallium (Ga) at an appropriate ratio are stored in the crucible. Then, the sodium and the gallium in the crucible were melted under high-temperature (e.g., 800° C. to 1000° C.) and high-pressure (e.g., several tens of atmospheres) atmosphere to cause nitrogen gas ($N_2$) to be melted in the melt thus obtained. Thus, the GaN seed crystal in the crucible can be grown, and an intended GaN crystal can be produced.

In the first Group III nitride crystal production process, for example, the seed crystal set in the crucible may be provided as described in the sections from "1-1. First Group III nitride crystal production process (liquid phase epitaxy)" to "1-1-5. Second liquid phase epitaxy" according to the seed crystal selection step, for example. The subsequent steps may be performed by the same method as the common sodium flux method or the same method with appropriate changes, for example. For example, any of the other Group III elements may be used as a substitute for Ga. More specifically, for example, the Group III nitride crystal is as described in the section "1-1-3. Composition of Group III nitride crystal and the like".

In the first Group III nitride crystal production process, the crystal growth step is, as described above, performed in a nitrogen-containing atmosphere. In the "nitrogen-containing atmosphere", the form of nitrogen is not particularly limited, and examples thereof include gas, a nitrogen molecule, a nitrogen compound, and the like. The "nitrogen-containing atmosphere" is preferably a nitrogen-containing gas atmosphere because the nitrogen-containing gas melts in the flux and becomes a material for growing a Group III nitride crystal. As the nitrogen-containing gas, any of the other nitrogen-containing gases such as an ammonia gas and the like may be used in addition to or as a substitute for the above described nitrogen gas ($N_2$). In the case of using a mixed gas of a nitrogen gas and an ammonia gas, the ratio of the nitrogen gas and the ammonium gas to be mixed may be any ratio. Using an ammonia gas is particularly preferable because the reaction pressure can be reduced.

As the alkali metal melt (flux), any of the other alkali metals such as lithium and the like may be used in addition to or as a substitute for the sodium. More specifically, the alkali metal melt contains at least one selected from the group consisting of lithium (Li), sodium (Na), potassium (K), rubidium (Rb), cesium (Cs), and francium (Fr) and may be, for example, a mixed flux of Na and Li, or the like. The alkali metal melt is particularly preferably a sodium melt. The alkali metal melt may or may not contain one or more kinds of components other than the alkali metal. The component other than the alkali metal is not particularly limited, and examples thereof include any of the alkali earth metals. Examples of the alkali earth metal include calcium (Ca), magnesium (Mg), strontium (Sr), barium (Ba), and radium (Ra), and among them, Ca and Mg are preferable, and Ca is more preferable. As a component other than the alkali metal, for example, carbon (carbon alone or a carbon compound) may or may not be contained. Preferably, the melt contains carbon alone that generates cyan (CN) or a carbon compound that generates cyan (CN). The carbon may be an organic substance in the form of gas. Examples of such carbon alone or a carbon compound include cyanide, graphite, diamond, fullerene, carbon nanotube, methane, ethane, propane, butane, and benzene. The content of the carbon is not particularly limited and is, for example, in the range from 0.01% to 20% by atom (at.), from 0.05% to 15% by atom (at.), from 0.1% to 10% by atom (at.), from 0.1% to 5% by atom (at.), from 0.25% to 7.5% by atom (at.), from 0.25% to 5% by atom (at.), from 0.5% to 5% by atom (at.), from 0.5% to 2.5% by atom (at.), from 0.5% to 2% by atom (at.), from 0.5% to 1% by atom (at.), from 1% to 5% by atom (at.), or from 1% to 2% by atom (at.) with reference to the total of the melt, the Group III element, and the carbon. Among them, from 0.5% to 5% by atom (at.), from 0.5% to 2.5% by atom (at.), from 0.5% to 2% by atom (at.), from 0.5% to 1% by atom (at.), from 1% to 5% by atom (at.), or from 1% to 2% by atom (at.) is preferable.

The ratio of the alkali metal to be added to the Group III element is, for example, from 0.1% to 99.9% by mol, preferably from 1% to 99% by mol, and more preferably from 5% to 98% by mol. The molar ratio in the case of using a mixed flux of an alkali metal and an alkali earth metal is, for example, the alkali metal:the alkali earth metal=from 99.99 to 0.01:from 0.01 to 99.99, preferably from 99.9 to 0.05:from 0.1 to 99.95, and more preferably from 99.5 to 1:from 0.5 to 99. A high purity of the melt is preferable. For example, the purity of Na is preferably 99.95% or more. As a flux component (e.g., Na) of high purity, a commercially available product of high purity may be used, or a substance obtained by purchasing a commercially available product and increasing the purity thereof by a method such as distillation may be used.

The reaction temperature and the reaction pressure of the Group III element and the nitrogen-containing gas are not limited to the above-described numerals and can be set as appropriate. Although an appropriate reaction temperature and an appropriate reaction pressure vary depending on the component of the melt (flux), the component of atmosphere gas, and the pressures thereof, the reaction temperature and the reaction pressure are, for example, a temperature from 100° C. to 1500° C. and a pressure from 100 Pa to 20 MPa, preferably a temperature from 300° C. to 1200° C. and a pressure from 0.01 MPa to 20 MPa, more preferably a temperature from 500° C. to 1100° C. and a pressure from 0.1 MPa to 10 MPa, and yet more preferably a temperature from 700° C. to 1100° C. and a pressure from 0.1 MPa to 10 MPa. The reaction time, i.e., the time for growing a crystal, is not particularly limited and can be set as appropriate so as to grow the crystal to an appropriate size and is, for example, from 1 to 1000 hr, preferably from 5 to 600 hr, and more preferably from 10 to 400 hr.

In the first Group III nitride crystal production process, there is a possibility of melting the seed crystals before the concentration of nitrogen is increased depending on the flux in some cases. In order to prevent this, nitride may be caused to be present in the flux at least during the early stage of the reaction. Examples of the nitride include $Ca_3N_2$, $Li_3N$, $NaN_3$, BN, $Si_3N_4$, and InN, and these nitrides may be used alone or two or more of them may be used in combination. The proportion of the nitride in the flux is, for example, from 0.0001% to 99% by mol, preferably from 0.001% to 50% by mol, and more preferably from 0.005% to 10% by mol.

In the first Group III nitride crystal production process, an impurity may be caused to be present in the mixed flux. By causing an impurity to be present in the mixed flux, an impurity-containing GaN crystal can be produced. Examples of the impurity include silicon (Si), alumina ($Al_2O_3$), indium (In), aluminum (Al), indium nitride (InN), silicon oxide ($SiO_2$), indium oxide ($In_2O_3$), zinc (Zn), magnesium (Mg), zinc oxide (ZnO), magnesium oxide (MgO), and germanium (Ge).

The first Group III nitride crystal production process may further include a step of stirring the melt. The stage of performing the step of stirring the melt is not particularly limited and can be performed in, for example, at least one of the stage before the crystal growth step, the stage at the same time with the crystal growth step, and the stage after the crystal growth step. More specifically, for example, the step of stirring the melt may be performed before the crystal growth step, at the same time with the crystal growth step, or at both timings.

An apparatus used in the first Group III nitride crystal production process is not particularly limited and may be the same as an apparatus used in common apparatus (LPE apparatus) and is, for example, specifically an LPE apparatus or the like described in Patent Document 3 (Japanese Patent No. 4588340). Such an LPE apparatus is described below with reference to FIGS. 19A to 21. It can be said that such an apparatus corresponds to the "first Group III nitride crystal production unit" of the Group III nitride crystal production apparatus of the present invention.

Figures 19A, 19B:
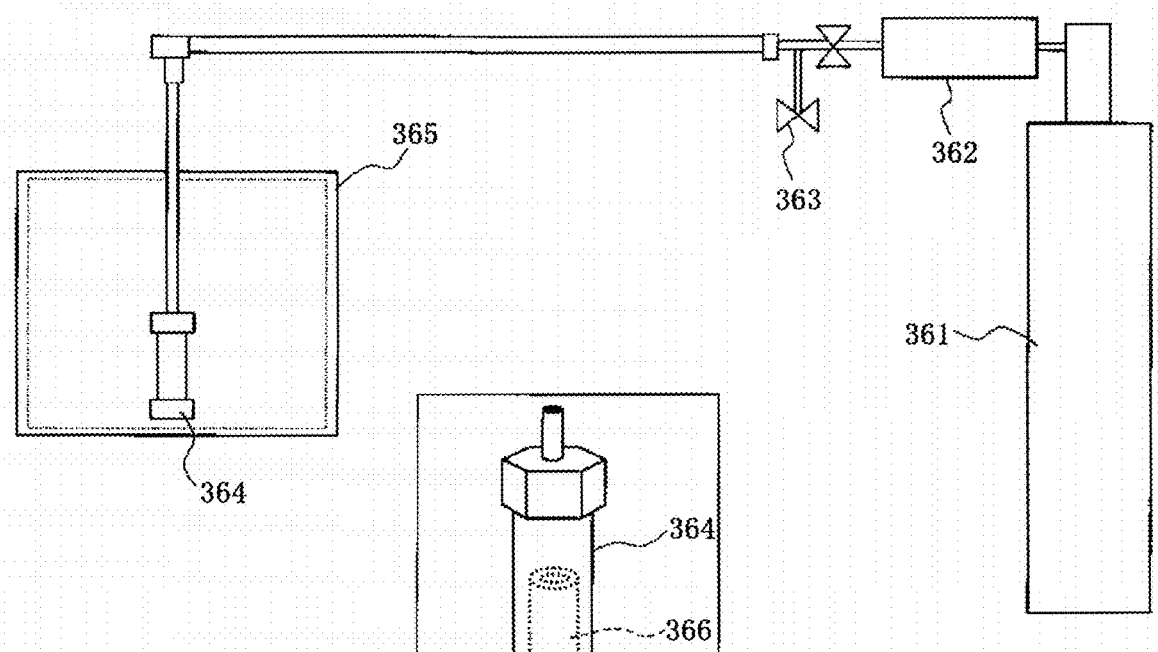
FIGS. 19A and 19B are schematic views showing a configuration of an example of an apparatus for use in the production method according to the present invention.

The schematic views of FIGS. 19A and 19B show an example of a configuration of the LPE apparatus. The LPE apparatus shown in FIG. 19A includes: a raw material gas tank 361 for supplying, as a raw material gas, a nitrogen gas or a mixed gas of an ammonia gas ($NH_3$ gas) and a nitrogen gas; a pressure adjuster 362 for adjusting a pressure of the growth atmosphere; a valve for leakage 363; a stainless container 364 for growing a crystal; and an electric furnace 365. FIG. 19B is an enlarged view of the stainless container 364, and a crucible 366 is set in the stainless container 364. The crucible 366 is composed of boron nitride (BN), alumina ($Al_2O_3$), yttrium aluminum garnet (YAG), or the like. The temperature of the crucible 366 can be controlled in the range from 600° C. to 1000° C. The atmospheric pressure (from 100 atm ($100 \times 1.013 \times 10^5$ Pa) to 150 atm ($150 \times 1.013 \times 10^5$ Pa)) supplied from the raw material gas tank 361 can be controlled at 100 atm ($100 \times 1.013 \times 10^5$ Pa) or less by the pressure adjuster 362.

Figure 20:
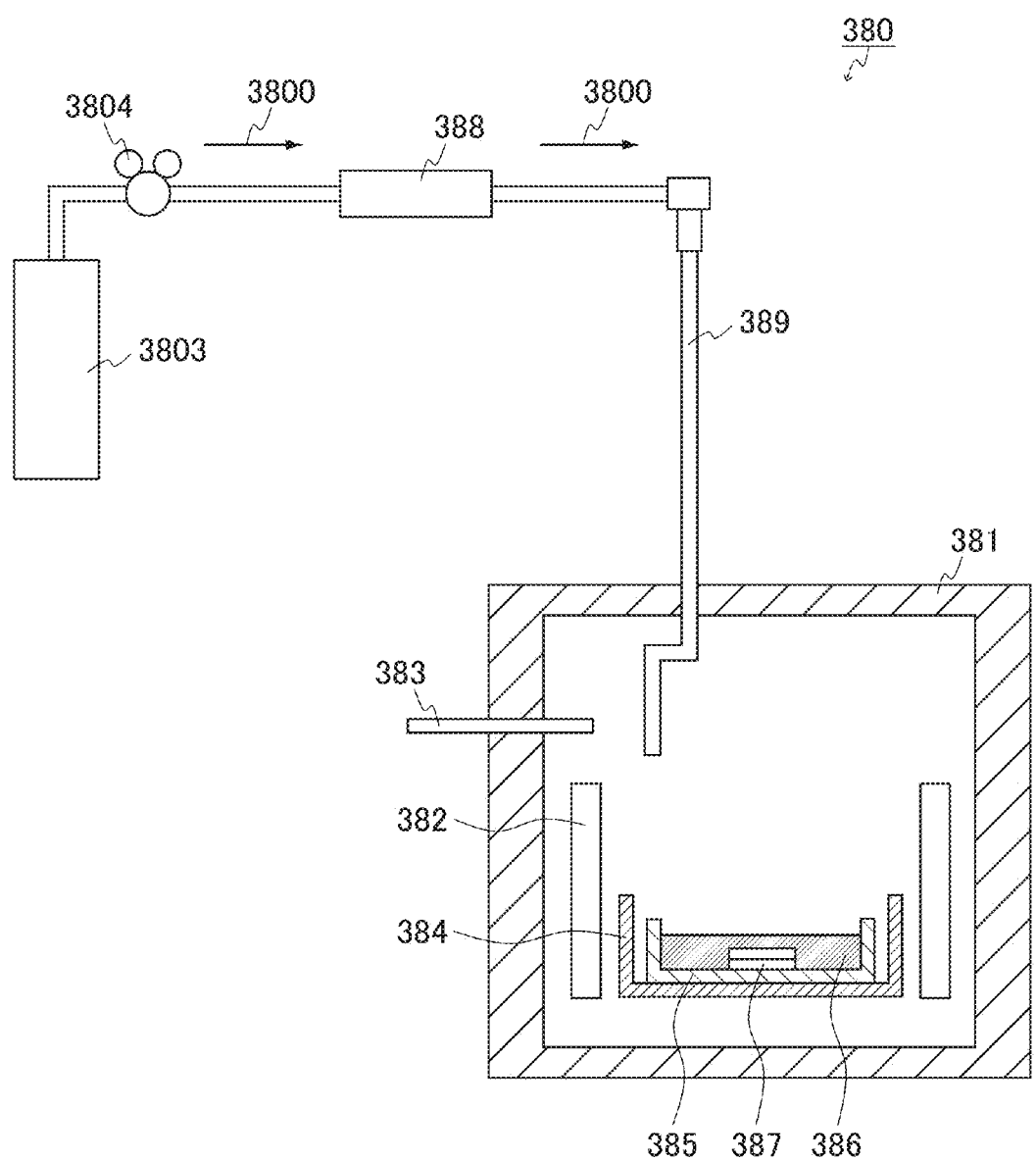
FIG. 20 is a schematic view showing a configuration of another example of an apparatus for use in the production method according to the present invention.

FIG. 20 shows an example of a large LPE apparatus (electric furnace). As shown in FIG. 20, this LPE apparatus 380 includes a growth furnace 381 made of stainless and a raw material gas tank 3803. The growth furnace 381 and the raw material gas tank 3803 are linked with each other through a pipe 389. The pipe 389 is equipped with a pressure adjuster 3804 and a flow rate adjuster 388 between the growth furnace 381 and the raw material gas tank 3803. A heater 382 for heating and a thermocouple 383 are arranged in the growth furnace 381 and configured so as to withstand an atmospheric pressure of 50 atm ($50 \times 1.013 \times 10^5$ Pa). Furthermore, there is a crucible-fixing stage 384 in the growth furnace 381. A crucible 385 made of boron nitride (BN) is fixed in the crucible-fixing stage 384, and a melt 386 and a seed crystal 387 are arranged in the crucible 385. In this state, as a raw material gas, a nitrogen gas or a mixed gas of an ammonia gas ($NH_3$ gas) and a nitrogen gas is supplied from the raw material gas tank 3803 through the pipe 389 in the direction indicated by the arrow (direction in which the atmospheric gas is supplied) 3800 in FIG. 20 to cause a reaction (crystal growth). The raw material gas (atmospheric gas) is transferred to the growth furnace 381 after impurities in a gas purification part (not shown) has removed. Furthermore, the pressure of the raw material gas (atmosphere pressure) is adjusted by the pressure adjuster 3804 and the flow rate adjuster 388.

Figure 21:
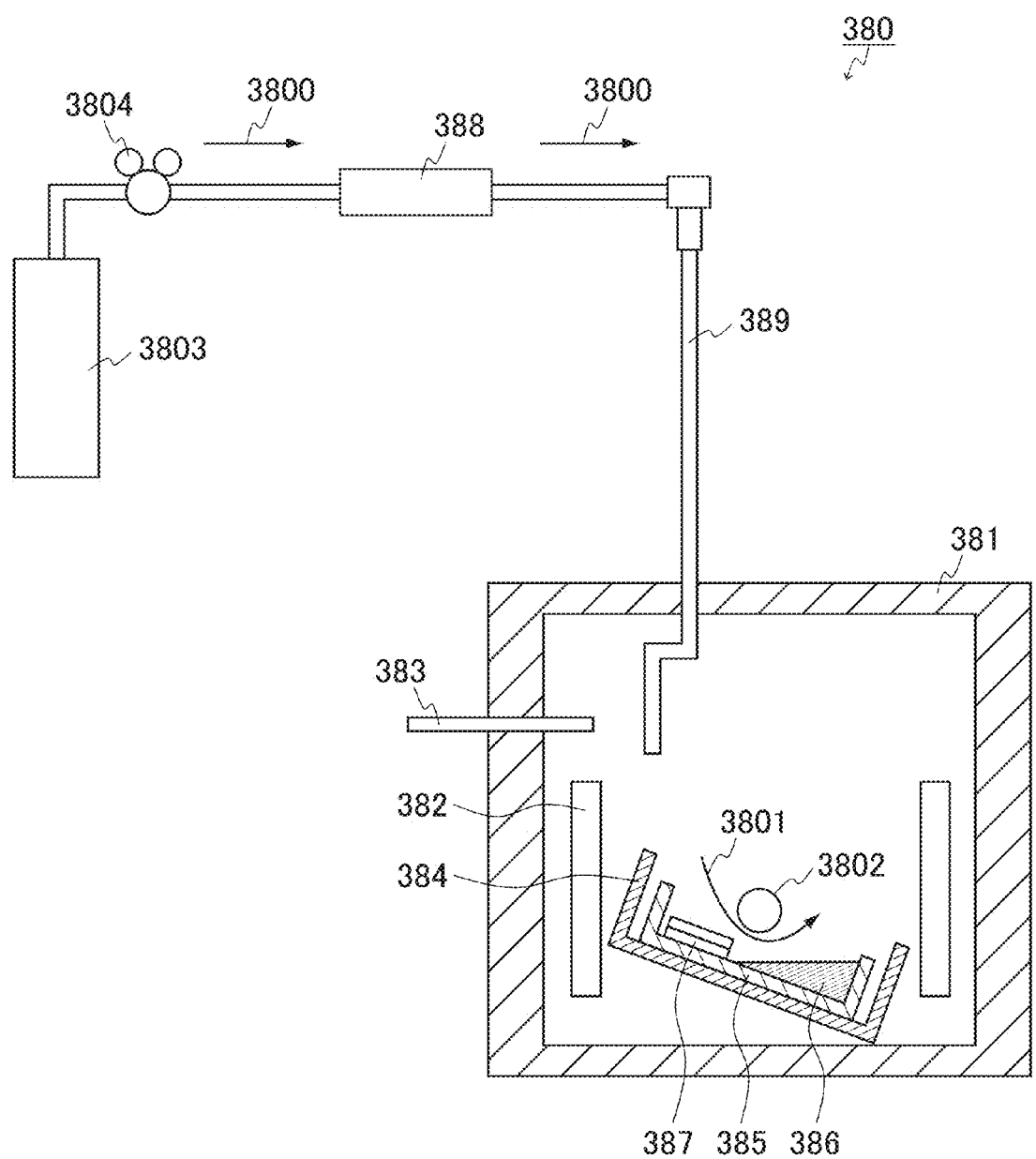
FIG. 21 is a schematic view showing a configuration of still another example of an apparatus for use in the production method according to the present invention.

FIG. 21 shows an example of a swing LPE apparatus. As shown in FIG. 21, this swing LPE apparatus 380 has a mechanism of rotating the crucible-fixing stage 384 around the rotation axis 3802 in the direction indicated by the arrow (rotation direction) 3801 in the growth furnace 381. Except for this, the apparatus shown in FIG. 21 is the same as the apparatus shown in FIG. 20. In the apparatus shown in FIG. 21, a melt 386 in the crucible 385 moves horizontally in response to the rotation of the crucible-fixing stage 384, and thus, the growth direction on the seed crystal is controlled to be constant. In the present example, it is desirable that the seed crystal (GaN seed crystal substrate) 387 is fixed such that the direction in which the melt 386 swings is parallel with a striped mask film on the GaN seed crystal substrate 387. It is to be noted that the LPE apparatus shown in FIG. 21 may be used in the same manner as the apparatus shown in FIG. 20 without using a mechanism of rotating the crucible-fixing stage 384 (i.e., without swinging the melt 386).

<1-1-7. Third Liquid Phase Epitaxy (Method for Producing Larger-Size Group III Nitride Crystal and the Like)>

Plural units each composed of the Group III nitride crystal layer and the mask may be used in the first liquid phase epitaxy of the first Group III nitride crystal production process of the present invention, or plural units each composed of the substrate and the Group III nitride crystal may be used in the second liquid phase epitaxy of the present invention. More specifically, in the seed crystal selection step, the contact step, and the crystal growth step, the units are adjacently arranged in parallel, and in the crystal growth step, the Group III nitride crystals grown from the units that are adjacent to each other are bound together by the growth of the Group III nitride crystals. Hereinafter, this production method is referred to as the third liquid phase epitaxy of the present invention.

Figure 9B:
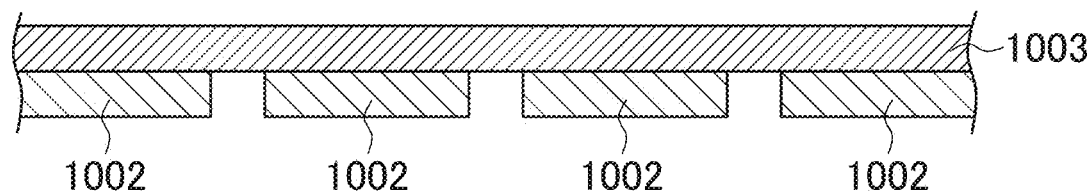
FIGS. 9B to 9D are cross sectional views showing, by way of example, the state where the distortion is eliminated using plural units.

As described with reference to FIG. 9A, in the case where there is a difference in thermal expansion coefficient between the substrate and the crystal or the like, there is a possibility of causing warping, a distortion, cracking and the like in the crystal by warping of the substrate while producing or using the crystal. However, for example, it is considered that, as shown in FIG. 9B, when the sapphire substrate 1002 is separated into pieces, warping, a distortion, cracking, and the like of the GaN crystal 1003 caused by warping of the sapphire substrate 1002 can be prevented or reduced. According to the third liquid phase epitaxy of the present invention, for example, an effect of preventing or reducing warping, a distortion, cracking, and the like of the produced Group III nitride crystal can be obtained. It is possible to divide (crack) the Group III nitride crystal by intentionally causing the substrate or the mask to be warped utilizing the difference in thermal expansion coefficient between the substrate (or the mask) and the Group III nitride crystal and the like consciously without using the third liquid phase epitaxy of the present invention (i.e., without using plural units).

Figure 8:
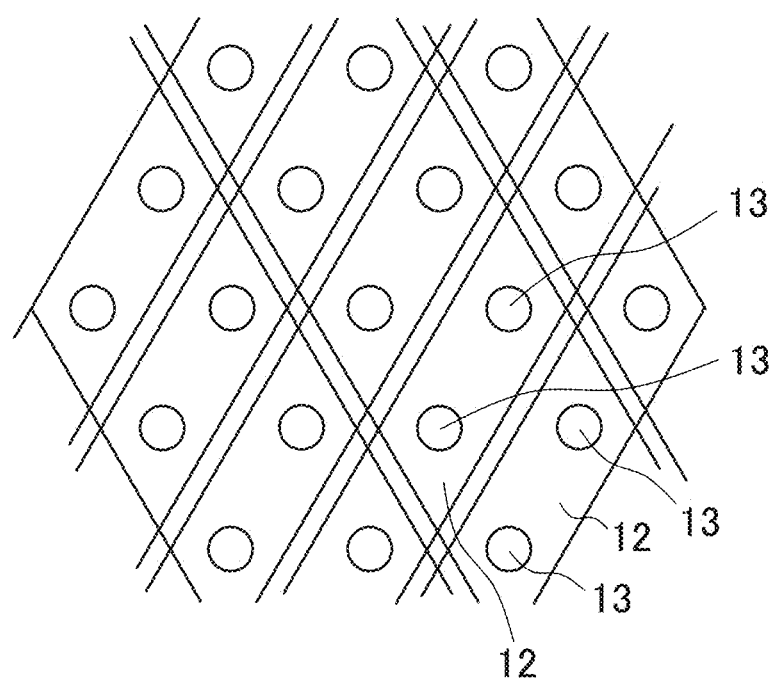
FIG. 8 is a drawing schematically showing, by way of example, units for use in the third liquid phase epitaxy which is an example of the first Group III nitride crystal production process according to the present invention.
Figure 9C:
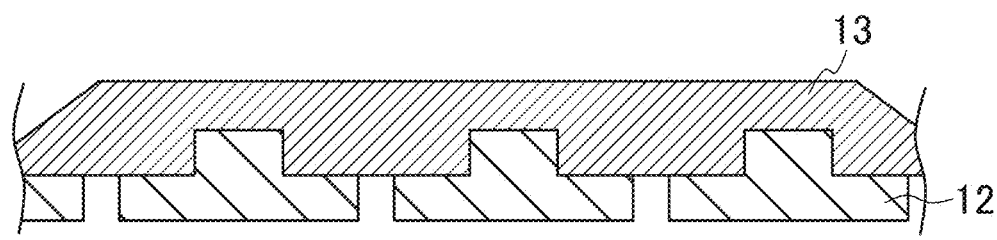
Figure 9D:
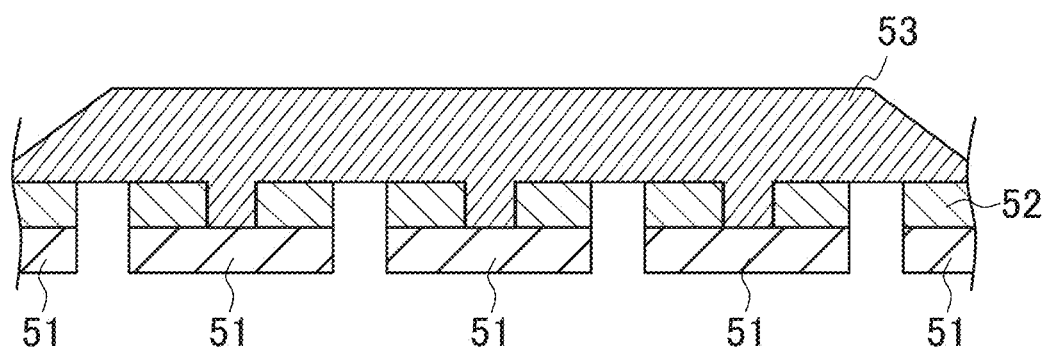

The plan view of FIG. 8 schematically shows an example of a unit for use in the third liquid phase epitaxy of the present invention. FIG. 8 shows a state where plural units each composed of a substrate 12 and a Group III nitride crystal (seed crystal) 13 are adjacently arranged in parallel in the first liquid phase epitaxy of the present invention. Instead of the first liquid phase epitaxy of the present invention, the second liquid phase epitaxy of the present invention may be used. In such a case, for example, the arrangement may be an arrangement in which a Group III nitride crystal layer 51 is used as a substitute for the substrate 12 of FIG. 8, a mask having through holes is arranged thereon as shown in FIG. 9D, and through holes (seed crystals) 52a are present at the positions of the seed crystals 13 of FIG. 8. Although two seed crystals are arranged on a substrate (unit) in FIG. 8, the number of seed crystals is not limited to two and may be one or any number of three or more. Furthermore, the size of each substrate also is not particularly limited and can be set as appropriate considering the production efficiency of the Group III nitride crystal, an effect of preventing or reducing warping, a distortion, cracking, and the like of the produced crystal, and the like. The cross sectional views of FIGS. 9C and 9D schematically show examples of producing a Group III nitride crystal by the third liquid phase epitaxy of the present invention. FIG. 9C shows an example in which the first liquid phase epitaxy of the present invention is used. FIG. 9C is the same as (g) of FIG. 3 except that plural units each composed of a substrate 12 and a Group III nitride crystal (seed crystal) 13 are adjacently arranged in parallel, and the Group III nitride crystals 13 grown from the units that are adjacent to each other are bound together. FIG. 9D shows an example in which the second liquid phase epitaxy of the present invention is used. FIG. 9D is the same as (f) of FIG. 7 except that plural units each composed of a Group III nitride crystal layer 51 and a mask 52 are adjacently arranged in parallel, and Group III nitride crystals 53 grown from the units that are adjacent to each other are bound together. Thereby, warping, a distortion, cracking, and the like of the produced crystal can be prevented or reduced. It is to be noted that appropriate changes can be made in FIG. 9D. For example, the size of the divided unit of each of the Group III nitride crystal layer 51 and the mask 52 may be changed appropriately or the Group III nitride crystal layer 51 and the mask 52 may coincide with each other in the state where their dividing positions are shifted. Furthermore, although the mask 52 is divided by each unit in FIG. 9D, the mask 52 may be linked to one another to be one piece. Moreover, in the units that are adjacent to each other, preferably, seed crystals that are adjacent to each other satisfy the conditions (M) and, more preferably, the crystals that are adjacent to each other satisfy the conditions (A) or (C) in addition to the conditions (M).

Figure 10:
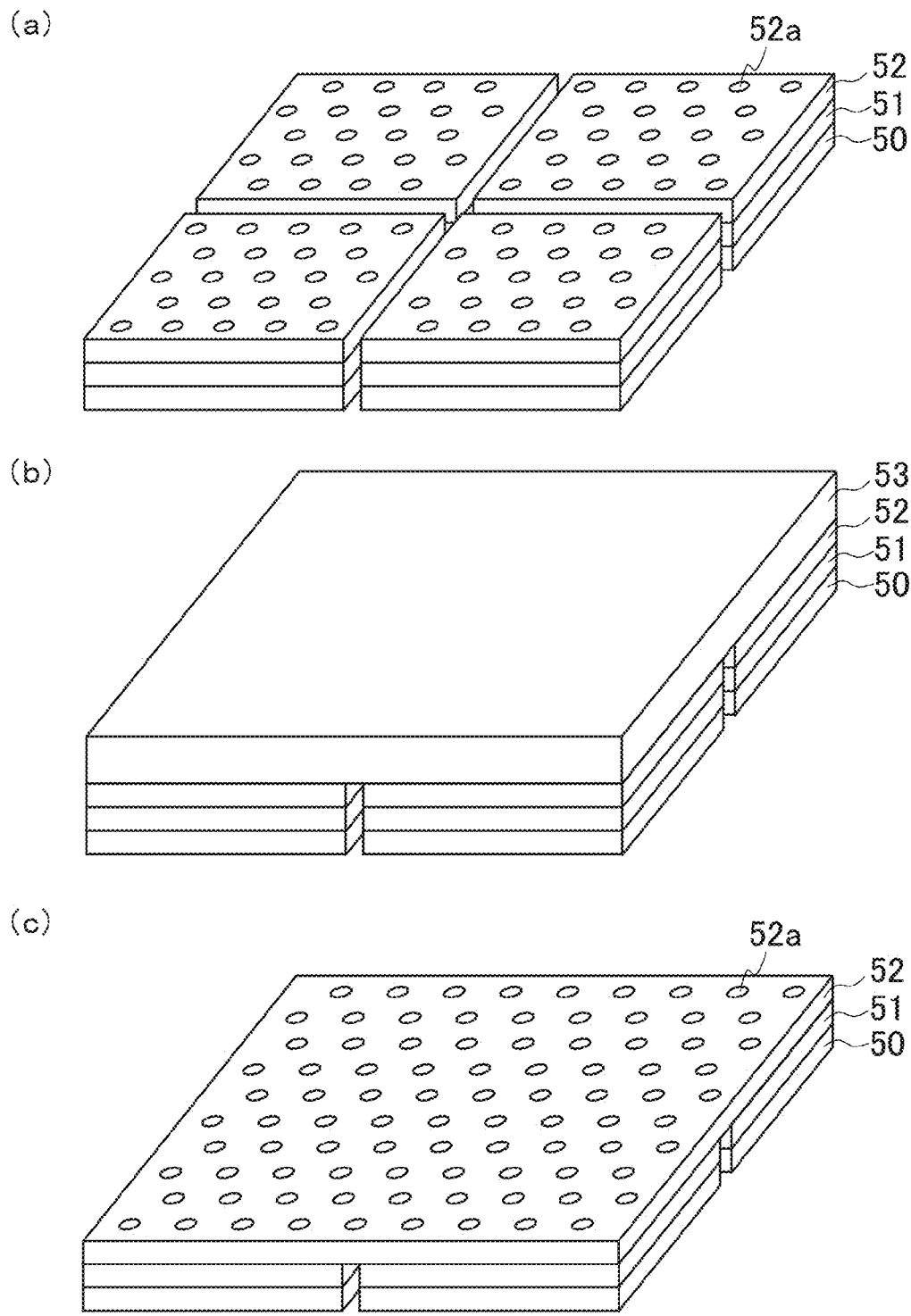
FIG. 10 shows perspective views showing, by way of example, a case where plural units are adjacently arranged in parallel in the first liquid phase epitaxy of the present invention.

As described above, according to the first Group III nitride crystal production process of the present invention, a large Group III nitride seed crystal of high quality with few defects can be produced as a seed crystal in the second Group III nitride crystal production process. In the first Group III nitride crystal production process, according to the third liquid phase epitaxy, for example, a larger Group III nitride crystal of high quality with few defects can be produced. An example of this is schematically shown in the perspective views of FIG. 10. FIG. 10 shows an example in which the second liquid phase epitaxy of the present invention is used in the third liquid phase epitaxy of the present invention. First, as shown in (a) of FIG. 10, plural units each formed of a Group III nitride crystal layer 51 and a mask 52 formed thereon are adjacently arranged in parallel. Plural holes 52a are formed in each mask 52. The Group III nitride crystal layer 51, the mask 52, and the through holes 52a are as described in the sections "1-1-2. Arrangement relationship, shape, size, and the like of seed crystal" and "1-1-5. Second liquid phase epitaxy", for example. In this case, not only seed crystals (through holes 52a) in each unit, but also seed crystals (through holes 52a) that are adjacent to each other between the units that are adjacent to each other satisfy the conditions (M), i.e., the conditions where m-planes of crystals grown from the seed crystals that are adjacent to each other do not almost coincide with each other. Preferably, the seed crystals that are adjacent to each other satisfy the conditions (A) or (C) in addition to the conditions (M). That is, (a) of FIG. 10 shows a part of the seed crystal selection step.

As shown in (a) of FIG. 10, in this example, a Group III nitride crystal layer 51 is formed on another substrate 50, which forms a unit together with a Group III nitride crystal layer 51 and a mask 52. The material for the substrate 50 is not particularly limited and is, for example, the same as the substrate in the second liquid phase epitaxy of the present invention and is particularly preferably sapphire or the like from the viewpoint of the costs and the convenience.

In the state of (a) of FIG. 10, the contact step and the crystal growth step are performed to grow a Group III nitride crystal 53. Thereby, the grown crystals in each unit and between the units shown in (a) of FIG. 10 are bound together, and one large Group III nitride crystal 53 can be produced as shown in (b) of FIG. 10.

In accordance with the recent advances in technology, a large semiconductor crystal can be produced, and this offers more choices of designing a semiconductor apparatus. For example, in a silicon semiconductor substrate or the like, large crystals having a diameter of 6 inch (about 15 cm), 8 inch (about 20 cm), and the like are put to practical use. However, with reference to a Group III nitride crystal such as GaN, it was impossible to produce such a large crystal. As described above, according to a conventional method for producing a Group III nitride crystal, there is a possibility of causing warping, a distortion, cracking, and the like while producing or using the crystal due to the difference in thermal expansion coefficient between a substrate (sapphire substrate 1002 in FIG. 9A) and a crystal (GaN crystal 1003 in FIG. 9A) and the like. The problem becomes more significant when a large Group III nitride crystal is produced by using a large substrate. For example, it is considered that the crystal is prone to be cracked, and in addition, a crystal defect inherited from the crystal grown from the seed crystal becomes larger due to warping, a distortion, and the like of the crystal. A Group III nitride crystal such as GaN has been produced using a 2-inch substrate (diameter: about 5 cm), and a Group III nitride crystal that is larger than the substrate has not been produced on a large scale.

However, in the third liquid phase epitaxy of the present invention, for example, as shown in (a) to (c) of FIG. 10, a large crystal can be produced while reducing the problem of warping, a distortion, cracking, and the like of the crystal caused by warping of the substrate by arranging the units in parallel. Furthermore, it is considered that the third liquid phase epitaxy of the present invention can further reduce the problem by combining with the first liquid phase epitaxy of the present invention.

(a) to (c) of FIG. 10 show an example in which the second liquid phase epitaxy of the present invention is used. The third liquid phase epitaxy of the present invention can be performed in the same manner as described above except that the units of the first liquid phase epitaxy of the present invention are used as substitute for the units of the second liquid phase epitaxy of the present invention. Although the number of the units arranged lengthwise and crosswise is 2×2=4 in (a) to (c) of FIG. 10, the number of the units is not limited thereto and can be any number. The number may be, for example, 1×2=2, 1×3=3, or 3×3=9.

In the third liquid phase epitaxy of the present invention, the units that are adjacent to each other may be partially connected with each other. Specifically, in the third liquid phase epitaxy of the present invention, the masks are preferably connected to each other between the units that are adjacent to each other because it allows the seed crystals that are adjacent to each other to be arranged to satisfy the conditions (M) (more preferably, to satisfy the conditions (A) or (C) in addition to the conditions (M)). For example, in (a) of FIG. 10, as a mask 52, a mask is used for each unit. However, the masks may be connected to form a large mask as a whole as shown in (c) of FIG. 10, for example.

The size of the Group III nitride crystal produced by the first Group III nitride crystal production process is not particularly limited, and the major axis is preferably 15 cm (about 6 inch) or more, more preferably 20 cm (about 8 inch) or more, and particularly preferably 25 cm (about 10 inch) or more. The height of the Group III nitride crystal also is not particularly limited and is, for example, 1 cm or more, preferably 5 cm or more, and more preferably 10 cm or more. Although such a large Group III nitride crystal may be produced without using the third liquid phase epitaxy of the present invention, it is preferably produced by the third liquid phase epitaxy of the present invention. Specifically, a Group III nitride crystal with a large diameter (in a lateral direction) is preferably produced by the third liquid phase epitaxy of the present invention. The first Group III nitride crystal production process, however, is not limited to the production of such a large Group III nitride crystal and can be used to produce a Group III nitride crystal in a conventional size having higher quality, for example.

<1-1-8. Impurity Element Adjustment Liquid Phase Epitaxy>

As described above, the first Group III nitride crystal production process in the production method of the present invention may be a process of producing the first Group III nitride crystal by the impurity element adjustment liquid phase epitaxy. The impurity element adjustment liquid phase epitaxy is, as described above, a method for producing a Group III nitride crystal in a melt containing at least an alkali metal and a Group III element, including: an adjustment step of adjusting the content of an impurity element other than the alkali metal and the Group III element in the melt; and a reaction step of causing the Group III element to react with nitrogen.

In the second Group III nitride crystal production process (vapor phase epitaxy), an oxidizing agent, a Group III oxide, or the like may be used, as described above. Thus, an impurity such as oxygen may be mixed in the second Group III nitride crystal grown in the second Group III nitride crystal production process (vapor phase epitaxy). The mixing of the impurity into the second Group III nitride crystal itself does not adversely affect the quality of the second Group III nitride crystal, as long as the concentration of the impurity is within an allowable range. However, if an impurity element such as oxygen is mixed in a Group III nitride crystal as an impurity, the size of the crystal lattice of the Group III nitride crystal is changed slightly (for example, the crystal lattice becomes greater when the impurity element is oxygen). Thus, the second Group III nitride crystal formed directly on the first Group III nitride crystal has a larger crystal lattice than the first Group III nitride crystal, so that distortion may occur in the second Group III nitride crystal. This distortion may cause warping, cracks, dislocation defects, and the like in the second Group III nitride crystal, for example.

On this account, by adjusting the content of an impurity element other than the alkali metal and the Group III element in the first Group III nitride crystal production process, the size of the crystal lattice of the first Group III nitride crystal can be adjusted. This allows the first Group III nitride crystal and the second Group III nitride crystal to have the same size of the crystal lattice, whereby distortion in the second Group III nitride crystal can be inhibited or prevented. As described above, the impurity element in the adjustment step preferably is at least one selected from the group consisting of oxygen, silicon, germanium, and magnesium. The second Group III nitride crystal is likely to contain oxygen, as described above. If the same impurity element is added in the first and second production processes, a Group III nitride crystal of high quality can be produced. On this account, it is particularly preferable that the impurity element is oxygen.

As described above, the first Group III nitride crystal production process may include: an adjustment step of adjusting the content of an impurity element other than the alkali metal and the Group III element in the alkali metal melt; and a reaction step of causing the Group III element to react with nitrogen. The method for adjusting the content of the impurity element other than the alkali metal and the Group III element in the adjustment step is not particularly limited. For example, when the impurity element is oxygen, the method for adjusting the content of the oxygen may be, for example, injecting $O_2$ gas into the alkali metal melt, injecting Group III oxide gas (e.g., GaO) into the alkali metal melt, or dissolving a solid Group III oxide (e.g., $Ga_2O_3$) in the melt. The adjustment step may be performed at the same time with the reaction step, for example. Specifically, for example, the reaction step may be performed while injecting $O_2$ gas or Group III oxide gas into the alkali metal melt. The $O_2$ gas or the Group III oxide gas may be mixed with $N_2$ gas, or may be introduced through a line different from a line for $N_2$ gas, for example. The content of the impurity element in the adjustment step can be adjusted as appropriate in consideration of, e.g., the size of the crystal lattice of the first Group III nitride crystal. Specifically, the content of the impurity element in the adjustment step may be adjusted in such a manner that, for example, the concentration of the impurity element (e.g., oxygen) in a first Group III nitride crystal (e.g., GaN) to be produced would be more than $1 \times 10^{17}$ $cm^{-3}$ and less than $1 \times 10^{20}$ $cm^{-3}$. Alternatively, the content of the impurity element in the adjustment step may be adjusted in such a manner the lattice constant (an index indicating the size of the crystal lattice), e.g., the lattice constant in the a-axis direction, of a Group III nitride crystal (e.g., GaN) to be produced would be 0.3185 nm to 0.3193 nm.

Figure 36:
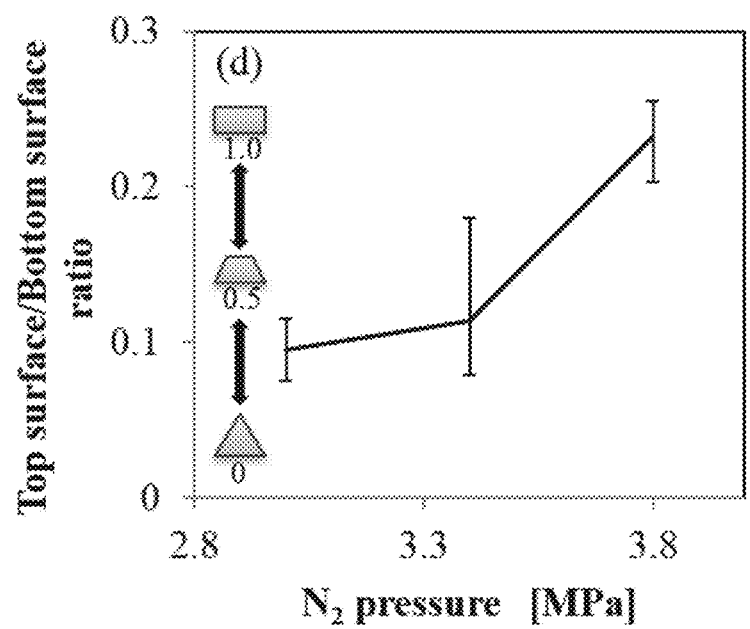
FIG. 36 is a graph showing an example of the relationship between the crystal growth direction of a first Group III nitride crystal and the applied pressure.

As described above, in the impurity element adjustment liquid phase epitaxy, the growth direction of the Group III nitride crystal in the reaction step may be as follows, for example: the growth direction is tilted relative to the c-axis in the first half of the reaction step, and the growth direction extends almost in the c-axis direction in the second half of the reaction step. Specifically, for example, the crystal can be grown in the [10-11] direction in the first half of the reaction step, and in the c-axis direction, i.e., in the [0001] direction in the second half of the reaction step. In order to control the growth direction of the Group III nitride crystal in the reaction step, for example, the reaction step may be performed in a condition under pressure, and the pressure applied in the first half of the reaction step may be smaller than the pressure applied in the second half of the reaction step, as described above. Specifically, the applied pressure can be set to 3.0 to 3.5 MPa in the first half of the reaction step and to 3.5 to 4.0 MPa in the second half of the reaction step, for example. Also, as described above, in the reaction step, the reaction temperature in the first half of the reaction step may be higher than the reaction temperature in the second half of the reaction step. Specifically, the reaction temperature can be set to 870° C. to 900° C. in the first half of the reaction step and to 850° C. to 870° C. in the second half of the reaction step, for example. As described above, the ranges of "the first half" and "the second half" of the reaction step are not particularly limited, and "the first half" may be before a lapse of 10 hours from the start of crystal growth and "the second half" may be after a lapse of 10 hours from the start of crystal growth, for example. FIG. 36 is a graph showing an example of data regarding the dependency of the crystal growth direction on the condition under pressure in the reaction step. In FIG. 36, the horizontal axis indicates "N2 pressure [MPa]", which is the partial pressure [MPa] of N2 gas in the reaction step, and the vertical axis indicates "Top surface/Bottom surface ratio", which indicates the numerical value obtained by dividing the area of the top surface of a grown Group III nitride crystal by the area of the bottom surface of the same. It can be seen from FIG. 36 that, when the applied pressure is low, the ratio of the plane tilted relative to the c-axis is greater, whereas, when the applied pressure is high, the ratio of the c-plane is greater. The crystal growth plane in the reaction step may extend, for example, in a direction almost parallel with the c-plane or a direction tilted relative to the c-plane.

Figure 29:
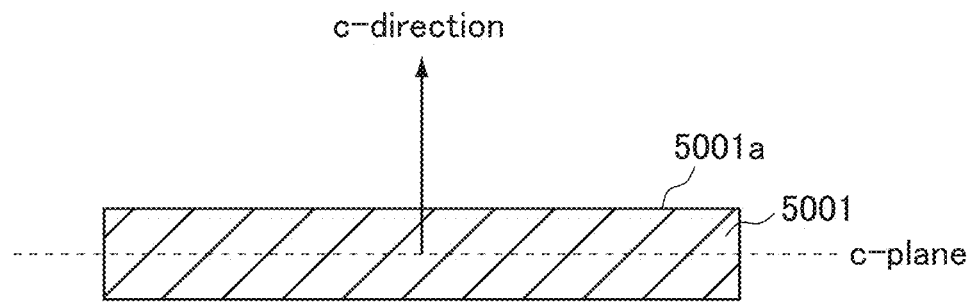
FIG. 29 is a cross sectional view schematically showing, by way of example, the case where a Group III nitride crystal grows almost in the c-direction, and the crystal growth plane is almost parallel with the c-plane.

FIG. 29 is a cross sectional view schematically showing, by way of example, the case where a Group III nitride crystal grows almost in the c-direction, and the crystal growth plane is almost parallel with the c-plane. As shown in FIG. 29, the crystal growth direction of a Group III nitride crystal 5001 extends almost in the c-direction. A crystal growth plane 5001a extends almost parallel with the c-plane. The term "c-direction" used in the present invention means a direction parallel with the c-axis (the axis perpendicular to the c-plane) of a Group III nitride crystal. In the present invention, the state where the growth direction of a Group III nitride crystal extends "almost in the c-direction", i.e., the growth direction "almost coincides with" the c-direction is not particularly limited. It means the state where the angle formed between the crystal growth direction and the c-direction is, for example, 10° or less, preferably 5° or less, more preferably 3° or less, and still more preferably 1° or less. It is ideal that the angle formed between the crystal growth plane and the c-plane is 0° (i.e., the crystal growth direction completely coincides with the c-direction). In the present invention, the crystal growth plane of the Group III nitride seed crystal may completely coincide with the c-plane or may be almost parallel with the c-plane, for example. When the Group III nitride seed crystal has such a crystal growth plane, it is possible to cause the Group III nitride crystal to grow in the c-direction (the direction almost perpendicular to the c-plane) more easily. In the present invention, the state where the crystal growth plane is "almost parallel" with the c-plane is not particularly limited, and means the state where the angle formed between the crystal growth plane and the c-plane is, for example, 10° or less, preferably 5° or less, more preferably 3° or less, and still more preferably 1° or less. It is ideal that the angle formed between the crystal growth plane and the c-plane is 0° (i.e., the crystal growth plane completely coincides with the c-plane).

Figure 30:
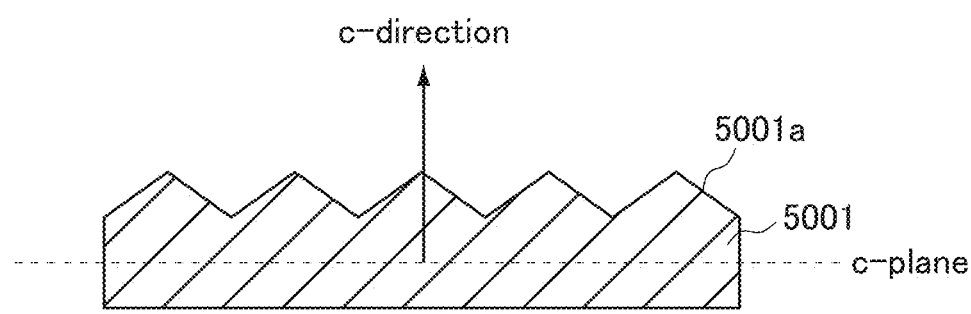
FIG. 30 is a cross sectional view schematically showing, by way of example, the case where a Group III nitride crystal grows almost in the c-direction, and the crystal growth plane is tilted relative to the c-plane.

FIG. 30 is a cross sectional view schematically showing, by way of example, the case where a Group III nitride crystal grows almost in the c-direction, and the crystal growth plane is tilted relative to the c-plane. As shown in FIG. 30, the crystal growth direction of a Group III nitride crystal 5001 extends almost in the c-direction. A crystal growth plane 5001a has recesses and projections, and has planes tilted greatly relative to the c-plane. When the crystal growth plane in the reaction step is tilted relative to the c-plane, the tilt angle is not particularly limited, and is, for example, 60° to 64° when a (10-11) plane appears.

Figure 37:
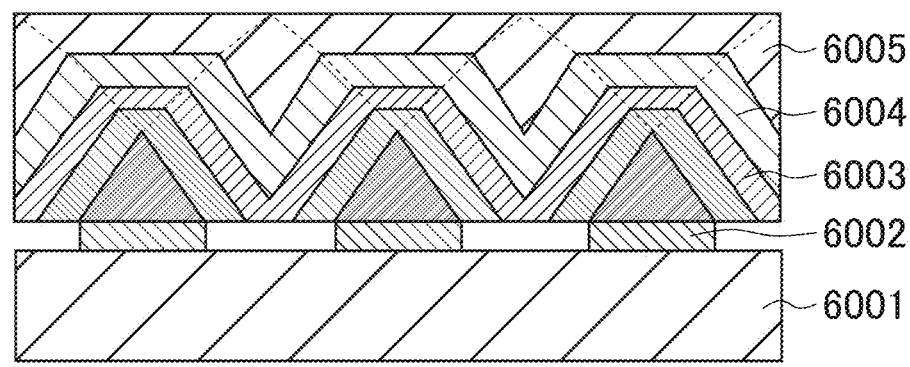
FIG. 37 is a cross sectional view schematically showing, by way of example, the case where a method for producing a first Group III nitride crystal is configured so that the crystal growth direction is different between the first half and the second half of a reaction step.

FIG. 37 is a cross sectional view schematically showing, by way of example, the case where the crystal growth direction is controlled in the first half and the second half of the reaction step. As shown in FIG. 37, a plurality of Group III nitride seed crystals 6002 are arranged on a substrate (e.g., sapphire substrate) 6001, and on the Group III nitride seed crystals 6002, Group III nitride crystals 6003 to 6005 are grown in this order. As shown in FIG. 37, the Group III nitride crystal grows dominantly in a direction tilted relative to the c-axis (a region indicated with 6003), such as the [10-11] direction, in the first half of the reaction step, whereby crystals grown on adjacent Group III nitride seed crystals 6002 can be bound to each other stably. In the second half of the reaction step, by causing the Group III nitride crystal to grow almost in the c-axis direction (a region indicated with 6005), it is possible to obtain a crystal having a flat surface. This can simplify a polishing step to be performed later, and also can inhibit the generation of cracks due to surface roughness.

The ease of incorporation of an impurity element (e.g., oxygen) other than the alkali metal and the Group III element into a Group III nitride crystal in the case where the Group III nitride crystal grows in a direction tilted relative to the c-axis in the reaction step is different from the one in the case where the Group III nitride crystal grows almost in the c-axis direction in the reaction step. Specifically, when the Group III nitride crystal grows in a direction tilted relative to the c-axis in the reaction step, the impurity element is incorporated into the Group III nitride crystal more easily. On this account, the concentration of the impurity element in the adjustment step may be changed depending on whether the crystal growth direction is almost parallel with the c-axis or the crystal growth direction is tilted relative to the c-axis.

In the first Group III nitride crystal production process in the production method of the present invention, a plurality of Group III nitride crystals generated and grown from a plurality of seed crystals are bound to each other to produce the first Group III nitride crystal, as described above. The method with the above configuration is advantageous in that the ratio of the area of planes tilted relative to the c-plane becomes greater on the crystal growth plane, which allows an impurity element (e.g., oxygen) other than the alkali metal and the Group III element to be incorporated more easily.

As described above, the impurity element adjustment liquid phase epitaxy may be configured so that, in the reaction step, a Group III nitride crystal is grown on a substrate such as a sapphire substrate.

A sapphire crystal has a smaller lattice constant than a Group III nitride crystal (e.g., GaN). Thus, when the lattice constant of the Group III nitride crystal is made greater by incorporation of the impurity element, the difference in lattice constant (the size of the crystal lattice) between the Group III nitride crystal and the sapphire substrate becomes greater. Accordingly, distortion of the Group III nitride crystal becomes larger in the vicinity of the interface between the Group III nitride crystal and the sapphire substrate. However, this allows the Group III nitride crystal to be detached from the sapphire substrate easily without applying excessive force to the Group III nitride crystal. Accordingly, the production efficiency of the Group III nitride crystal is improved, and besides, the Group III nitride crystal of high quality can be obtained while preventing the defectiveness. The same applies when any other substrate having a smaller lattice constant than a Group III nitride crystal is used instead of the sapphire substrate.

In the production method of the present invention including the first Group III nitride production process (liquid phase epitaxy) and the second Group III nitride production process (vapor phase epitaxy), the impurity element adjustment liquid phase epitaxy may be used as the first Group III nitride production process, as described above. Alternatively, the impurity element adjustment liquid phase epitaxy may be used in a method for producing a Group III nitride crystal by using liquid phase epitaxy alone (i.e., without using vapor phase epitaxy in combination). In this case, in the impurity element adjustment liquid phase epitaxy, a plurality of Group III nitride crystals generated and grown from a plurality of seed crystals may be bound to each other, as in the first Group III nitride production process. It is to be noted, however, that the impurity element adjustment liquid phase epitaxy is not limited thereto, and a single seed crystal may be used instead of a plurality of seed crystals. Alternatively, instead of the first Group III nitride production process (liquid phase epitaxy), the impurity element adjustment liquid phase epitaxy in which a single seed crystal is used may be used in combination with the second Group III nitride production process (vapor phase epitaxy).

The impurity element adjustment liquid phase epitaxy can control the carrier density and the resistivity of a Group III nitride crystal by adding an impurity element other than the alkali metal and the Group III element. Accordingly, the impurity element adjustment liquid phase epitaxy can control not only the crystal lattice (lattice constant) of a Group III nitride crystal but also the carrier density and resistivity of the Group III nitride crystal, by adding an impurity element other than the alkali metal and the Group III element. The impurity element adjustment liquid phase epitaxy may be carried out using the Group III nitride crystal production unit 4002 based on liquid phase epitaxy shown in FIG. 33. In this case, the Group III nitride crystal production unit 4002 based on liquid phase epitaxy may be configured so as to include an adjustment unit that adjusts the content of an impurity element other than the alkali metal and the Group III element in the alkali metal melt. When the impurity element is oxygen, this adjustment unit may be, for example, a gas pipe for injecting at least one of $O_2$ gas and Group III oxide gas (e.g., GaO) into the alkali metal melt, a supply arm for dissolving a solid Group III oxide (e.g., $Ga_2O_3$) in the melt, or the like. A production apparatus with the following configuration may be constructed: after the impurity element adjustment liquid phase epitaxy has been performed using the Group III nitride crystal production unit 4002, a Group III nitride crystal is produced using the Group III nitride crystal production unit 4003 based on vapor phase epitaxy.

<1-1-9. First Group III Nitride Crystal Heating Step>

As described above, the production method of the present invention may include, prior to the second Group III nitride crystal production process, a first Group III nitride crystal heating step of heat-treating the first Group III nitride crystal. This first Group III nitride crystal heating step is optional. However, it is preferable to perform the first Group III nitride crystal heating step from the viewpoint of preventing defectiveness caused by the remaining alkali metal (inclusion) in the second Group III nitride crystal production process, as described above.

The device used for heating in the first Group III nitride crystal heating step is not particularly limited, and a common oven or the like can be used. The heating temperature in the first Group III nitride crystal heating step is not particularly limited, and is, for example, from 700° C. to 1600° C., preferably from 800° C. to 1500° C., more preferably from 850° C. to 1450° C., and still more preferably from 900° C. to 1400° C. The heating time in the first Group III nitride crystal heating step is not particularly limited, and is, for example, from 0.1 to 30 hr, preferably from 0.15 to 10 hr, more preferably from 0.2 to 5 hr, and still more preferably from 0.25 to 1 hr. As described above, it is preferable that the heating temperature in the first Group III nitride crystal heating step is equal to or higher than the crystal growth temperature in the first Group III nitride crystal production process and equal to or lower than the crystal growth temperature in the second Group III nitride crystal production process.

<1-2. Second Group III Nitride Crystal Production Process (Vapor Phase Epitaxy)>

Next, the second Group III nitride crystal production process (vapor phase epitaxy) is described.

As described above, in the second Group III nitride crystal production process, a Group III element metal or a Group III element compound is caused to react with nitrogen-containing gas to produce the second Group III nitride crystal on the first Group III nitride crystal by vapor phase epitaxy. Except for this, there is no particular limitation on the second Group III nitride crystal production process. As described, preferably, the second Group III nitride crystal production process is the second Group III nitride crystal production process (A) or the second Group III nitride crystal production process (B). As described above, the second Group III nitride crystal production process (A) is a process of producing the second Group III nitride crystal by causing a Group III element metal to react with an oxidizing agent and nitrogen-containing gas. As described above, the second Group III nitride crystal production process (B) includes: a reduced product gas generation step of causing a Group III oxide and reducing gas to react with each other to generate reduced product gas of the Group III oxide; and a crystal generation step of causing the reduced product gas and nitrogen-containing gas to react with each other to generate the second Group III nitride crystal. Except for these, there are no particular limitations on the second Group III nitride crystal production processes (A) and (B). For example, the second Group III nitride crystal production processes (A) and (B) may be the same as common vapor phase epitaxy. Examples thereof are described below.

<1-2-1. Second Group III Nitride Crystal Production Apparatus by Vapor Phase Epitaxy>

Figure 23:
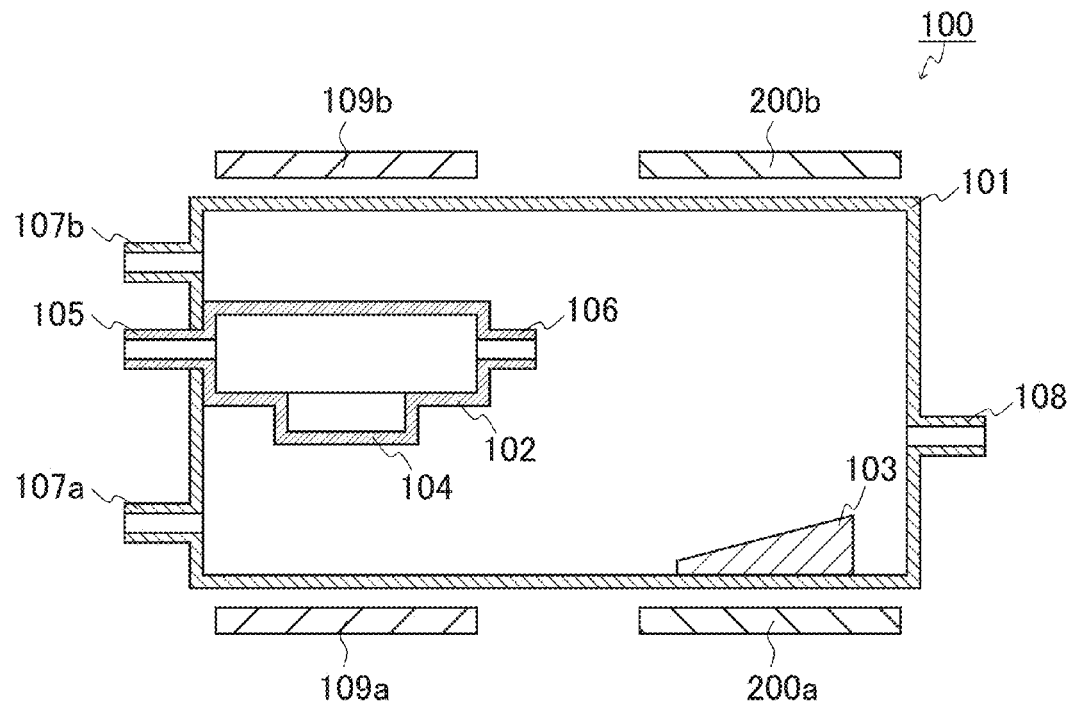
FIG. 23 is a cross sectional view schematically showing an example of an apparatus for use in the second Group III nitride crystal production process in the Group III nitride crystal production method according to the present invention.

FIG. 23 shows an example of the configuration of the production apparatus (the second Group III nitride crystal production apparatus using vapor phase epitaxy) for use in the second Group III nitride crystal production process (A). In FIG. 23, in order to make it clearly understandable, the size, the ratio, and the like of components are different from actual ones. As shown in FIG. 23, a production apparatus 100 of the present example includes a first container 101, a second container 102, and a substrate support 103, and the second container 102 and the substrate support 103 are disposed in the first container 101. The second container 102 is fixed at the left side surface of the first container 101 in FIG. 23. The substrate support 103 is fixed at the lower surface of the first container 101. The second container 102 includes a Group III element metal placement part 104 at its lower surface. The second container 102 is provided with an oxidizing gas introduction pipe 105 at its left side surface and is provided with a Group III element metal oxidation product gas delivery pipe 106 at its right side surface in FIG. 23. Oxidizing gas can be continuously introduced (supplied) into the second container 102 through the oxidizing gas introduction pipe 105. The first container 101 is provided with nitrogen-containing gas introduction pipes 107a and 107b at its left side surface and is provided with an exhaust pipe 108 at its right side surface in FIG. 23. Nitrogen-containing gas can be continuously introduced (supplied) into the first container 101 through the nitrogen-containing gas introduction pipes 107a and 107b. Furthermore, at the outside of the first container 101, first heating units 109a and 109b and second heating units 200a and 200b are disposed. However, the production apparatus for use in the production method of the present invention is not limited to this example. For example, although the number of second containers 102 disposed in the first container 101 in this example is one, the number of second containers 102 disposed in the first container 101 may be more than one. Furthermore, although the number of the oxidizing gas introduction pipes 105 is one in this example, the number of the oxidizing gas introduction pipes 105 may be more than one. While the production apparatus 100 shown in FIG. 23 is described as an apparatus for use in the second Group III nitride crystal production process (A), as is described below, the production apparatus 100 shown in FIG. 23 can be used in the second Group III nitride crystal production process (B).

There is no particular limitation on the shape of the first container. Examples of the shape of the first container include a cylinder, a quadratic prism, a triangular prism, and a shape created by combining these shapes. Examples of the material for forming the first container include quartz, alumina, aluminum titanate, mullite, tungsten, and molybdenum. A self-made first container or a commercially available first container may be used. The commercially available first container can be, for example, the "quartz reaction tube" (product name) manufactured by PHOENIX TECHNO.

There is no particular limitation on the shape of the second container. Examples of the shape of the second container include those described for the first container. Examples of the material for forming the second container include quartz, tungsten, stainless, molybdenum, aluminum titanate, mullite, and alumina. A self-made second container or a commercially available second container may be used. The commercially available second container can be, for example, the "SUS316BA tube" (product name) manufactured by Mecc Technica Co.

Conventionally known heating units can be used as the first heating unit and the second heating unit. Examples of the heating unit include ceramic heaters, high frequency heaters, resistance heaters, and light collecting heaters. One type of the heating units may be used alone or two or more of them may be used in combination. Preferably, the first heating unit and the second heating unit are each independently controlled.

Figure 25:
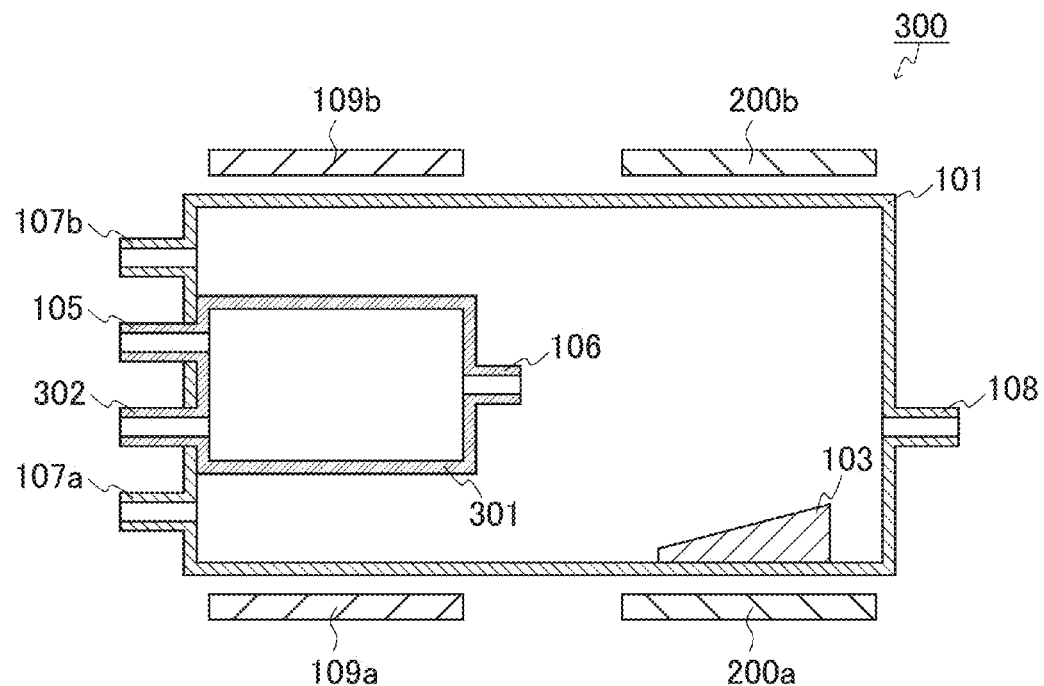
FIG. 25 is a cross sectional view schematically showing another example of an apparatus for use in the second Group III nitride crystal production process.

FIG. 25 shows another example of the configuration of the production apparatus for use in the second Group III nitride crystal production process (A). As shown in FIG. 30, this production apparatus 300 has the same configuration as the production apparatus 100 shown in FIG. 23 except that it includes a second container 301 instead of a second container 102. As shown in FIG. 23, the second container 301 is provided with oxidizing gas introduction pipe 105 at the upper part of its left side surface, is provided with a Group III element metal introduction pipe 302 at the lower part of its left side surface, and is provided with a Group III element metal oxidation product gas delivery pipe 106 at its right side surface. Oxidizing gas can be continuously introduced (supplied) into the second container 301 through the oxidizing gas introduction pipe 105. A Group III element metal can be continuously introduced (supplied) into the second container 301 through the Group III element metal introduction pipe 302. The second container 301 does not include a Group III element metal placement part 104, instead, it has a deep depth (vertical width) and allows a Group III element metal to be stored in its lower part. The first container 101 and the second container 301 of the production apparatus shown in FIG. 25 each can be referred to as a "reaction vessel". The Group III element metal introduction pipe 302 corresponds to a "Group III element metal supply unit". The oxidizing gas introduction pipe 105 can be referred to as an "oxidizing agent supply unit". The nitrogen-containing gas introduction pipes 107a and 107b each can be referred to as a "nitrogen-containing gas supply unit". In the present invention, the production apparatus (the second Group III nitride crystal production apparatus using the vapor phase epitaxy) for use in the second Group III nitride crystal production process may be, for example as the apparatus shown in FIG. 25, an apparatus for producing a Group III nitride crystal in which the Group III element metal can be continuously supplied into the reaction vessel by the Group III element metal supply unit, the oxidizing agent can be continuously supplied into the reaction vessel by the oxidizing agent supply unit, the nitrogen-containing gas can be continuously supplied into the reaction vessel by the nitrogen-containing gas supply unit, and the Group III element metal, the oxidizing agent, and the nitrogen-containing gas are caused to react in the reaction vessel to produce a Group III nitride crystal.

It can be said that the production apparatus (for example, apparatus shown in FIG. 23 or 25) for use in the second Group III nitride crystal production process (A), corresponds to "the second Group III nitride crystal production unit" in the Group III nitride crystal production apparatus of the present invention. The configuration of the production apparatus for use in the second Group III nitride crystal production process is not limited to those shown in FIGS. 23 and 25. For example, the heating units 109a, 109b, 200a, and 200b and the substrate support 103 can be omitted. However, from the viewpoint of reactivity and operability, the production apparatus is preferably provided with these components. Furthermore, the production apparatus for use in the production method of the present invention may be provided with other components in addition to the above-described components. Examples of other components include a unit that controls the temperatures of the first heating unit and the second heating unit and a unit that adjusts the pressure and the introduction amount of the gas used in each step.

The production apparatus for use in the second Group III nitride crystal production process (A) can be produced by assembling the above-described components and other components as needed according to a conventionally known method, for example.

<1-2-2. Production Process, Reaction Conditions, and the Like in Second Group III Nitride Crystal Production Process (A)>

Next, steps, reaction conditions, materials to be used, and the like in the second Group III nitride crystal production process (A) are described. The present invention, however, is not limited by the following description. A mode for carrying out the second Group III nitride crystal production process (A) is described below with reference to the production apparatus shown in FIG. 23 or the production apparatus shown in FIG. 25 instead of the production apparatus shown in FIG. 23.

Figure 24:
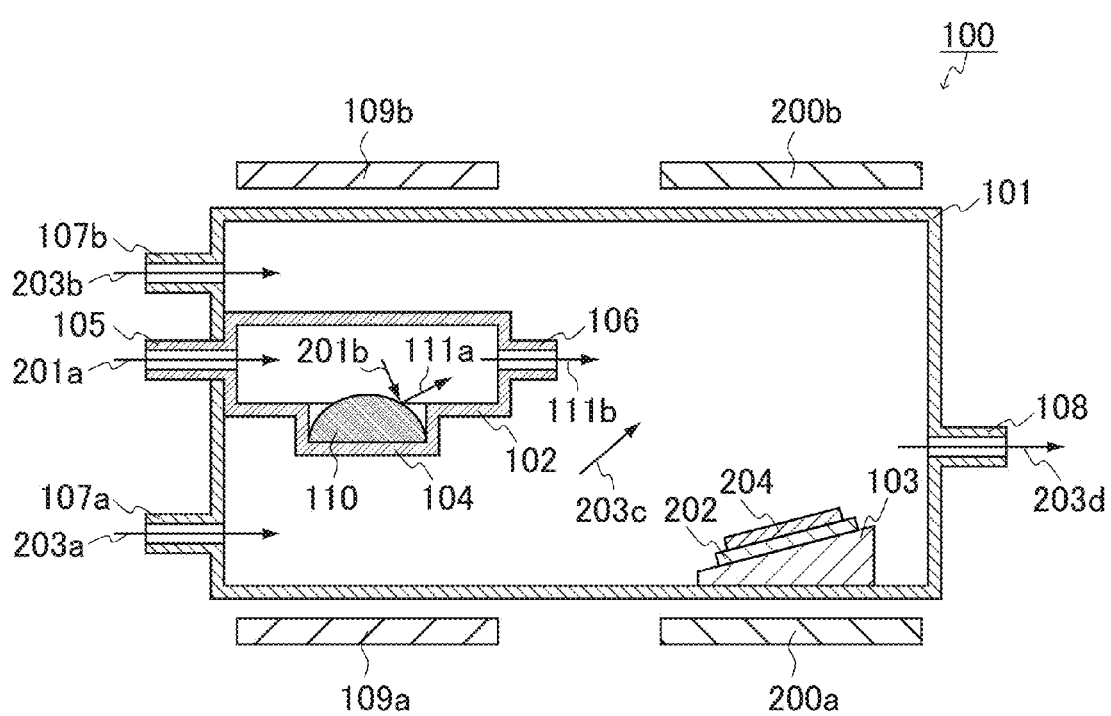
FIG. 24 is a cross sectional view schematically showing an outline of the second Group III nitride crystal production process using the apparatus shown in FIG. 23.

First, as shown in FIG. 24 (or FIG. 26), a first Group III nitride crystal 202 produced by the first Group III nitride crystal production process is previously disposed on a first Group III nitride crystal support 103. The first Group III nitride crystal 202 can be selected appropriately according to the form or the like of a Group III nitride crystal to be generated thereon. The first Group III nitride crystal 202 may be a Group III nitride crystal formed on a substrate, for example. Specifically, for example, as shown in (b) of FIG. 1, a first Group III nitride crystals 1003 may be formed on a substrate 1002. As described above, preferably, the material for the substrate contains at least one selected from the group consisting of $Al_xGa_{1-x}N$ ($0<x\le1$), an oxide of the $Al_xGa_{1-x}N$ ($0<x\le1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten, for example. Also, examples of the material for the substrate include sapphire, Group III nitride, gallium arsenide (GaAs), silicon (Si), silicon carbide (SiC), magnesium oxide (MgO), zinc oxide (ZnO), gallium phosphide (GaP), zirconium diboride ($ZrB_2$), lithium dioxogallate ($LiGaO_2$), BP, $MoS_2$, $LaAlO_3$, NbN, $MnFe_2O_4$, $ZnFe_2O_4$, ZrN, TiN, $MgAl_2O_4$, $NdGaO_3$, $LiAlO_2$, $ScAlMgO_4$, and $Ca_8La_2(PO_4)_6O_2$. Among them, sapphire is particularly preferable from the viewpoint of the cost and the like.

The material for the first Group III nitride crystal 202 (seed crystal) may be, for example, identical to or different from the material for the second Group III nitride crystal to be generated thereon. Preferably, the material for the first Group III nitride crystal 202 is identical to the material for the second Group III nitride crystal.

Figure 26:
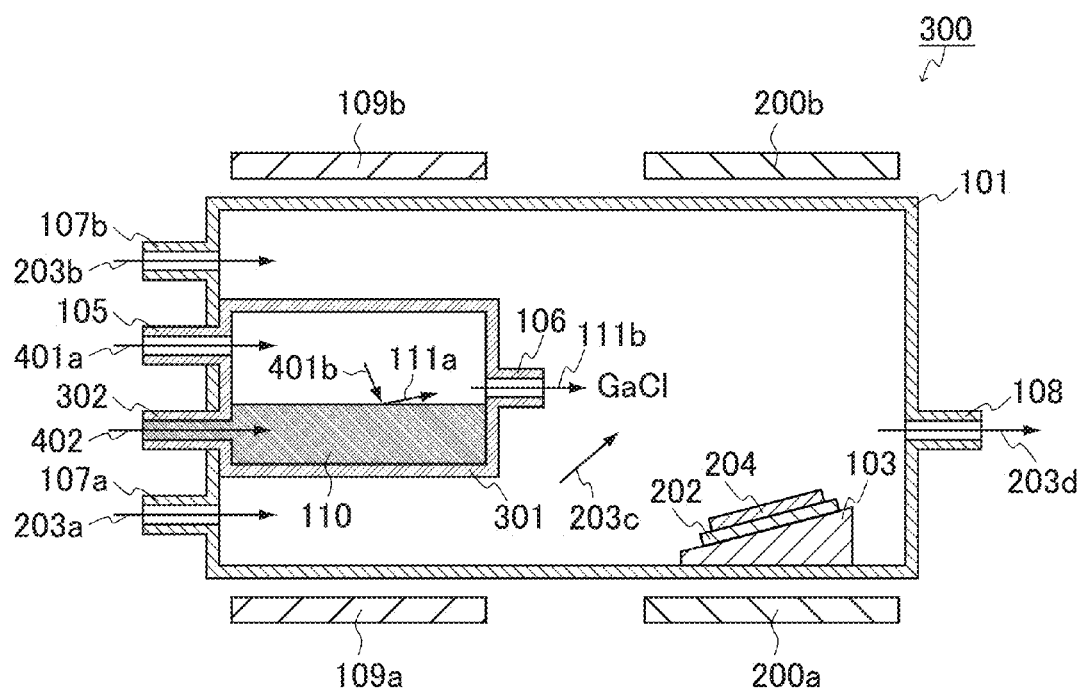
FIG. 26 is a cross sectional view schematically showing an outline of the Group III nitride crystal production method according to the present invention using the apparatus shown in FIG. 25.

Next, as shown in FIG. 24, a Group III element metal 110 is disposed on a Group III element metal placement part 104. When the production apparatus shown in FIG. 25 is used, as shown in FIG. 26, a Group III element metal 402 is introduced into a second container 301 from a Group III element metal introduction pipe 302 and is stored in the lower part of the second container 301 as a Group III element metal 110. The Group III element metal 402 can be continuously introduced into the second container 301 from the Group III element metal introduction pipe 302. For example, the Group III element metal 402 can be introduced from the Group III element metal introduction pipe 302 to refill with a quantity equivalent to the amount of the Group III element metal 402 consumed by reaction. The Group III element metal is not limited to a particular metal and examples thereof include aluminum (Al), gallium (Ga), indium (In), and thallium (Tl), and one of them may be used alone or two or more of them may be used in combination. For example, as the Group III element metal, at least one selected from the group consisting of aluminum (Al), gallium (Ga), and indium (In) may be used. In this case, the composition of the Group III nitride crystal to be produced can be represented by $Al_sGa_tIn_{\{1-(s+t)\}}N$ (provided that, $0\le s\le1$, $0\le t\le1$, $s+t\le1$). Furthermore, the Group III element metal 110 may be caused to react in the presence of a dopant material or the like, for example. The dopant is not particularly limited, and examples thereof include germanium oxides (e.g., $Ge_2O_3$, $Ge_2O$, and the like).

Furthermore, a ternary or higher nitride crystal produced using two or more kinds of Group III element metals can be, for example, a crystal represented by $Ga_xIn_{1-x}N$ ($0<x<1$). For generating a ternary or higher nitride crystal, it is preferable to generate reduced product gas of at least two kinds of Group III oxides. In this case, it is preferable to use a production apparatus provided with at least two second containers.

Because of its relatively low melting point, a Group III element metal easily becomes liquid by heating. When the Group III element metal is liquid, it can be easily supplied into a reaction vessel (second container 301 in FIG. 26) continuously. Among the above-described Group III element metals, gallium (Ga) is particularly preferable. It is because gallium nitride (GaN) produced from gallium is very useful as a material for a semiconductor apparatus. In addition, because gallium can become liquid at room temperature because of its low melting point (about 30° C.), it can be particularly easily supplied to a reaction vessel continuously. When only gallium is used as the Group III element metal, a Group III nitride crystal to be produced is gallium nitride (GaN) as described above.

Next, the Group III element metal 110 is heated using first heating units 109a and 109b and the first Group III nitride crystal 202 is heated using second heating units 200a and 200b. In this state, oxidizing gas 201a (or 401a) is introduced from oxidizing gas introduction pipe 105, and nitrogen-containing gas 203a and 203b is introduced from the nitrogen-containing gas introduction pipes 107a and 107b. There is no particular limitation on the oxidizing gas 201a (or 401a). As described above, the oxidizing gas 201a (or 401a) is preferably at least one selected from the group consisting of $H_2O$ gas, $O_2$ gas, $CO_2$ gas, and CO gas, and is particularly preferably $H_2O$ gas. The oxidizing gas 201a (or 401a) introduced (supplied) into the second container 102 (or 301) comes into contact with the surface of the Group III element metal 110 (oxidizing gas 201b or 401b). The Group III element metal 110 is thereby caused to react with the oxidizing gas 201b (or 401b) to generate Group III element metal oxidation product gas 111a (Group III element metal oxidation product gas generation step). The flow rate of the oxidizing gas is, for example, in the range from 0.0001 to 50 $Pa\cdot m^3/s$, preferably in the range from 0.001 to 10 $Pa\cdot m^3/s$, and more preferably in the range from 0.005 to 1 $Pa\cdot m^3/s$.

In the Group III element metal oxidation product gas generation step in the production method of the present invention, from the viewpoint of promoting the generation of the Group III element metal oxidation product gas, preferably, the Group III element metal is caused to react with the oxidizing gas in a heated state. In this case, the temperature of the Group III oxide is not particularly limited, and is preferably in the range from 650° C. to 1500° C., more preferably in the range from 900° C. to 1300° C., and still more preferably in the range from 1000° C. to 1200° C.

In the Group III element metal oxidation product gas generation step, particularly preferably, the Group III element metal is gallium, the oxidizing gas is H₂O gas, and the Group III element metal oxidation product gas is Ga₂O. The reaction formula of this case can be represented, for example, by the following formula (I). However, the reaction formula is not limited thereto.

$$2Ga+H_2O \rightarrow Ga_2O+H_2 \qquad (I)$$

In the production method of the present invention, from the viewpoint of controlling the partial pressure of the oxidizing gas, the Group III element metal oxidation product gas generation step may be performed in an atmosphere of mixed gas of the oxidizing gas and inert gas. There are no particular limitations on the proportions of the oxidizing gas and the inert gas with respect to the total amount of the mixed gas. Preferably, the proportion of the oxidizing gas with respect to the total amount of the mixed gas is 0.001 vol. % or more and less than 100 vol. %, and the proportion of the inert gas with respect to the total amount of the mixed gas exceeds 0 vol. % and 99.999 vol. % or less. More preferably, the proportion of the oxidizing gas with respect to the total amount of the mixed gas is 0.01 vol. % or more and 80 vol. % or less, and the proportion of the inert gas with respect to the total amount of the mixed gas is 20 vol. % or more and 99.99 vol. % or less. Still more preferably, the proportion of the oxidizing gas with respect to the total amount of the mixed gas is 0.1 vol. % or more and 60 vol. % or less, and the proportion of the inert gas with respect to the total amount of the mixed gas is 40 vol. % or more and 99.9 vol. % or less. In the production method of the present invention, examples of the inert gas include nitrogen gas, helium gas, argon gas, and krypton gas. Among them, nitrogen gas is particularly preferable. Examples of the method for creating the mixed gas atmosphere include a method of introducing inert gas from an inert gas introduction pipe (not shown) provided in the second container separately from the oxidizing gas introduction pipe; and a method of preliminarily generating gas in which the hydrogen gas and the inert gas are mixed at predetermined proportions and introducing the thus obtained gas from the oxidizing gas introduction pipe. In the case of introducing the inert gas from the separately provided inert gas introduction pipe, the flow rate of the inert gas can be set appropriately according to the flow rate of the oxidizing gas and the like. The flow rate of the inert gas is, for example, in the range from 0.1 to 150 Pa·m³/s, preferably in the range from 0.2 to 30 Pa·m³/s, and more preferably from 0.3 to 10 Pa·m³/s.

The generated Group III element metal oxidation product gas 111a is delivered to the outside of the second container 102 (or 301) through the Group III element metal oxidation product gas delivery pipe 106 (Group III element metal oxidation product gas 111b). Although the Group III element metal oxidation product gas 111b shown in FIG. 26 is Ga₂O, the Group III element metal oxidation product gas 111b is not limited thereto. For delivering the Group III element metal oxidation product gas 111b to the outside of the second container 102 (or 301) through the Group III element metal oxidation product gas delivery pipe 106, first carrier gas may be introduced. As the first carrier gas, for example, the examples described for the inert gas can be used. The flow rate (partial pressure) of the first carrier gas can be the same as that of the inert gas. In the case of introducing the inert gas, the inert gas can be used as the first carrier gas.

The generation of the Group III element metal oxidation product gas 111a (111b) may be performed in a condition under pressure, in a condition under reduced pressure, or in conditions other than these conditions, for example. The pressure in the condition under pressure is not particularly limited, and is preferably in the range from $1.0 \times 10^5$ to $1.50 \times 10^7$ Pa, more preferably in the range from $1.05 \times 10^5$ to $5.00 \times 10^6$ Pa, and more preferably in the range from $1.10 \times 10^5$ to $9.90 \times 10^5$ Pa. The method of applying pressure can be, for example, a method of applying pressure by the oxidizing gas, the first carrier gas, or the like. The pressure in the condition under reduced pressure is not particularly limited, and is preferably in the range from $1 \times 10^1$ to $1 \times 10^5$ Pa, more preferably in the range from $1 \times 10^2$ to $9 \times 10^4$ Pa, and still more preferably in the range from $5 \times 10^3$ to $7 \times 10^4$ Pa.

The Group III element metal oxidation product gas (e.g., Ga₂O gas) Mb delivered to the outside of the second container 102 (or 301) through the Group III element metal oxidation product gas delivery pipe 106 is caused to react with nitrogen-containing gas 203c introduced into the first container 101, and a second Group III nitride (e.g., GaN) crystal 204 is generated on the substrate 202 (second Group III nitride crystal generation step). The reaction formula of this case can be represented, for example, by the following formula (II) in the case where the Group III element metal oxidation product gas is Ga₂O gas and the nitrogen-containing gas is ammonia gas. However, the reaction formula is not limited thereto. Note that excess remaining gas after reaction can be emitted from the exhaust pipe 108 as exhaust gas 203d.

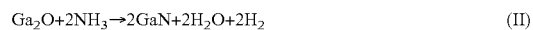

$$Ga_2O+2NH_3 \rightarrow 2GaN+2H_2O+2H_2 \qquad (II)$$

In the production method of the present invention, examples of the nitrogen-containing gas include nitrogen gas (N₂), ammonia gas (NH₃), hydrazine gas (NH₂NH₂), and alkylamine gas (e.g., C₂H₈N₂). The nitrogen-containing gas is particularly preferably NH₃.

In the second Group III nitride crystal generation step, the temperature (i.e., crystal growth temperature) of the substrate is not particularly limited. From the viewpoint of ensuring the generation rate of crystal and improving crystallinity, the temperature is preferably in the range from 700° C. to 1500° C., more preferably in the range from 1000° C. to 1400° C., and still more preferably in the range from 1100° C. to 1350° C. As described above, preferably, the second Group III nitride crystal production process includes an early stage crystal growth step and a late stage crystal growth step and the crystal growth temperature in the late stage crystal growth step is higher than the crystal growth temperature in the early stage crystal growth step. In this case, the crystal growth temperature in the early stage crystal growth step is, for example, in the range from 700° C. to 1400° C., preferably in the range from 900° C. to 1300° C., and more preferably in the range from 1000° C. to 1200° C. The crystal growth temperature in the late stage crystal growth step is, for example, in the range from 1000° C. to 1500° C., preferably in the range from 1100° C. to 1400° C., and more preferably in the range from 1200° C. to 1350° C. Moreover, as described above, the crystal growth temperature in the early stage crystal growth step is preferably equal to or higher than the crystal growth temperature in the first Group III nitride crystal production process.

The second Group III nitride crystal generation step may be performed in a condition under pressure, in a condition under reduced pressure, or in conditions other than these conditions. The pressure in the condition under pressure is not particularly limited, and is preferably in the range from $1.01 \times 10^5$ to $1.50 \times 10^7$ Pa, more preferably in the range from $1.05 \times 10^5$ to $5.00 \times 10^6$ Pa, and more preferably in the range from $1.10 \times 10^5$ to $9.90 \times 10^5$ Pa. The pressure in the condition under reduced pressure is not particularly limited, and is preferably in the range from $1 \times 10^1$ to $1 \times 10^5$ Pa, more preferably in the range from $1 \times 10^2$ to $9 \times 10^4$ Pa, and still more preferably in the range from $5 \times 10^3$ to $7 \times 10^4$ Pa.

In the second Group III nitride crystal generation step, the supply amount of the Group III element metal oxidation product gas (e.g., $Ga_2O$ gas indicated by 111b in FIGS. 24 and 26) is, for example, in the range from $5 \times 10^{-5}$ to $5 \times 10^1$ mol/h, preferably in the range from $1 \times 10^{-4}$ to 5 mol/h, and more preferably in the range from $2 \times 10^{-4}$ to $5 \times 10^{-1}$ mol/h. The supply amount of the Group III element metal oxidation product gas can be adjusted, for example, by adjusting the flow rate of the first carrier gas in generation of Group III element metal oxidation product gas.

The flow rate of the nitrogen-containing gas can be set appropriately according to the conditions such as the temperature of the substrate and the like. The flow rate of the nitrogen-containing gas is, for example, in the range from 0.1 to 150 Pa·m³/s, preferably in the range from 0.3 to 60 Pa·m³/s, and more preferably in the range from 0.5 to 30 Pa·m³/s.

For transferring the introduced nitrogen-containing gas to a crystal generation region (in the vicinity of the substrate support 103 in the first container 101 in FIGS. 23 to 26), second carrier gas may be introduced. For example, the second carrier gas may be introduced from a carrier gas introduction pipe (not shown) provided separately from the nitrogen-containing gas introduction pipe or introduced from the nitrogen-containing gas introduction pipe after being mixed with the nitrogen-containing gas. As the second carrier gas, for example, the examples described for the first carrier gas can be used.

In the case of introducing the second carrier gas from the carrier gas introduction pipe, the flow rate of the second carrier gas can be set appropriately according to the flow rate of the nitrogen-containing gas and the like. The flow rate of the second carrier gas is, for example, in the range from 0.1 to 150 Pa·m³/s, preferably in the range from 0.8 to 60 Pa·m³/s, and more preferably in the range from 1.5 to 30 Pa·m³/s.

The mixing ratio A:B (volume ratio) between the nitrogen-containing gas (A) and the second carrier gas (B) is not particularly limited, and is preferably in the range from 2 to 80:98 to 20, more preferably in the range from 5 to 60:95 to 40, and more preferably in the range from 10 to 40:90 to 60. The mixing ratio A:B (volume ratio) can be set, for example, by preliminarily mixing the nitrogen-containing gas and the second carrier gas at a predetermined mixing ratio or adjusting the flow rate (partial pressure) of the nitrogen-containing gas and the flow rate (partial pressure) of the second carrier gas.

Preferably, the Group III nitride crystal (e.g., GaN crystal) generation step is performed in a condition under pressure. The pressure in the condition under pressure is as described above. The method of applying pressure can be, for example, a method of applying pressure by the nitrogen-containing gas, the second carrier gas, or the like.

The second Group III nitride crystal generation step may be performed in a dopant-containing gas atmosphere. This allows a dopant-containing GaN crystal to be generated. Examples of the dopant include Si, S, Se, Te, Ge, Fe, Mg, and Zn. One type of the dopants may be used alone or two or more of them may be used in combination. Examples of the dopant-containing gas include monosilane ($SiH_4$), disilane ($Si_2H_6$), triethylsilane ($SiH(C_2H_5)_3$), tetraethylsilane $Si(C_2H_5)_4$), $H_2S$, $H_2Se$, $H_2Te$, $GeH_4$, $Ge_2O$, SiO, MgO, and ZnO, and one of them may be used alone or two or more of them may be used in combination.

For example, the dopant-containing gas may be introduced from a dopant-containing gas introduction pipe (not shown) provided separately from the nitrogen-containing gas introduction pipe or introduced from the nitrogen-containing gas introduction pipe after being mixed with the nitrogen-containing gas. In the case of introducing the second carrier gas, the dopant-containing gas may be introduced after being mixed with the second carrier gas.

The concentration of the dopant in the dopant-containing gas is not particularly limited, and is, for example, in the range from 0.001 to 100000 ppm, preferably in the range from 0.01 to 1000 ppm, and more preferably in the range from 0.1 to 10 ppm.

There is no particular limitation on the generation rate of the Group III nitride crystal (e.g., GaN crystal). The rate is, for example, 100 μm/h or more, preferably 500 μm/h or more, and more preferably 1000 μm/h or more.

The second Group III nitride crystal production process (A) can be performed as described above. However, the second Group III nitride crystal production process (A) is not limited thereto. For example, as described above, in the second Group III nitride crystal production process (A), preferably, a reaction is performed in the presence of reducing gas in a reaction system. Furthermore, as described above, preferably, at least one of the oxidizing gas and the nitrogen-containing gas is mixed with the reducing gas. That is, in FIG. 24 or 26, at least one of nitrogen-containing gas 203a and 203b and oxidizing gas 201a (or 401a) may be mixed with the reducing gas. In the production method of the present invention, more preferably, the oxidizing gas is mixed with the reducing gas. Thereby, for example, in the Group III element metal oxidation product gas generation step, the generation of a by-product in the reaction of the Group III element metal and the oxidizing gas can be inhibited and the reaction efficiency (the generation efficiency of the Group III element metal oxidation product gas) can further be improved. Specifically, for example, in the reaction of gallium (the Group III element metal) and $H_2O$ gas (the oxidizing gas), by mixing $H_2O$ gas with $H_2$ gas (the reducing gas), the generation of $Ga_2O_3$, which is a by-product, can be inhibited and the generation efficiency of $Ga_2O$ gas (the Group III element metal oxidation product gas) can be further improved.

Figure 27:
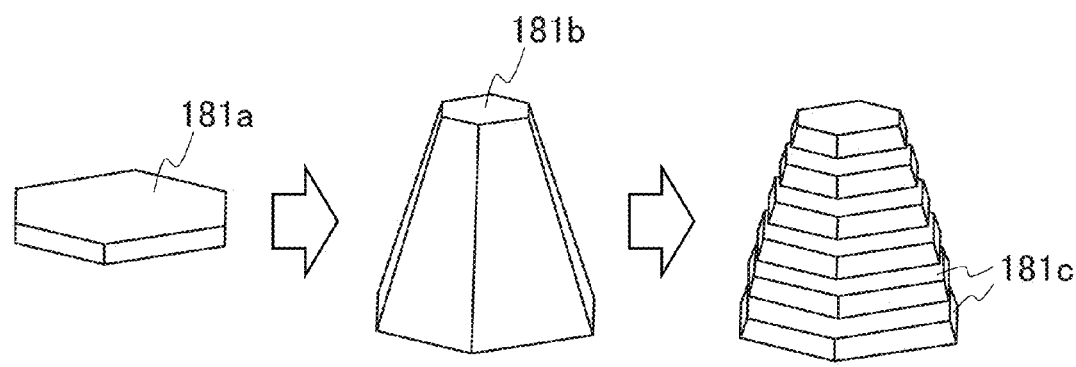
FIG. 27 is a perspective view schematically showing, by way of example, a Group III nitride crystal and a method for producing a semiconductor wafer using the Group III nitride crystal according to the present invention.

Furthermore, in the second Group III nitride crystal production process (A), when the reaction is performed in the presence of the reducing gas in a reaction system, for example, a larger Group III nitride crystal can be produced. The detail is described with reference to FIG. 27 as an example. FIG. 27 is a perspective view schematically showing a Group III nitride crystal and an example of the method of producing a semiconductor wafer using the same. As shown in FIG. 27, by allowing a Group III nitride crystal 181b to grow on a seed crystal 181a and then slicing the Group III nitride crystal 181b, a plate-like semiconductor wafer 181c formed of a Group III nitride crystal is produced. However, the Group III nitride crystal 181b tends to have a tapered pyramid shape as shown in FIG. 27 as it grows, and thus only a small semiconductor wafer is obtained at the tip of the pyramid-shaped crystal 181b. It is to be noted that, in the production method of the present invention, when the reaction is performed in the presence of the reducing gas in a reaction system, a columnar (i.e., not tapered) crystal instead of a pyramid-shaped crystal tends to be obtained although the reason is unknown. Different from a pyramid-shaped crystal, when such a columnar Group III nitride crystal is sliced, semiconductor wafers (Group III nitride crystals) each having a large diameter can be obtained from most parts.

In the second Group III nitride crystal production process (A), examples of the reducing gas include hydrogen gas; carbon monoxide gas; hydrocarbon gas such as methane gas, ethane gas, or the like; hydrogen sulfide gas; and sulfur dioxide gas, and one of them may be used alone or two or more of them may be used in combination. Among them, hydrogen gas is particularly preferable. The hydrogen gas with high purity is preferable. The purity of the hydrogen gas is particularly preferably 99.9999% or more.

When the Group III element metal oxidation product gas generation step is performed in the presence of the reducing gas, there is no particular limitation on the reaction temperature. From the viewpoint of inhibiting generation of a by-product, the reaction temperature is preferably 900° C. or higher, more preferably 1000° C. or higher, and still more preferably 1100° C. or higher. The upper limit of the reaction temperature is not particularly limited, and is, for example, 1500° C. or lower.

When the reducing gas is used in the second Group III nitride crystal production process (A), there is no particular limitation on the amount of the reducing gas to be used. The amount of the reducing gas with respect to the total volume of the oxidizing gas and the reducing gas is, for example, in the range from 1 to 99 vol. %, preferably in the range from 3 to 80 vol. %, and more preferably in the range from 5 to 70 vol. %. The flow rate of the reducing gas can be set appropriately according to the flow rate of the oxidizing gas or the like. The flow rate of the reducing gas is, for example, in the range from 0.01 to 100 Pa·m³/s, preferably in the range from 0.05 to 50 Pa·m³/s, and more preferably in the range from 0.1 to 10 Pa·m³/s. Furthermore, as described above, generation of Group III element metal oxidation product gas 111a (111b) is preferably performed in a condition under pressure. The pressure is, for example, as described above. The method of applying pressure may be, for example, a method of applying pressure by the oxidizing gas and the reducing gas.

The second Group III nitride crystal production process (A) of the present invention is vapor phase epitaxy and can be performed without using halide as a material. When halide is not used, different from the halide vapour phase epitaxy described in S52(1977)-023600 A (Patent Document 1) and the like, a Group III nitride crystal can be produced without generating a halogen-containing by-product. This makes it possible to prevent crystal generation from being adversely affected due to clogging of the exhaust pipe of the production apparatus with a halogen-containing by-product (e.g., NH₄Cl), for example.

<1-2-3. Production Process, Reaction Conditions, and the Like in Second Group III Nitride Crystal Production Process (B)>

Next, a production process, reaction conditions, and the like in the second Group III nitride crystal production process (B) are described with reference to an illustrative example.

The second Group III nitride crystal production process (B) can be performed using the production apparatus 100 shown in FIG. 23, for example. Specifically, the Group III element metal placement part 104 is used as a Group III oxide placement part 104. The oxidizing gas introduction pipe 105 is used as a reducing gas introduction pipe 105. The Group III element metal oxidized product gas delivery pipe 106 is used as a reduced product gas delivery pipe 106.

The second Group III nitride crystal production process (B) is described specifically below with reference to FIG. 24, taking as an example the case where the second Group III nitride crystal production process (B) is performed using the production apparatus shown in FIG. 23, $Ga_2O_3$ is used as a Group III oxide, $Ga_2O$ gas is used as reduced product gas, hydrogen gas is used as reducing gas, ammonia gas is used as nitrogen-containing gas, and, a Group III nitride crystal to be produced is a GaN crystal. It is to be noted, however, that the second Group III nitride crystal production process (B) is not limited to the following example. As described above, the second Group III nitride crystal production process (B) includes a reduced product gas generation step and a crystal generation step.

First, $Ga_2O_3$ is placed on the Group III oxide placement part 104, and a substrate 202 is set on the substrate support 103. Next, the $Ga_2O_3$ is heated using the first heating units 109a and 109b, and the substrate 202 is heated using the first heating units 200a and 200b. In this state, hydrogen gas 201a is introduced from the reducing gas introduction pipe 105, and ammonia gas 203a and 203b is introduced from the nitrogen-containing gas introduction pipes 107a and 107b. The introduced hydrogen gas 201b reacts with the $Ga_2O_3$, thereby generating $Ga_2O$ gas (the following formula [III]). The thus-generated $Ga_2O$ gas 111a is delivered to the outside of the second container 102 as $Ga_2O$ gas 111b through the reduced product gas delivery pipe 106. The delivered $Ga_2O$ gas 111b reacts with the introduced ammonia gas 203c, thereby generating a GaN crystal 204 on the substrate 202 (the following formula [IV]).

$$Ga_2O_3 + 2H_2 \rightarrow Ga_2O + 2H_2O \quad (III)$$

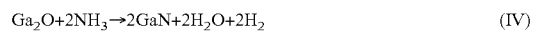

$$Ga_2O + 2NH_3 \rightarrow 2GaN + 2H_2O + 2H_2 \quad (IV)$$

Figure 28:
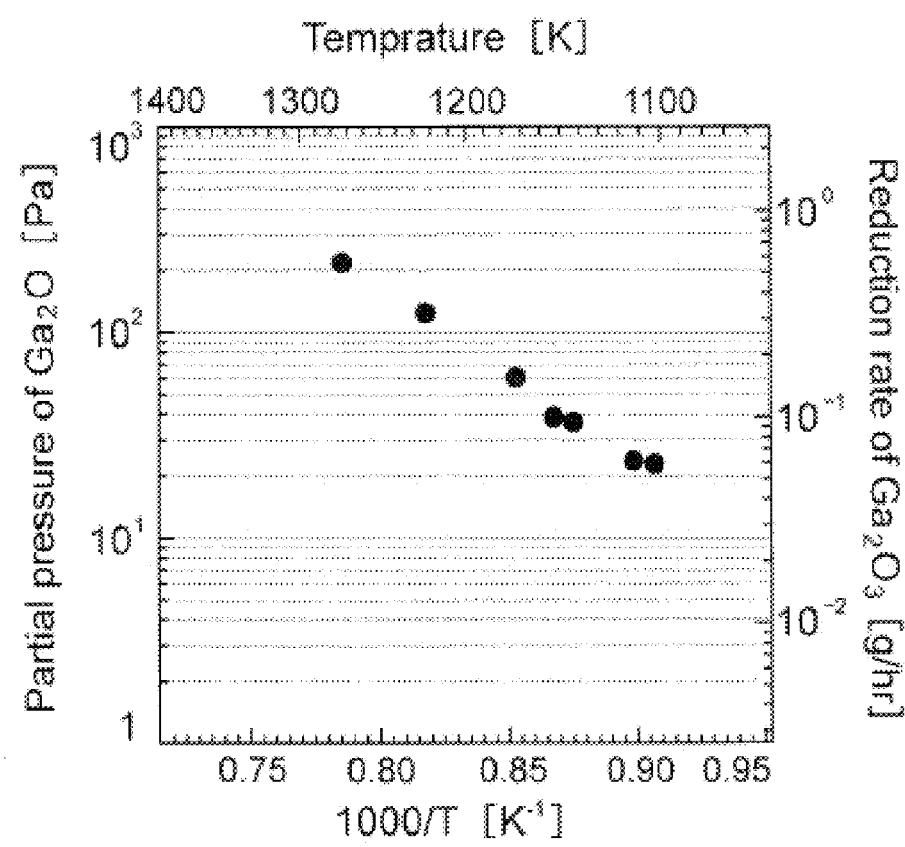
FIG. 28 is a graph showing an example of the relationship among the temperature of $Ga_2O_3$, the reduction rate of the $Ga_2O_3$, and the partial pressure of $Ga_2O$ gas in $Ga_2O$ gas generation.

FIG. 28 is a graph showing an example of the relationship among the temperature of $Ga_2O_3$, the reduction rate of the $Ga_2O_3$, and the partial pressure of $Ga_2O$ gas in $Ga_2O$ gas generation. As can be seen from FIG. 28, within the temperature range where the measurement was performed, the reduction rate of $Ga_2O_3$ and the partial pressure of the $Ga_2O$ gas increased in proportion to the temperature of $Ga_2O_3$. This example demonstrates that the hydrogen gas reduced $Ga_2O_3$ to generate $Ga_2O$ gas as reduced product gas, as shown in the formula (III). It is to be noted, however, that the production method of the present invention is not limited by the above description by any means.

As can be seen from the formulae (III) and (IV), by-products generated in the second Group III nitride crystal production process (B) are only water and hydrogen. That is, no solid by-product is generated. The water and the hydrogen can be emitted from the exhaust pipe 108 in the state of gas or liquid, for example. As a result, for example, a Group III nitride crystal can be grown for a long period, whereby a large and thick Group III nitride crystal can be obtained. Moreover, for example, it is not necessary to provide a filter or the like for removing by-products, which is advantageous in terms of cost. It is to be noted, however, that the second Group III nitride crystal production process (B) is not limited by the above description by any means.

Preferably, the $Ga_2O_3$ is in the form of powder or granular. When the $Ga_2O_3$ is in the form of powder or granular, the $Ga_2O_3$ can have a large surface area, which can promote $Ga_2O$ gas generation.

For generating a ternary or higher nitride crystal, it is preferable to generate reduced product gas of at least two kinds of Group III oxides. In this case, it is preferable to use a production apparatus provided with at least two second containers.

The hydrogen gas with high purity is preferable. The purity of the hydrogen gas is preferably 99.9999% or more. The flow rate (partial pressure) of the hydrogen gas can be set as appropriate according to the conditions such as the temperature of the $Ga_2O_3$ and the like. The partial pressure of the hydrogen gas is, for example, in the range from 0.2 to 28 kPa, preferably in the range from 0.5 to 20 kPa, and more preferably in the range from 1.5 to 15 kPa.

As described above, from the viewpoint of controlling the partial pressure of the hydrogen gas, the $Ga_2O$ gas generation preferably is performed in an atmosphere of mixed gas of the hydrogen gas and inert gas. Examples of the method for creating the mixed gas atmosphere include a method of introducing inert gas from an inert gas introduction pipe (not shown) provided in the second container separately from the reducing gas introduction pipe; and a method of preliminarily generating gas in which the hydrogen gas and the inert gas are mixed at predetermined proportions and introducing the thus obtained gas from the reducing gas introduction pipe. In the case of introducing the inert gas from the separately provided inert gas introduction pipe, the flow rate (partial pressure) of the inert gas can be set as appropriate according to the flow rate of the hydrogen gas and the like. The partial pressure of the inert gas is, for example, in the range from 0.2 to 28 kPa, preferably in the range from 2.0 to 25 kPa, and more preferably in the range from 5.0 to 20 kPa.

The proportion of the hydrogen gas and the proportion of the inert gas in the mixed gas are as described above. The proportion of the hydrogen gas and the proportion of the inert gas in the mixed gas can be set, for example, by preliminarily generating the mixed gas containing the hydrogen gas and the inert gas at predetermined proportions or by adjusting the flow rate (partial pressure) of the hydrogen gas and the flow rate (partial pressure) of the inert gas.

For delivering the $Ga_2O$ gas to the outside of the second container through the reduced product gas delivery pipe, first carrier gas may be introduced. As the first carrier gas, for example, the examples described for the inert gas can be used. The flow rate (partial pressure) of the first carrier gas can be the same as that of the inert gas. In the case of introducing the inert gas, the inert gas can be used as the first carrier gas.

Preferably, the $Ga_2O$ gas generation is performed in a condition under pressure. The pressure in the condition under pressure is not particularly limited, and is preferably in the range from $1.01 \times 10^5$ to $1050 \times 10^7$ Pa, more preferably in the range from $1.05 \times 10^5$ to $5.00 \times 10^6$ Pa, and still more preferably in the range from $1010 \times 10^5$ to $9.90 \times 10^5$ Pa. The method of applying pressure can be, for example, a method of applying pressure by the hydrogen gas, the first carrier gas, or the like.

When reduced product gas of at least two kinds of Group III oxides is generated as described above, a ternary or higher nitride crystal is generated on a substrate, for example. Examples of the ternary or higher nitride crystal include a crystal represented by $Ga_xIn_{1-x}N$ (0<x<1).

The supply amount of the $Ga_2O$ gas is, for example, in the range from $5 \times 10^{-5}$ to $1 \times 10^{-1}$ mol/h, preferably in the range from $1 \times 10^{-4}$ to $1 \times 10^{-2}$ mol/h, and more preferably in the range from $2 \times 10^{-4}$ to $5 \times 10^{-4}$ mol/h. The supply amount of the $Ga_2O$ gas can be adjusted, for example, by adjusting the flow rate (partial pressure) of the first carrier gas in generation of the $Ga_2O$ gas.

The flow rate (partial pressure) of the ammonia gas can be set as appropriate according to the conditions such as the temperature of the substrate and the like. The partial pressure of the ammonia gas is, for example, in the range from 1.0 to 70 kPa, preferably in the range from 3.0 to 50 kPa, and more preferably in the range from 5.0 to 35 kPa.

For transferring the introduced ammonia gas to a crystal generation region, second carrier gas may be introduced. For example, the second carrier gas may be introduced from a carrier gas introduction pipe (not shown) provided separately from the nitrogen-containing gas introduction pipe or introduced from the nitrogen-containing gas introduction pipe after being mixed with the ammonia gas. As the second carrier gas, for example, the examples described for the first carrier gas can be used.

In the case of introducing the second carrier gas from the carrier gas introduction pipe, the flow rate (partial pressure) of the second carrier gas can be set as appropriate according to the flow rate (partial pressure) of the nitrogen-containing gas and the like. The partial pressure of the second carrier gas is, for example, in the range from 5.0 to 85 kPa, preferably in the range from 15 to 80 kPa, and more preferably in the range from 25 to 70 kPa.

The mixing ratio A:B (volume ratio) between the ammonia gas (A) and the second carrier gas (B) is not particularly limited, and is preferably in the range from 3 to 80:97 to 20, more preferably in the range from 8 to 60:92 to 40, and still more preferably in the range from 10 to 40:90 to 60. The mixing ratio A:B (volume ratio) can be set, for example, by preliminarily mixing the ammonia gas and the second carrier gas at a predetermined mixing ratio or adjusting the flow rate (partial pressure) of the ammonia gas and the flow rate (partial pressure) of the second carrier gas.

Preferably, the GaN crystal generation is performed in a condition under pressure. The pressure in the condition under pressure is as described above. The method of applying pressure can be, for example, a method of applying pressure by the ammonia gas, the second carrier gas, or the like.

The GaN crystal generation may be performed in a dopant-containing gas atmosphere. This allows a dopant-containing GaN crystal to be generated. Examples of the dopant include Si, S, Se, Te, Ge, Fe, Mg, and Zn. One type of the dopants may be used alone or two or more of them may be used in combination. Examples of the dopant-containing gas include monosilane ($SiH_4$), disilane ($Si_2H_6$), triethylsilane ($SiH(C_2H_5)_3$), tetraethylsilane $Si(C_2H_5)_4$), $H_2S$, $H_2Se$, $H_2Te$, $GeH_4$, $Ge_2O$, SiO, MgO, and ZnO, and one of them may be used alone or two or more of them may be used in combination.

For example, the dopant-containing gas may be introduced from a dopant-containing gas introduction pipe (not shown) provided separately from the nitrogen-containing gas introduction pipe or introduced from the nitrogen-containing gas introduction pipe after being mixed with the ammonia gas. In the case of introducing the second carrier gas, the dopant-containing gas may be introduced after being mixed with the second carrier gas.

The concentration of the dopant in the dopant-containing gas is not particularly limited, and is, for example, in the range from 0.001 to 100000 ppm, preferably in the range from 0.01 to 1000 ppm, and more preferably in the range from 0.1 to 10 ppm.

There is no particular limitation on the generation rate of the GaN crystal. The rate is, for example, 100 µm/h or more, preferably 500 µm/h or more, and more preferably 1000 µm/h or more.

In the case where any Group III oxide other than $Ga_2O_3$ is used in the production method of the present invention, a Group III nitride crystal also can be generated in the same manner as in the case where $Ga_2O_3$ is used.

The Group III oxide other than the $Ga_2O_3$ may be as follows: when the Group III element is In, the Group III oxide is, for example, $In_2O_3$; when the Group III element is Al, the Group III oxide is, for example, $Al_2O_3$; when the Group III element is B, the Group III oxide is, for example, $B_2O_3$; and when the Group III element is Tl, the Group III oxide is, for example, $Tl_2O_3$. One of the Group III oxides other than the $Ga_2O_3$ may be used alone, or two or more of them may be used in combination.

<1-2-4. Group III Nitride Crystal and the Like Produced by Second Group III Nitride Crystal Production Process (A) or (B)>

There is no particular limitation on the size of the Group III nitride crystal produced by the second Group III nitride crystal production process. Preferably, the major axis is 15 cm (about 6 inch) or more, more preferably, the major axis is 20 cm (about 8 inch) or more, and particularly preferably, the major axis is 25 cm (about 10 inch) or more. There is no particular limitation on the height of the second Group III nitride crystal. The height is, for example, 1 cm or more, preferably 5 cm or more, and more preferably 10 cm or more. The production method according to the present invention however is not limited to the production of such a large Group III nitride crystal. For example, the production method according to the present invention can be used to produce a Group III nitride crystal in a conventional size having higher quality. Furthermore, for example, as described above, the height (thickness) of the second Group III nitride crystal is not particularly limited, and may be less than 1600 µm, for example.

In the second Group III nitride crystal, the dislocation density is not particularly limited and is preferably $1.0 \times 10^7$ $cm^{-2}$ or less, more preferably $1.0 \times 10^{-4}$ $m^{-2}$ or less, yet more preferably $1.0 \times 10^{-3}$ $cm^{-2}$ or less, and still more preferably $1.0 \times 10^{-2}$ $cm^{-2}$ or less. Although the dislocation density is ideally 0, it is commonly impossible for the dislocation density to be 0. Thus, for example, the dislocation density is a value more than 0 and is particularly preferably a measurement limit or less of a measurement instrument. The dislocation density may be, for example, an average value of the entire crystal, and, more preferably, the maximum value in the crystal is the above-described value or less. In the Group III nitride crystal of the present invention, the half width of each of a symmetric reflection component (002) and an asymmetric reflection component (102) by XRC is, for example, 300 seconds or less, preferably 100 seconds or less, more preferably 30 seconds or less, and ideally 0.

As described above, the Group III nitride crystal production method of the present invention may further include a crystal re-growth step of further growing the produced Group III nitride crystal. Specifically, for example, in the crystal re-growth step, the produced Group III nitride crystal may be cut so that any plane (e.g., c-, m-, or a-plane or another nonpolar plane) is exposed, and the Group III nitride crystal may be further grown using the plane as a crystal growth plane. Thus, a Group III nitride crystal having a large area of any plane and a large thickness can be produced.

<2. Group III Nitride Crystal and Semiconductor Apparatus>

The Group III nitride crystal of the present invention is a Group III nitride crystal produced by the production method of the present invention or a Group III nitride crystal produced by further growing the Group III nitride crystal. The Group III nitride crystal of the present invention is, for example, a large Group III nitride seed crystal of high quality with few defects. Although the quality is not particularly limited, the dislocation density is, for example, preferably in the numerical range described in the section "1. Production method of the present invention". The size of the Group III nitride crystal also is not particularly limited and is, for example, as mentioned above. The use of the Group III nitride crystal of the present invention also is not particularly limited and can be used in a semiconductor apparatus because of having properties of a semiconductor, for example.

According to the present invention, as mentioned above, a Group III nitride (e.g., GaN) crystal with a diameter of 6 inches or more, which has not been produced by a conventional technique, can be provided. Accordingly, for example, by using Group III nitride as a substitute for Si in a semiconductor apparatus such as a power device generally required to have a large diameter of Si (silicon), a high frequency device, or the like, the performance can be further improved. Therefore, the present invention has a great impact on the semiconductor industry. The Group III nitride crystal of the present invention is not limited thereto and is applicable to any other semiconductor apparatuses such as solar battery and the like and any other applications besides the semiconductor apparatuses.

There is no particular limitation on the semiconductor apparatus of the present invention, and the semiconductor apparatus can be any article as long as it is operated by using a semiconductor. Examples of the article operated by a semiconductor include semiconductor devices and electrical equipment using the semiconductor device. Examples of the semiconductor device include diodes, high frequency devices such as transistors, power devices, and light emitting devices such as light-emitting diodes (LEDs) and laser diodes (LDs). Examples of the electrical equipment using the semiconductor device include a cellular phone base station equipped with the high frequency device; control equipment for solar cell and power supply control equipment of a vehicle driven by electricity each equipped with the power device; and a display, lighting equipment, and an optical disk device each equipped with the light emitting device. For example, a laser diode (LD) that emits blue light is applied to a high density optical disk, a display, and the like, and a light-emitting diode (LED) that emits blue light is applied to a display, a lighting, and the like. An ultraviolet LD is expected to be applied in biotechnology and the like and an ultraviolet LED is expected as an ultraviolet source which is an alternate for a mercury lamp. Also, an inverter that uses the Group III-V compound of the present invention as a power semiconductor for inverter can be used for power generation in a solar cell, for example. As described above, the Group III nitride crystal of the present invention is not limited thereto, and can be applied to other semiconductor apparatuses or various technical fields.

EXAMPLES

The examples of the present invention are described below. The present invention, however, is not limited by the following examples.

Example 1

In the present example, as described below, first, a GaN crystal is produced by the liquid phase epitaxy (first Group III nitride crystal production process), and then a GaN crystal is produced thereon by the vapor phase epitaxy (second Group III nitride crystal production process).

<Production of GaN Crystal by Liquid Phase Epitaxy>

A GaN crystal was produced using an LPE apparatus having the structure shown in FIG. 19. This process corresponds to the "first Group III nitride crystal production process" of the present invention.

As shown in (a) of FIG. 3, a substrate obtained by forming a GaN seed crystal layer 13 on a sapphire substrate 12 by MOCVD (vapor phase epitaxy) was provided. The thickness of the sapphire substrate 12 was 1 mm, and the thickness of the GaN seed crystal layer 13 was 5 μm. Subsequently, parts of the GaN seed crystal layer 13 and the upper parts of the sapphire substrate 12 were removed by etching. Thereby, as shown in (b) of FIG. 3, a GaN seed crystal substrate in which the seed crystals 13 are arranged on the plural projections 12*a* of the substrate 12 was obtained. The shape of the projection 12*a* (seed crystal 13) was a circular dot shape. The arrangement pattern of the projections 12*a* was, as shown in (a) of FIG. 6, repetition of a pattern in which projections 12*a* (seed crystals 13) are arranged on apexes of an equilateral triangle. The diameter of the projection 12*a* (seed crystal 13) was 0.25 mm and the distance between the centers of the projections 12*a* (seed crystals 13) that are adjacent to each other was 0.55 mm.

Next, crystal growth was performed in a nitrogen gas atmosphere using the GaN seed crystal substrate under the following conditions to produce a GaN crystal. The following "C [mol %] 0.5" represents addition of a 0.5% by mole carbon powder relative to the total amount of gallium (Ga), sodium (Na), and the carbon powder. As an operation, first, a crucible 366 was placed in a stainless container 364, and the stainless container 364 was placed in an electric furnace 365. Heating was started by a heater (not shown) to cause the electric furnace (heat-and-pressure-resistant container) 365 to be under high-temperature and high-pressure conditions at 870° C. and 32 atm (about 3.2 MPa) at the same time as introducing nitrogen gas from a raw material gas tank 361 into the stainless container 364, and a reaction was performed for 192 hours to perform the crystal growth. Thus, an intended GaN crystal was produced. Furthermore, the upper parts of the GaN crystal and the sapphire substrate were removed by grinding and polishing to cause only the lower parts remain, whereby a GaN crystal having a thickness of 1.7 mm was obtained. This GaN crystal was subjected to the subsequent GaN crystal production by vapor phase epitaxy (second Group III nitride crystal production process).

| | |
|---|---|
| Temperature [° C.] | 870 |
| Pressure [MPa] | 3.2 |
| Time [h] | 192 |
| Ga:Na | 15:85 |
| C [mol %] | 0.5 |
| Crucible | $Al_2O_3$ |

Figure 11:
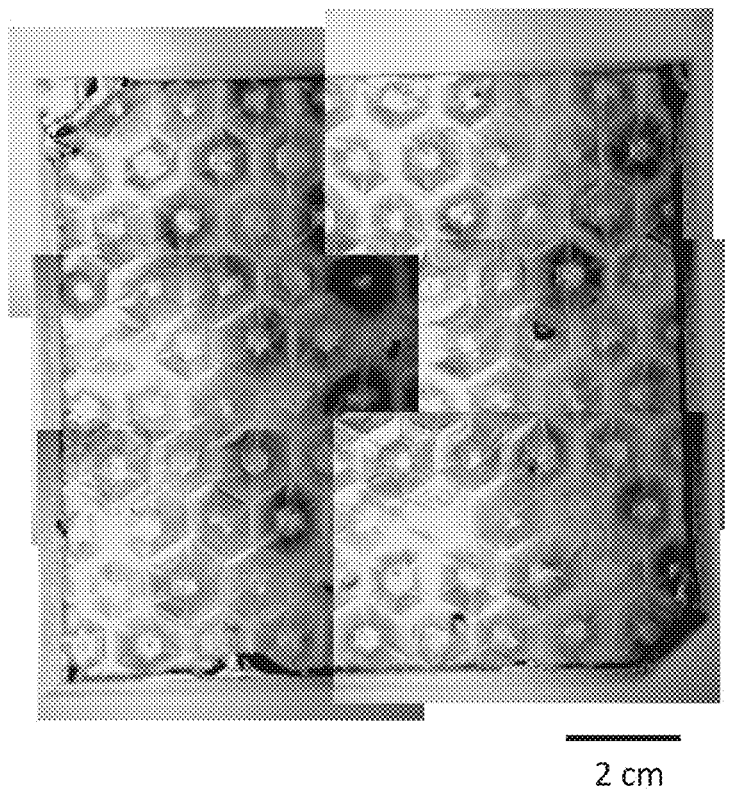
FIG. 11 shows micrographs of a GaN crystal (after double-side polishing) produced by liquid phase epitaxy in Examples.

FIG. 11 shows micrographs of the surface of a GaN crystal layer produced by the liquid phase epitaxy after double-side polishing.

<Production of GaN Crystal by Vapor Phase Epitaxy>

On the first GaN crystal (GaN crystal layer) produced by the liquid phase epitaxy, a GaN crystal was produced by vapor phase epitaxy (homoepi) using the apparatus shown in FIG. 23 (FIG. 24). This process corresponds to the "second Group III nitride crystal production process" of the present invention.

Figure 12:
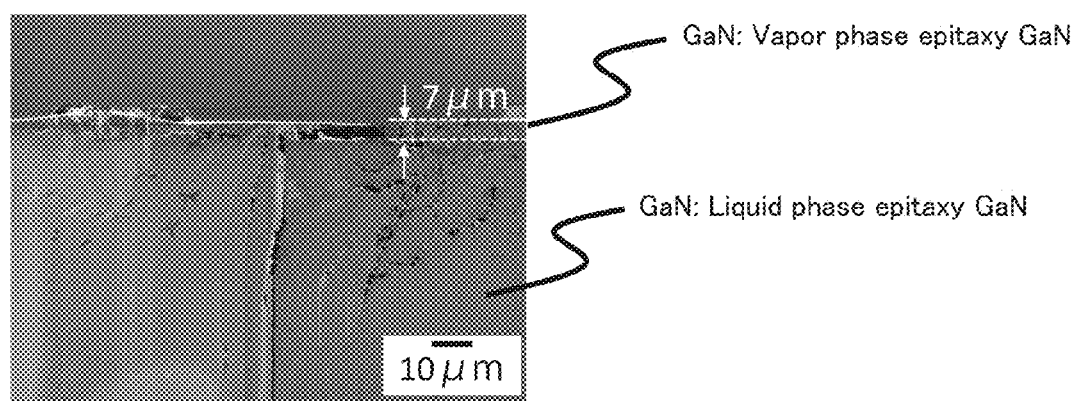
FIG. 12 is a cross sectional scanning electron microscope image of a GaN crystal produced in Examples.

The vapor phase epitaxy was performed as follows. In the present example, powdery gallium oxide (III) ($Ga_2O_3$) was used as a Group III element-containing material 110 and hydrogen gas ($H_2$) was used as reduced product gas 201*a*. The partial pressure of the hydrogen gas ($H_2$) was 3.3 kPa. In this state, the hydrogen gas 201*a*(201*b*) was caused to react with gallium oxide (III) 110 to generate gallium oxide (I) ($Ga_2O$) gas 111*a* (111*b*). In the present example, the conversion efficiency from $H_2$ and $Ga_2O_3$ to $Ga_2O$ was estimated as 100%. That is, the partial pressure of the gallium oxide (I) ($Ga_2O$) gas 111*a* (111*b*) was estimated as 4.3 kPa. Furthermore, ammonia gas ($NH_3$) was used as nitrogen-containing gas 203*a* and 203*b*. The partial pressure of the ammonia gas was 10 kPa. Moreover, $N_2$ gas (100% $N_2$ gas, containing no other gas) as carrier gas was introduced from the oxidizing gas introduction pipe 105 and nitrogen-containing gas introduction pipes 107*a* and 107*b* and pressure was applied so that the total pressure became 100 kPa. The substrate temperature (crystal growth temperature) of the GaN crystal layer substrate (202 in FIG. 24) was 1100° C., and the crystal growth time (time when each gas was kept feeding) was 1 hr. This vapor phase epitaxy allows a GaN crystal having a thickness (homoepi thickness) of 10 μm to be produced on the GaN crystal layer of the GaN crystal layer substrate. FIG. 12 shows a cross sectional scanning electron microscope image of a GaN crystal after the vapor phase epitaxy (the "second Group III nitride crystal production process") has been performed.

Example 2

GaN crystals were produced by the same halide vapor phase epitaxy as disclosed in JP S52(1977)-23600 A (referred to as "HVPE method" in the present example), the same liquid phase epitaxy as in Example 1 (referred to as "Na flux method" in the present example), and the same vapor phase epitaxy as in Example 1 (referred to as "OVPE method" in the present example), respectively. The crystal lattice structure and the impurity concentration were measured for each of the thus-produced GaN crystals. The crystal lattice structure was measured using a SmartLab (trade name) manufactured by Rigaku Corporation. The impurity concentration was measured using an IMS-7f (trade name) manufactured by AMETEK Co., Ltd. The results of the measurements are shown in Table 1 below. As can be seen from Table 1, it was found that the lattice constant (in the a-axis direction) of the crystal produced by the Na flux method (hereinafter also referred to as "Na flux crystal") changed in an oxygen concentration dependent manner, and the lattice constant increased in proportion to the oxygen concentration. Also, it was found that the crystals produced by the OVPE method and the HVPE method each had a larger lattice constant than the Na flux crystal with an oxygen concentration of $1\times10^{17}$ $cm^{-3}$ and a smaller lattice constant than the Na flux crystal with an oxygen concentration of $1\times10^{20}$ $cm^{-3}$. It was further found that, in the Na flux crystal, the oxygen concentration also is correlated with the crystal growth orientation and that the oxygen concentration was low in the case of the crystal growth in the c-axis direction whereas the oxygen concentration was high in the case of the crystal growth in the [10-11] direction. Furthermore, on the respective Na flux crystals, second Group III nitride crystals were grown by the OVPE method. As a result, when the Na flux crystals with oxygen concentrations of $1\times10^{17}$ cm$^{-3}$ and $1\times10^{20}$ cm$^{-3}$ were used, large warping and cracks were generated after growing the crystals by the OVPE method. In contrast, when the Na flux crystal with an oxygen concentration of $1\times10^{19}$ cm$^{-3}$ was used, generation of warping or cracks was not observed.

TABLE 1

| | Crystal production method | | | | |
|---|---|---|---|---|---|
| | Na flux method | | | HVPE method | OVPE method |
| | Growth method | | | | |
| | growth on planar seed crystals | growth through binding from a plurality of seed crystals | | — | — |
| | | Growth orientation | | | |
| | in the c-axis direction | dominantly in the c-axis direction | dominantly in the [10-11] direction | — | — |
| Coloring | not observed | not observed | observed | not observed | not observed |
| Oxygen concentration [cm$^{-3}$] | 1E+17 | 1E+19 | 1E+20 | 1E+17 | 5E+18 |
| Lattice constant [nm] | 0.31846 | 0.31883 | 0.31935 | 0.31885 | 0.31884 |

Example 3

GaN crystals were produced in the same manner as in Example 1, except that a "first Group III nitride crystal heating step" of heat-treating the first GaN crystal (GaN crystal layer) produced by the liquid phase epitaxy was performed prior to the second Group III nitride crystal production process. The first Group III nitride crystal heating step was performed by, after the removal of the sapphire substrate, heating the first GaN crystal (GaN crystal layer) produced by the liquid phase epitaxy in a nitrogen atmosphere and under ordinary pressure (equivalent to atmospheric pressure) at 1100° C. for 0.25 hr (15 minutes). The first Group III nitride crystal heating step caused, though very rarely, residues (including sodium) in the first GaN crystals (GaN crystal layers) to explode to perforate the first GaN crystals. The thus-perforated first GaN crystals (GaN crystal layers) were removed, and only the first GaN crystals (GaN crystal layers) free from perforation in the first Group III nitride crystal heating step were used for subsequent GaN crystal production by vapor phase epitaxy (second Group III nitride crystal production process). As a result, GaN crystals produced in the second Group III nitride crystal production process were totally free from defectiveness. Thus, GaN crystals of high quality could be obtained.

INDUSTRIAL APPLICABILITY

As described above, according to the present invention, a large Group III nitride crystal of high quality with few defects such as a location, warping, and the like can be produced by vapor phase epitaxy. The Group III nitride crystal of the present invention that can be produced by the production method according to the present invention is large in size, has few defects (e.g., a distortion, a dislocation, warping, and the like), and achieves high quality. Furthermore, the present invention provides a semiconductor apparatus that uses the Group III nitride crystal of the present invention, which is large in size, has few defects (e.g., a distortion, a dislocation, warping, and the like), and achieves high quality. The present invention also provides a Group III nitride crystal production apparatus that can be used in the production method according to the present invention. For example, by using a nitride crystal produced by the present invention as a substitute for Si in a semiconductor apparatus such as a power device generally required to have a large diameter of Si (silicon), a high frequency device, or the like, the performance can be further improved. Therefore, the present invention has a great impact on the semiconductor industry. Moreover, the present invention is not limited thereto and is applicable to other semiconductor apparatuses and other applications besides the semiconductor apparatuses.

EXPLANATION OF REFERENCE NUMERALS 12 substrate
12a projection
13 Group III nitride crystal layer
13b alkali metal-containing inclusion
14, 14a, 14b cut plane
50 substrate
51 Group III nitride crystal layer
52 mask
52a through-hole
53 Group III nitride crystal
54, 54a, 54b cut plane
361 raw material gas tank
362 pressure adjuster
363 valve for leakage
364 stainless container
365 electric furnace
366 crucible
380 swing LPE apparatus
381 growth furnace
382 heater
383 thermocouple
384 crucible-fixing stage
385 crucible
386 melt
387 seed crystal
388 flow rate adjuster
389 pipe
3800 direction in which atmospheric gas is supplied
3801 rotation direction
3802 rotation axis
4001 Group III nitride crystal production apparatus
4002 Group III nitride crystal production unit based on liquid phase epitaxy
4002a first Group III nitride crystal heating unit 4003 Group III nitride crystal production unit based on vapor phase epitaxy
5001 Group III nitride crystal
5001a crystal growth plane of Group III nitride crystal
6001 sapphire substrate
6002 Group III nitride crystal layer
6003 growth region in which growth direction is tilted relative to c-axis
6004 growth region in which growth direction extends almost in c-axis direction
6005 growth region in second half of reaction step in which growth direction extends almost in c-axis direction
1002 sapphire substrate
1003 GaN crystal
100, 300 production apparatus for use in second Group III nitride crystal production process
101 first container
102, 301 second container
103 substrate support
104 Group III element metal placement part
105 oxidizing gas introduction pipe
106 Group III element metal oxidation product gas delivery pipe
107a, 107b nitrogen-containing gas introduction pipe
108 exhaust pipe
109a, 109b first heating unit
200a, 200b second heating unit
201a, 201b, 401a, 401b oxidizing gas or reducing gas
111a, 111b Group III element metal oxidation product gas
202, 400 substrate
203a, 203b, 203c nitrogen-containing gas
203d exhaust gas
204 Group III nitride crystal (GaN crystal)
302 Group III element metal introduction pipe
402, 110 Group III element metal
2001 Group III nitride crystal
2002 mask
2003 Group III nitride crystal
2004 crystal defect
181a seed crystal
181b Group III nitride crystal
181c semiconductor wafer

The invention claimed is:

1. A method for producing a Group III nitride crystal in a melt that comprises at least an alkali metal and a Group III element, comprising:
an adjustment step of adjusting the content of an impurity element other than the alkali metal and the Group III element in the melt; and
a reaction step of causing the Group III element to react with nitrogen,
wherein a growth direction of the Group III nitride crystal in the reaction step is tilted relative to a c-axis in a first half of the reaction step and extends almost in the c-axis direction in a second half of the reaction step, and
in the alkali metal melt in the reaction step, a degree of supersaturation of the Group III nitride in the first half of the reaction step is lower than a degree of supersaturation of the Group III nitride in the second half of the reaction step.

2. The method according to claim 1, wherein the impurity element in the adjustment step is at least one selected from the group consisting of oxygen, silicon, germanium, and magnesium.

3. The method according to claim 1, wherein the impurity element in the adjustment step is oxygen.

4. The method according to claim 1, wherein the content of the impurity element is adjusted in the adjustment step in such a manner that the concentration of the impurity element in a Group III nitride crystal to be produced would be more than $1\times10^{17}$ cm$^{-3}$ and less than $1\times10^{20}$ cm$^{-3}$.

5. The method according to claim 1, wherein the content of the impurity element is adjusted in the adjustment step in such a manner that the lattice constant in an a-axis direction of a Group III nitride crystal to be produced would be 0.3185 nm to 0.3193 nm.

6. The method according to claim 1, further comprising:
a seed crystal selection step of selecting a plurality of parts of a preliminarily provided Group III nitride as seed crystals for generation and growth of Group III nitride crystals; and
a contact step of bringing the surfaces of the seed crystals into contact with an alkali metal melt; wherein
the reaction step is a Group III nitride crystal liquid phase growth step of causing a Group III element and the nitrogen to react with each other in a nitrogen-containing atmosphere in the alkali metal melt to generate and grow Group III nitride crystals, and
in the Group III nitride crystal liquid phase growth step, the Group III nitride crystals are bound together by growth of the Group III nitride crystals grown from the seed crystals to produce the Group III nitride crystal.

7. The method according to claim 1, wherein the reaction step is performed in a condition under pressure, and
a pressure applied in the first half of the reaction step is smaller than a pressure applied in the second half of the reaction step.

8. The method according to claim 1, wherein in the reaction step, a reaction temperature in the first half of the reaction step is higher than a reaction temperature in the second half of the reaction step.

9. The method according to claim 1, wherein a crystal growth plane in the reaction step extends in a direction almost parallel with a c-plane.

10. The method according to claim 1, wherein a crystal growth plane in the reaction step extends in a direction tilted relative to a c-plane.

11. The method according to claim 1, wherein in the reaction step, the Group III element is caused to react with the nitrogen on a substrate to grow the Group III nitride crystal.

12. The method according to claim 11, wherein the substrate is a sapphire substrate.

* * * * *